(12) United States Patent
Seo et al.

(10) Patent No.: US 10,505,135 B2
(45) Date of Patent: *Dec. 10, 2019

(54) LIGHT-EMITTING ELEMENT, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Shunpei Yamazaki, Tokyo (JP); Takahiro Ishisone, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/139,774

(22) Filed: Sep. 24, 2018

(65) Prior Publication Data

US 2019/0036056 A1    Jan. 31, 2019

Related U.S. Application Data

(63) Continuation of application No. 15/612,244, filed on Jun. 2, 2017, now Pat. No. 10,164,206, which is a (Continued)

(30) Foreign Application Priority Data

Apr. 20, 2012 (JP) ................. 2012-096808
Mar. 15, 2013 (JP) ................. 2013-052791

(51) Int. Cl.
- *H01L 51/50* (2006.01)
- *H01L 51/52* (2006.01)
- *H01L 51/00* (2006.01)

(52) U.S. Cl.
CPC ........ *H01L 51/504* (2013.01); *H01L 51/0085* (2013.01); *H01L 51/5004* (2013.01); (Continued)

(58) Field of Classification Search
CPC ................. H01L 51/5036; H01L 51/5262
See application file for complete search history.

(56) References Cited

U.S. PATENT DOCUMENTS

| 6,911,271 | B1 | 6/2005 | Lamansky et al. |
| 6,939,624 | B2 | 9/2005 | Lamansky et al. |

(Continued)

FOREIGN PATENT DOCUMENTS

| CN | 001454448 A | 11/2003 |
| CN | 001531380 A | 9/2004 |

(Continued)

OTHER PUBLICATIONS

Seo.S et al., "Exciplex-triplet energy transfer: A new method to achieve extremely efficient organic light-emitting diode with external quantum efficiency over 30% and drive voltage below 3V", Jpn. J. Appl. Phys. (Japanese Journal of Applied Physics), Mar. 17, 2014, vol. 53, No. 4, pp. 042102-1-042102-8.

(Continued)

*Primary Examiner* — Mark V Prenty
(74) *Attorney, Agent, or Firm* — Fish & Richardson P.C.

(57) ABSTRACT

An object is to provide a light-emitting element which uses a plurality of kinds of light-emitting dopants and has high emission efficiency. In one embodiment of the present invention, a light-emitting device, a light-emitting module, a light-emitting display device, an electronic device, and a lighting device each having reduced power consumption by using the above light-emitting element are provided. Attention is paid to Förster mechanism, which is one of mechanisms of intermolecular energy transfer. Efficient energy (Continued)

transfer by Förster mechanism is achieved by making an emission wavelength of a molecule which donates energy overlap with the longest-wavelength-side local maximum peak of a graph obtained by multiplying an absorption spectrum of a molecule which receives energy by a wavelength raised to the fourth power.

26 Claims, 38 Drawing Sheets

Related U.S. Application Data continuation of application No. 15/042,564, filed on Feb. 12, 2016, now Pat. No. 9,680,120, which is a continuation of application No. 14/644,887, filed on Mar. 11, 2015, now Pat. No. 9,263,695, which is a continuation of application No. 13/863,597, filed on Apr. 16, 2013, now Pat. No. 8,981,393.

(52) U.S. Cl.
CPC ...... *H01L 51/5016* (2013.01); *H01L 51/5262* (2013.01); *H01L 51/006* (2013.01); *H01L 51/0051* (2013.01); *H01L 51/0058* (2013.01); *H01L 51/0061* (2013.01); *H01L 51/0072* (2013.01); *H01L 51/0074* (2013.01); *H01L 2251/308* (2013.01); *H01L 2251/5384* (2013.01)

(56) References Cited

U.S. PATENT DOCUMENTS

| | | |
|---|---|---|
| 7,009,338 B2 | 3/2006 | D'Andrade et al. |
| 7,175,922 B2 | 2/2007 | Jarikov et al. |
| 7,183,010 B2 | 2/2007 | Jarikov |
| 7,285,907 B2 | 10/2007 | D'Andrade et al. |
| 7,332,857 B2 | 2/2008 | Seo et al. |
| 7,381,479 B2 | 6/2008 | Lamansky et al. |
| 7,504,657 B2 | 3/2009 | Suzuri et al. |
| 7,553,560 B2 | 6/2009 | Lamansky et al. |
| 7,572,522 B2 | 8/2009 | Seo et al. |
| 7,597,967 B2 | 10/2009 | Kondakova et al. |
| 7,771,844 B2 | 8/2010 | Inoue et al. |
| 7,897,421 B2 | 3/2011 | Suzuri et al. |
| 7,943,925 B2 | 5/2011 | Yamazaki |
| 7,993,760 B2 | 8/2011 | Komori et al. |
| 8,034,465 B2 | 10/2011 | Liao et al. |
| 8,076,681 B2 | 12/2011 | Mori et al. |
| 8,274,214 B2 | 9/2012 | Ikeda et al. |
| 8,653,553 B2 | 2/2014 | Yamazaki et al. |
| 8,841,655 B2 | 9/2014 | Okamoto |
| 8,853,680 B2 | 10/2014 | Yamazaki et al. |
| 8,920,940 B2 | 12/2014 | Ohsawa et al. |
| 8,963,127 B2 | 2/2015 | Pieh et al. |
| 8,981,355 B2 | 3/2015 | Seo |
| 8,981,393 B2 | 3/2015 | Seo et al. |
| 8,993,126 B2 | 3/2015 | Nowatari et al. |
| 8,993,129 B2 | 3/2015 | Endo et al. |
| 8,994,263 B2 | 3/2015 | Shitagaki et al. |
| 9,054,317 B2 | 6/2015 | Monkman et al. |
| 9,099,617 B2 | 8/2015 | Yamazaki et al. |
| 9,159,942 B2 | 10/2015 | Seo et al. |
| 9,175,213 B2 | 11/2015 | Seo et al. |
| 9,263,695 B2 | 2/2016 | Seo et al. |
| 9,356,250 B2 | 5/2016 | Ohsawa et al. |
| 9,604,928 B2 | 3/2017 | Shitagaki et al. |
| 9,680,120 B2 | 6/2017 | Seo et al. |
| 9,786,860 B2 | 10/2017 | Yamazaki et al. |
| 10,164,206 B2* | 12/2018 | Seo ............... H01L 51/5262 |
| 2002/0197511 A1 | 12/2002 | D'Andrade et al. |
| 2003/0175553 A1 | 9/2003 | Thompson et al. |
| 2003/0205696 A1 | 11/2003 | Thoms et al. |
| 2004/0178720 A1 | 9/2004 | Lee et al. |
| 2005/0048310 A1 | 3/2005 | Cocchi et al. |
| 2005/0106415 A1 | 5/2005 | Jarikov et al. |
| 2005/0214576 A1 | 9/2005 | Lamansky et al. |
| 2005/0221116 A1 | 10/2005 | Cocchi et al. |
| 2006/0134464 A1 | 6/2006 | Nariyuki |
| 2006/0159955 A1 | 7/2006 | Inoue et al. |
| 2007/0090756 A1 | 4/2007 | Okada et al. |
| 2007/0200124 A1 | 8/2007 | Suzuri et al. |
| 2007/0247061 A1 | 10/2007 | Adamovich et al. |
| 2008/0160345 A1 | 7/2008 | Inoue et al. |
| 2008/0281098 A1 | 11/2008 | Lamansky et al. |
| 2008/0284318 A1 | 11/2008 | Deaton et al. |
| 2008/0303415 A1 | 12/2008 | Suzuri et al. |
| 2010/0052527 A1 | 3/2010 | Ikeda et al. |
| 2010/0244725 A1 | 9/2010 | Adamovich et al. |
| 2011/0001146 A1 | 1/2011 | Yamazaki et al. |
| 2011/0210316 A1 | 9/2011 | Kadoma et al. |
| 2011/0285276 A1 | 11/2011 | Kadoma et al. |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217486 A1 | 8/2012 | Takemura et al. |
| 2012/0217487 A1 | 8/2012 | Yamazaki et al. |
| 2012/0242219 A1 | 9/2012 | Seo et al. |
| 2012/0256535 A1 | 10/2012 | Seo et al. |
| 2013/0092913 A1 | 4/2013 | Nishimura et al. |
| 2013/0240933 A1 | 9/2013 | Yamazaki et al. |
| 2013/0277654 A1 | 10/2013 | Seo et al. |
| 2013/0320377 A1 | 12/2013 | Yamazaki et al. |
| 2014/0042469 A1 | 2/2014 | Seo et al. |
| 2015/0069352 A1 | 3/2015 | Kim et al. |

FOREIGN PATENT DOCUMENTS

| | | |
|---|---|---|
| CN | 101427397 A | 5/2009 |
| CN | 104170111 A | 11/2014 |
| CN | 106369416 A | 2/2017 |
| EP | 1202608 A | 5/2002 |
| EP | 1784056 A | 5/2007 |
| EP | 1786242 A | 5/2007 |
| EP | 2175503 A | 4/2010 |
| EP | 2178348 A | 4/2010 |
| EP | 2271183 A | 1/2011 |
| EP | 2493269 A | 8/2012 |
| EP | 2566302 A | 3/2013 |
| EP | 2582206 A | 4/2013 |
| JP | 2004-506305 | 2/2004 |
| JP | 2004-522276 | 7/2004 |
| JP | 2004-281386 A | 10/2004 |
| JP | 2006-352106 A | 12/2006 |
| JP | 2007-189002 A | 7/2007 |
| JP | 2007-250296 A | 9/2007 |
| JP | 2008-247810 A | 10/2008 |
| JP | 2008-288344 A | 11/2008 |
| JP | 2009-534846 | 9/2009 |
| JP | 2010-034484 A | 2/2010 |
| JP | 2010-114070 A | 5/2010 |
| JP | 2012-028318 A | 2/2012 |
| JP | 2012-044125 A | 3/2012 |
| KR | 10-0501702 | 7/2005 |
| KR | 2008-0111489 A | 12/2008 |
| KR | 2009-0090656 A | 8/2009 |
| WO | WO-2000/070655 | 11/2000 |
| WO | WO-2002/015645 | 2/2002 |
| WO | WO-2006/008977 | 1/2006 |
| WO | WO-2006/009024 | 1/2006 |
| WO | WO-2006/013738 | 2/2006 |
| WO | WO-2006/033857 | 3/2006 |
| WO | WO-2007/124172 | 11/2007 |
| WO | WO-2010/140549 | 12/2010 |
| WO | WO-2011/065136 | 6/2011 |
| WO | WO-2011/155508 | 12/2011 |

(56) References Cited

FOREIGN PATENT DOCUMENTS

| WO | WO-2011/162105 | 12/2011 |
|---|---|---|
| WO | WO-2013/137089 | 9/2013 |

OTHER PUBLICATIONS

Song.W et al., "Light emission mechanism of mixed host organic light-emitting diodes", Appl. Phys. Lett. (Applied Physics Letters), Mar. 1, 2015, vol. 106, No. 12, pp. 123306-1-123306-4.
'Tris[2-phenylpyridinato-C2,N]iridium(III), https://www.sigmaaldrich.com/catalog/product/aldrich/688096?lang=de&region=DE.
Organic Light-emitting Materials and Devices, 2007, pp. 330-334, Taylor & Francis Group.
Rho.H et al., "Synthesis and Photophysical Studies of Iridium Complexes Having Different Ligands", Jpn. J. Appl. Phys. (Japanese Journal of Applied Physics), Jan. 20, 2006, vol. 45, No. 1B, pp. 568-573.
Negres.R et al., "Origin of efficient light emission from a phosphorescent polymer/organometallic guest-host system", Phys. Rev. B (Physical Review. B), Sep. 29, 2003, vol. 68, No. 11, pp. 115209-1-115209-8.
Gong.X et al., "High-Efficiency Polymer-Based Electrophosphorescent Devices", Adv. Mater. (Advanced Materials), Apr. 18, 2002, vol. 14, No. 8, pp. 581-585.
Hamed.Z et al., "Fluorescence quenching in PVK:ZnSe nanocomposite structure", Synthetic Metals, Jun. 12, 2014, vol. 195, pp. 102-109.
Holzer.W et al., "Absorption and emission spectroscopic characterization of Ir(ppy)3", Chemical Physics, 2005, vol. 308, No. 1-2, pp. 93-102.
Tamayo.A et al., "Synthesis and Characterization of Facial and Meridional Tris-cyclometalated Iridium (III) Complexes", J. Am. Chem. Soc. (Journal of the American Chemical Society), Jun. 18, 2003, vol. 125, No. 24, pp. 7377-7387.
Okada.S et al., "Substituent effects of iridium complexes for highly efficient red OLEDs", Dalton Transactions, May 5, 2005, No. 9, pp. 1583-1590.
Notice of Opposition (Patent No. German Patent No. 112012000831) dated Jun. 4, 2018.
Notice of Opposition (Patent No. German Patent No. 112012000828) dated Jun. 8, 2018.
Notice of Opposition (Patent No. German Patent No. 112012001364) dated Jun. 27, 2018.
Petition for Cancellation of Patent (Patent No. Korean Patent No. 10-1793880-00-00) dated May 24, 2018.
Petition for Cancellation of Patent (Patent No. Korean Patent No. 10-1812673-00-00) dated Jul. 6, 2018.
Written Opposition to the Grant of Patent (Patent No. Japanese Patent No. 5981726) dated Feb. 28, 2017.
Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.
Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.
International Search Report (Application No. PCT/JP2013/061339) dated Jun. 18, 2013.
Written Opinion (Application No. PCT/JP2013/061339) dated Jun. 18, 2013.
Chinese Office Action (Application No. 201380020736.9) dated Feb. 29, 2016.
Gong.X et al., "Phosphorescence from iridium complexes doped into polymer blends", J. Appl. Phys. (Journal of Applied Physics), Feb. 1, 2004, vol. 95, No. 3, pp. 948-953.
Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 48, pp. 2790-2794.
German Office Action (Application No. 112013007587.3) dated Jan. 12, 2017.
Yersin.H et al., Highly Efficient OLEDs with Phosphorescent Materials, 2008, pp. 1-97,283-309.
Tokito.S et al., "Improvement in performance by doping", Organic EL Display, Aug. 20, 2004, pp. 67-99, Ohmsha.
Jeon.W et al., "Ideal host and guest system in phosphorescent OLEDs", Organic Electronics, 2009, vol. 10, pp. 240-246, Elsevier.
Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.
Rausch.A et al., "Matrix Effects on the Triplet State of the OLED Emitter Ir(4,6-dFppy)2(pic)(FIrpic):Investigations by High-Resolution Optical Spectroscopy", Inorg. Chem. (Inorganic Chemistry), 2009, vol. 48, No. 5, pp. 1928-1937.
Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.
Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.
Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1- 094501-17.
Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.
Lee.J et al., "Stabilizing the efficiency of phosphorescent organic light-emitting diodes", SPIE Newsroom, Apr. 21, 2008, pp. 1-3.
Tokito.S et al., "Confinement of Triplet Energy on Phosphorescent Molecules for Highly Efficient Organic Blue-Light-Emitting Devices", Appl. Phys. Lett. (Applied Physics Letters), Jul. 21, 2003, vol. 83, No. 3, pp. 569-571.
Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.
Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.
Suzuki.K et al., "Photophysical study of iridium complexes by absolute photoluminescence quantum yield measurements using an integrating sphere", Proceedings of SPIE, 2009, vol. 7415, pp. 741504-1-741504-8.
Chinese Office Action (Application No. 201611114533.8) dated Dec. 29, 2017.
Taiwanese Office Action (Application No. 106107981) dated May 15, 2018.

* cited by examiner

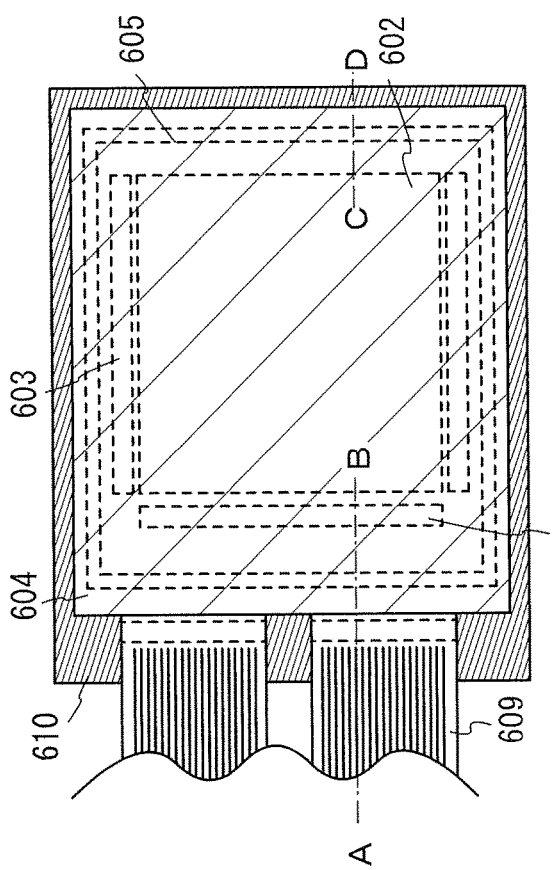
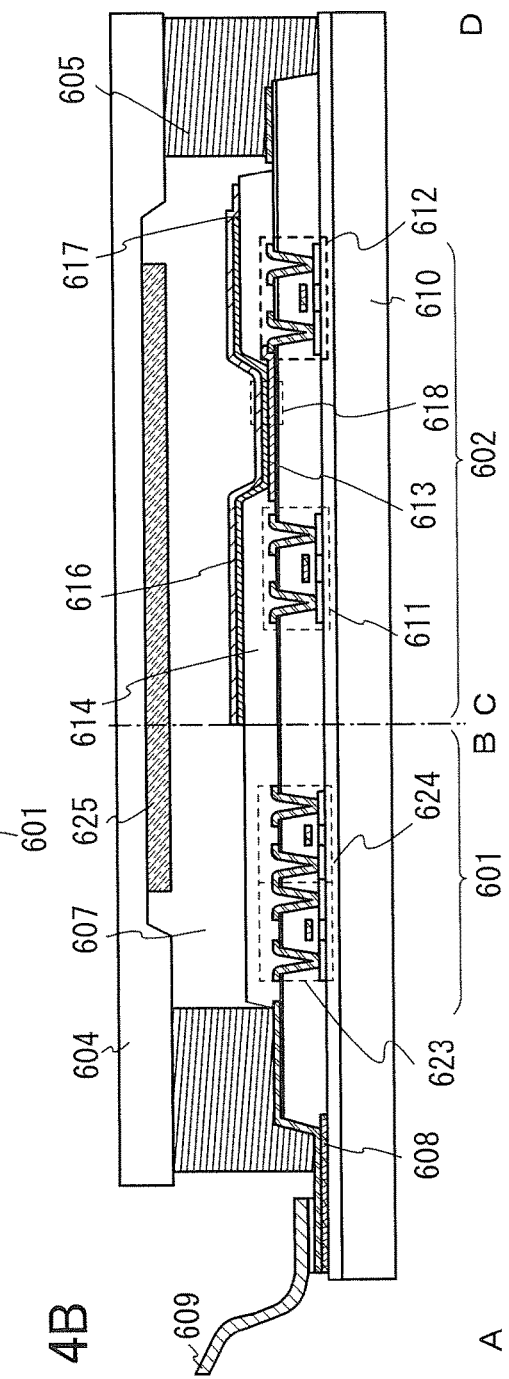
FIG. 4A
FIG. 4B

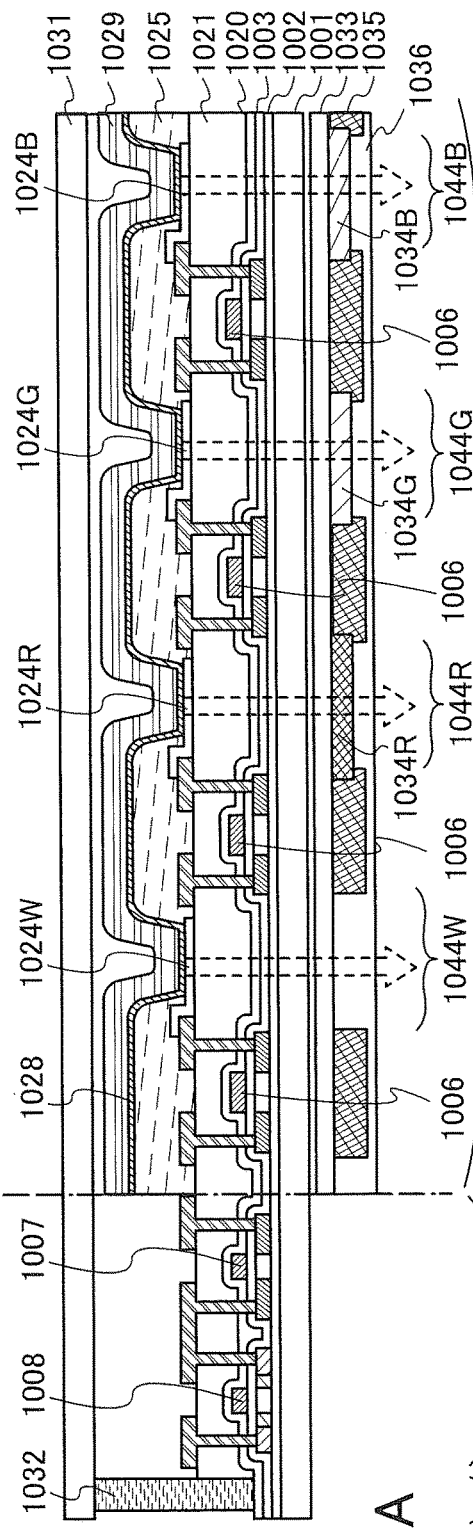
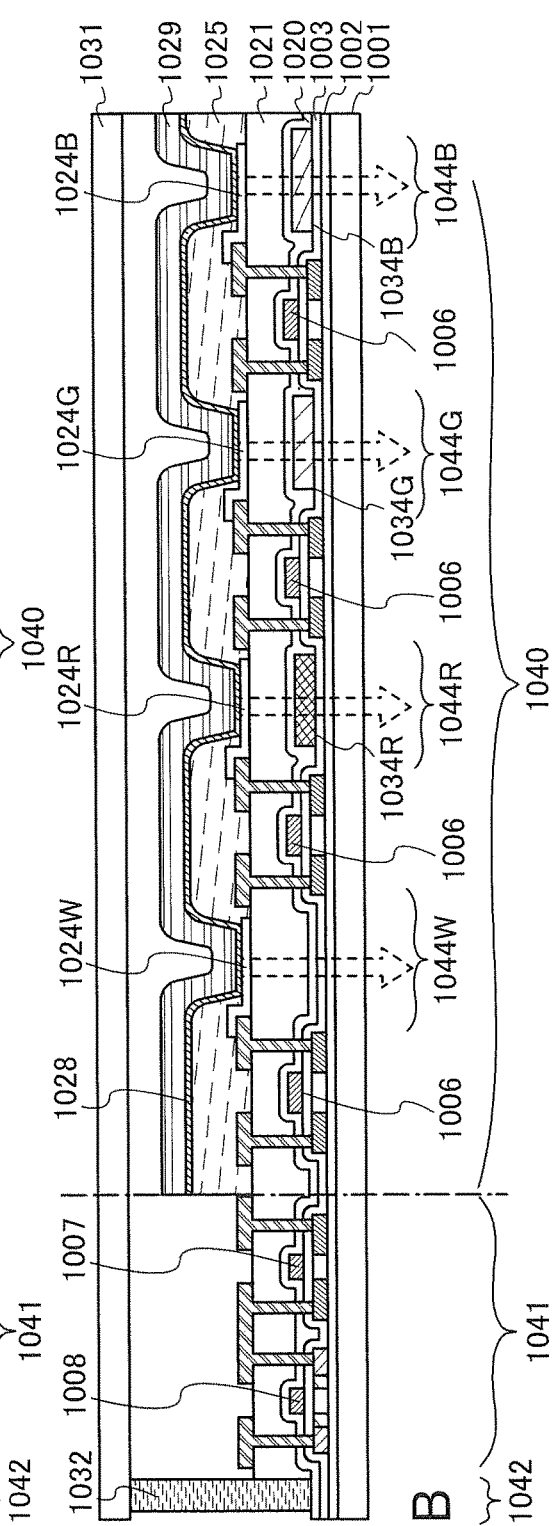
FIG. 6A
FIG. 6B

LIGHT-EMITTING ELEMENT, LIGHT-EMITTING DEVICE, DISPLAY DEVICE, ELECTRONIC DEVICE, AND LIGHTING DEVICE

This application is a continuation of U.S. application Ser. No. 15/612,244, filed on Jun. 2, 2017 which is a continuation of U.S. application Ser. No. 15/042,564, filed on Feb. 12, 2016 (now U.S. Pat. No. 9,680,120 issued Jun. 13, 2017) which is a continuation of U.S. application Ser. No. 14/644,887, filed on Mar. 11, 2015 (now U.S. Pat. No. 9,263,695 issued Feb. 16, 2016) which is a continuation of U.S. application Ser. No. 13/863,597, filed on Apr. 16, 2013 (now U.S. Pat. No. 8,981,393 issued Mar. 17, 2015), which are all incorporated herein by reference.

TECHNICAL FIELD

The present invention relates to a light-emitting element, a display device, a light-emitting device, an electronic device, and a lighting device each of which uses an organic compound as a light-emitting substance.

BACKGROUND ART

In recent years, research and development have been extensively conducted on light-emitting elements utilizing electroluminescence (EL). In the basic structure of such a light-emitting element, a layer containing a light-emitting substance (an EL layer) is interposed between a pair of electrodes. By voltage application to this element, light emission from the light-emitting substance can be obtained.

Such light-emitting elements are self-luminous elements and have advantages over liquid crystal displays in having high pixel visibility and eliminating the need for backlights, for example; thus, such light-emitting elements are thought to be suitable for flat panel display elements. Displays including such light-emitting elements are also highly advantageous in that they can be thin and lightweight. Furthermore, very high speed response is one of the features of such elements.

Since light-emitting layers of such light-emitting elements can be formed in a film form, they make it possible to provide planar light emission. Therefore, large-area elements can be easily formed. This is a feature difficult to obtain with point light sources typified by incandescent lamps and LEDs or linear light sources typified by fluorescent lamps. Thus, the light-emitting elements also have great potential as planar light sources applicable to lightings and the like.

In the case of an organic EL element in which an organic compound is used as a light-emitting substance and the EL layer is provided between a pair of electrodes, application of a voltage between the pair of electrodes causes injection of electrons from a cathode and holes from an anode into the EL layer having a light-emitting property and thus a current flows. By recombination of the injected electrons and holes, the organic compound having a light-emitting property is put in an excited state to provide light emission.

It is to be noted that the excited states formed by an organic compound include a singlet excited state and a triplet excited state, and luminescence from the singlet excited state (S*) is referred to as fluorescence, whereas luminescence from the triplet excited state (T*) is referred to as phosphorescence. In addition, the statistical generation ratio thereof in the light-emitting element is considered to be as follows: $S^*:T^*=1:3$.

In a compound that emits light from the singlet excited state (hereinafter, referred to as a fluorescent compound), at room temperature, generally light emission from the triplet excited state (phosphorescence) is not observed while only light emission from the singlet excited state (fluorescence) is observed. Therefore, the internal quantum efficiency (the ratio of generated photons to injected carriers) of a light-emitting element using a fluorescent compound is assumed to have a theoretical limit of 25% based on the ratio of $S^*$ to $T^*$ which is 1:3.

In contrast, in a compound that emits light from the triplet excited state (hereinafter, referred to as a phosphorescent compound), light emission from the triplet excited state (phosphorescence) is observed. Further, in a phosphorescent compound, since intersystem crossing (i.e., transfer from a singlet excited state to a triplet excited state) easily occurs, the internal quantum efficiency can be increased to 100% in theory. That is, higher emission efficiency can be achieved than using a fluorescent compound. For this reason, light-emitting elements using phosphorescent compounds are now under active development in order to obtain highly efficient light-emitting elements.

A white light-emitting element disclosed in Patent Document 1 includes a light-emitting region containing a plurality of kinds of light-emitting dopants which emit phosphorescence.

REFERENCE

Patent Document

[Patent Document 1] Japanese Translation of PCT International Application No. 2004-522276

DISCLOSURE OF INVENTION

Although an internal quantum efficiency of 100% in a phosphorescent compound is theoretically possible, such high efficiency can be hardly achieved without optimization of an element structure or a combination with another material. Especially in a light-emitting element which includes a plurality of kinds of phosphorescent compounds having different bands (different emission colors) as light-emitting dopants, it is difficult to obtain highly efficient light emission without not only considering energy transfer but also optimizing the efficiency of the energy transfer. In fact, in Patent Document 1, even when all the light-emitting dopants of a light-emitting element are phosphorescent compounds, the external quantum efficiency is approximately 3% to 4%. It is thus presumed that even when light extraction efficiency is taken into account, the internal quantum efficiency is 20% or lower, which is low for a phosphorescent light-emitting element.

In a multicolor light-emitting element using dopants exhibiting different emission colors, beside improvement of emission efficiency, it is also necessary to attain a good balance between light emissions by the dopants which exhibit different emission colors. It is not easy to keep a balance between light emissions by the dopants and to achieve high emission efficiency at the same time.

In view of the above, an object of one embodiment of the present invention is to provide a light-emitting element which uses a plurality of kinds of light-emitting dopants and has high emission efficiency. Another object of one embodiment of the present invention is to provide a light-emitting device, a display device, an electronic device, and a lighting device each having reduced power consumption by using the above light-emitting element.

It is only necessary that at least one of the above objects be achieved in the present invention.

In one embodiment of the present invention, focus is placed on Förster mechanism, which is one of mechanisms of intermolecular energy transfer, and efficient energy transfer by Förster mechanism is achieved by employing a combination of molecules which makes it possible to obtain an overlap between an emission spectrum band of the molecule which donates energy and the longest-wavelength-side peak of a characteristic curve obtained by multiplying an absorption spectrum of the molecule which receives energy by a wavelength raised to the fourth power. Here, one of the characteristics of the above energy transfer is that the energy transfer is not general energy transfer from a host to a dopant but energy transfer from a dopant to a dopant. The light-emitting element of one embodiment of the present invention can be obtained by employing such a combination of dopants between which energy can be transferred so efficiently and designing an element structure such that dopant molecules are appropriately isolated.

That is, one embodiment of the present invention is a light-emitting element including, between a pair of electrodes, a first light-emitting layer in which a first phosphorescent compound is dispersed in a first host material; and a second light-emitting layer in which a second phosphorescent compound emitting light with a wavelength longer than that of light emitted from the first phosphorescent compound is dispersed in a second host material. A wavelength of the longest-wavelength-side peak of a function $\varepsilon(\lambda)\lambda^4$ of the second phosphorescent compound overlaps with a phosphorescence spectrum $F(\lambda)$ of the first phosphorescent compound. Note that $\varepsilon(\lambda)$ denotes a molar absorption coefficient of each of the phosphorescent compounds and is a function of a wavelength $\lambda$.

Another embodiment of the present invention is a light-emitting element including, between a pair of electrodes, a first light-emitting layer in which a first phosphorescent compound is dispersed in a first host material; and a second light-emitting layer in which a second phosphorescent compound emitting light with a wavelength longer than that of light emitted from the first phosphorescent compound is dispersed in a second host material. A band having the peak of a phosphorescence spectrum of the first phosphorescent compound overlaps with a band having the longest-wavelength-side peak of a function $\varepsilon(\lambda)\lambda^4$ of the second phosphorescent compound. Note that $\varepsilon(\lambda)$ denotes a molar absorption coefficient of each of the phosphorescent compounds and is a function of a wavelength $\lambda$.

A further embodiment of the present invention is a light-emitting element having the above structure in which the first light-emitting layer further contains a first organic compound, the first host material and the first organic compound form an exciplex, and light emitted from the first phosphorescent compound has a longer wavelength than light emitted from the exciplex.

A still further embodiment of the present invention is a light-emitting element having the above structure in which an emission spectrum of the exciplex overlaps with a wavelength of the longest-wavelength-side peak of a function $\varepsilon(\lambda)\lambda^4$ of the first phosphorescent compound. Note that $\varepsilon(\lambda)$ denotes a molar absorption coefficient of each of the phosphorescent compounds and is a function of a wavelength $\lambda$.

A yet still further embodiment of the present invention is a light-emitting element having the above structure in which a band having the peak of the emission spectrum of the exciplex overlaps with a band having the longest-wavelength-side peak of the function $\varepsilon(\lambda)\lambda^4$ of the first phosphorescent compound. Note that $\varepsilon(\lambda)$ denotes a molar absorption coefficient of each of the phosphorescent compounds and is a function of a wavelength $\lambda$.

A yet still further embodiment of the present invention is a light-emitting element having the above structure in which the first phosphorescent compound has a phosphorescence peak in a range of 500 nm to 600 nm, and the second phosphorescent compound has a phosphorescence peak in a range of 600 nm to 700 nm.

A yet still further embodiment of the present invention is a light-emitting element having the above structure in which a recombination region of an electron and a hole is the first light-emitting layer.

A yet still further embodiment of the present invention is a light-emitting element having the above structure in which the first light-emitting layer is positioned closer to an anode than the second light-emitting layer, and an electron-transport property is higher than a hole-transport property at least in the second light-emitting layer.

A yet still further embodiment of the present invention is a light-emitting element having the above structure in which the first light-emitting layer is positioned closer to the anode than the second light-emitting layer, and both the first host material and the second host material have an electron-transport property. Note that a material having an electron-transport property is preferably a material in which an electron-transport property is higher than a hole-transport property.

A yet still further embodiment of the present invention is a light-emitting element having the above structure in which the first light-emitting layer is positioned closer to a cathode than the second light-emitting layer, and a hole-transport property is higher than an electron-transport property at least in the second light-emitting layer.

A yet still further embodiment of the present invention is a light-emitting element having the above structure in which the first light-emitting layer is positioned closer to the cathode than the second light-emitting layer, and both the first host material and the second host material have a hole-transport property. Note that a material having a hole-transport property is preferably a material in which a hole-transport property is higher than an electron-transport property.

A yet still further embodiment of the present invention is a light-emitting element having the above structure in which the first light-emitting layer and the second light-emitting layer are stacked in contact with each other.

A yet still further embodiment of the present invention is a light-emitting device, a light-emitting display device, an electronic device, and a lighting device each including a light-emitting element having the above structure.

Note that the light-emitting device in this specification includes, in its category, an image display device using a light-emitting element. Further, the category of the light-emitting device in this specification includes a module in which a light-emitting element is provided with a connector such as an anisotropic conductive film or a TCP (tape carrier package); a module in which the top of the TCP is provided with a printed wiring board; and a module in which an IC (integrated circuit) is directly mounted on a light-emitting element by a COG (chip on glass) method. Furthermore, the category includes light-emitting devices that are used in lighting equipment or the like.

One embodiment of the present invention provides a light-emitting element having high emission efficiency. By using the light-emitting element, another embodiment of the present invention provides a light-emitting device, a light-emitting display device, an electronic device, and a lighting device each having reduced power consumption.

BRIEF DESCRIPTION OF DRAWINGS

FIGS. 4A and 4B are conceptual diagrams of an active matrix light-emitting device.
FIGS. 6A and 6B are conceptual diagrams of structures of an active matrix light-emitting device.
FIGS. 9A, 9B1, 9B2, 9C, and 9D each illustrate an electronic device.

BEST MODE FOR CARRYING OUT THE INVENTION

Figure 1A:
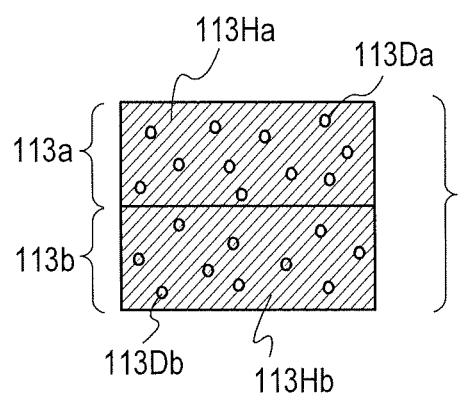
FIGS. 1A to 1C are conceptual diagrams of light-emitting elements.

Hereinafter, embodiments of the present invention will be described in detail with reference to the drawings. Note that the present invention is not limited to the description given below, and it will be easily understood by those skilled in the art that various changes and modifications can be made without departing from the spirit and scope of the present invention. Therefore, the present invention should not be interpreted as being limited to the description of the embodiments given below.

Embodiment 1

First, an operation principle of a light-emitting element of one embodiment of the present invention will be described. The point of the present invention is that a first phosphorescent compound and a second phosphorescent compound emitting light with a wavelength longer than that of light emitted from the first phosphorescent compound are used and both of the first and second phosphorescent compounds are made to emit light efficiently, whereby a multicolor light-emitting element with high efficiency is obtained.

As a general method for obtaining a multicolor light-emitting element including a phosphorescent compound, a method can be given in which a plurality of kinds of phosphorescent compounds having different emission colors are dispersed in some host material in an appropriate ratio. However, in such a method, the phosphorescent compound which emits light with the longest wavelength readily emits light, so that it is extremely difficult to design and control a structure (especially the concentrations of the phosphorescent compounds in the host material) for obtaining polychromatic light.

As another technique for obtaining a multicolor light-emitting element, what is called a tandem structure, in which light-emitting elements having different emission colors are stacked in series, can be given. For example, a blue light-emitting element, a green light-emitting element, and a red light-emitting element are stacked in series and made to emit light at the same time, whereby polychromatic light (in this case, white light) can be easily obtained. The element structure can be relatively easily designed and controlled because the blue light-emitting element, the green light-emitting element, and the red light-emitting element can be independently optimized. However, the stacking of three elements accompanies an increase in the number of layers and makes the fabrication complicated. In addition, when a problem occurs in electrical contact at connection portions between the elements (what is called intermediate layers), an increase in drive voltage, i.e., power loss might be caused.

In contrast, in the light-emitting element of one embodiment of the present invention, between the pair of electrodes are stacked the first light-emitting layer in which the first phosphorescent compound is dispersed in the first host material and the second light-emitting layer in which the second phosphorescent compound emitting light with a wavelength longer than that of light emitted from the first phosphorescent compound is dispersed in the second host material. Here, unlike the case of a tandem structure, the first and second light-emitting layers may be provided in contact with each other.

Figure 1B:
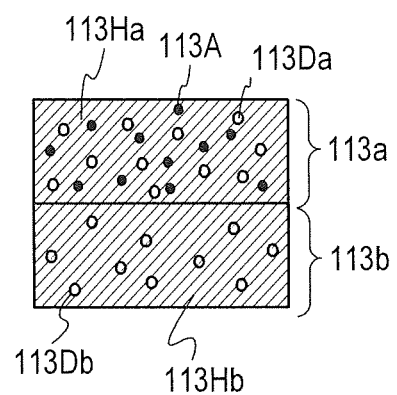
Figure 1C:
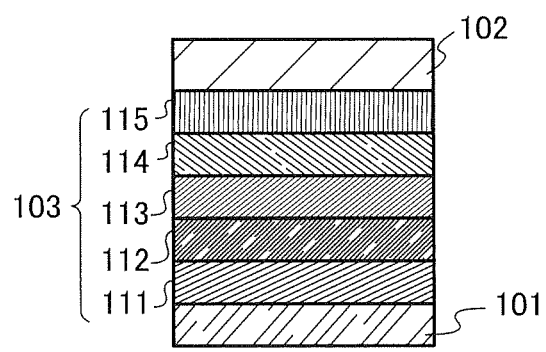

An element structure of the above-described light-emitting element of one embodiment of the present invention is schematically illustrated in FIGS. 1A to 1C. In FIG. 1C, a first electrode 101, a second electrode 102, and an EL layer 103 are illustrated. The EL layer 103 includes at least a light-emitting layer 113 and other layers may be provided as appropriate. In the structure illustrated in FIG. 1C, a hole-injection layer 111, a hole-transport layer 112, an electron-transport layer 114, and an electron-injection layer 115 are assumed to be provided. Note that it is assumed that the first electrode 101 functions as an anode and the second electrode 102 functions as a cathode.

FIGS. 1A and 1B are each an enlarged view of the light-emitting layer 113 in the light-emitting element. In each of FIGS. 1A and 1B, a first light-emitting layer 113a, a second light-emitting layer 113b, the light-emitting layer 113 which is a combination of the two layers, a first phosphorescent compound 113Da, a second phosphorescent compound 113Db, a first host material 113Ha, and a second host material 113Hb are illustrated. FIG. 1B is a schematic diagram illustrating the case where the first light-emitting layer 113a further contains a first organic compound 113A. In either case, the phosphorescent compounds (the first and second phosphorescent compounds) are dispersed in the host materials so that the phosphorescent compounds are isolated from each other by the host materials. Note that the first and second host materials may be the same or different from each other. The first light-emitting layer 113a may be on the anode side and the second light-emitting layer 113b may be on the cathode side, or the first light-emitting layer 113a may be on the cathode side and the second light-emitting layer 113b may be on the anode side.

In that case, between the phosphorescent compounds, energy transfer by electron exchange interaction (what is called Dexter mechanism) is suppressed. In other words, a phenomenon in which after the first phosphorescent compound 113Da is excited, the excitation energy is transferred to the second phosphorescent compound 113Db by Dexter mechanism can be prevented. Thus, a phenomenon in which the second phosphorescent compound 113Db emitting light with the longest wavelength mainly emits light can be suppressed. Note that the second phosphorescent compound 113Db mainly emits light in the case where an exciton is directly generated in the second light-emitting layer 113b; therefore, it is preferable that a recombination region of carriers be in the first light-emitting layer 113a (i.e., the first phosphorescent compound 113Da be mainly excited).

Note that if energy transfer from the first phosphorescent compound 113Da is completely suppressed, in turn, light emission from the second phosphorescent compound 113Db cannot be obtained. Thus, in one embodiment of the present invention, element design is performed such that excitation energy of the first phosphorescent compound 113Da is partly transferred to the second phosphorescent compound 113Db. Such energy transfer between isolated molecules becomes possible by utilizing dipole-dipole interaction (Förster mechanism).

Here, Förster mechanism is described. The molecule which donates excitation energy and the molecule which receives excitation energy are hereinafter referred to as an energy donor and an energy acceptor, respectively. That is, in one embodiment of the present invention, both the energy donor and the energy acceptor are phosphorescent compounds and are isolated from each other by the host materials.

In Förster mechanism, direct intermolecular contact is not necessary for energy transfer. Through a resonant phenomenon of dipolar oscillation between an energy donor and an energy acceptor, energy transfer occurs. The resonant phenomenon of dipolar oscillation causes the energy donor to donate energy to the energy acceptor; thus, the energy donor in an excited state relaxes to a ground state and the energy acceptor in a ground state is excited. The rate constant $k_F$ of energy transfer by Förster mechanism is expressed by a formula (1).

[Formula 1]

$$k_F = \frac{9000c^4 K^2 \phi \ln 10}{128\pi^5 n^4 N \tau R^6} \int \frac{F(v)\varepsilon(v)}{v^4} dv \qquad (1)$$

In the formula (1), $v$ denotes a frequency, $F(v)$ denotes a normalized emission spectrum of an energy donor (a fluorescence spectrum in energy transfer from a singlet excited state, and a phosphorescence spectrum in energy transfer from a triplet excited state), $\varepsilon(v)$ denotes a molar absorption coefficient of an energy acceptor, N denotes Avogadro's number, n denotes a refractive index of a medium, R denotes an intermolecular distance between the energy donor and the energy acceptor, $\tau$ denotes a measured lifetime of an excited state (fluorescence lifetime or phosphorescence lifetime), c denotes the speed of light, $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the energy donor and the energy acceptor. Note that $K^2=\frac{2}{3}$ in random orientation.

As the formula (1) suggests, the following can be given as necessary conditions for energy transfer by Förster mechanism (Förster energy transfer): 1. the energy donor and the energy acceptor are not too far apart from each other (which relates to the distance R); 2. the energy donor emits light (which relates to the luminescence quantum yield $\phi$); and 3. an emission spectrum of the energy donor overlaps with an absorption spectrum of the energy acceptor (which relates to the integral term).

Here, as already described with reference to FIGS. 1A to 1C, the phosphorescent compounds (the first and second phosphorescent compounds) are dispersed in the respective host materials and isolated from each other by the host materials; thus, the distance R is at least one molecule length or longer (i.e., 1 nm or more). Therefore, the excitation energy generated in the first phosphorescent compound is not entirely transferred to the second phosphorescent compound by Förster mechanism. Meanwhile, Förster energy transfer to the distance R can occur when R is less than or equal to approximately 10 nm to 20 nm. So that the distance R at least longer than or equal to one molecule length is secured between the first and second phosphorescent compounds, the mass of the phosphorescent compound dispersed in the host material is preferably set to less than or equal to a certain mass. Based on this, the concentration of the phosphorescent compound in the light-emitting layer is 10 wt % or less. When the concentration of the phosphorescent compound is too low, favorable characteristics are difficult to be achieved; thus, the concentration of the phosphorescent compound in this embodiment is preferably greater than or equal to 0.1 wt % and less than or equal to 10 wt %. Specifically, it is more preferable that the first phosphorescent compound be contained in the first light-emitting layer 113a at a concentration of greater than or equal to 0.1 wt % and less than or equal to 5 wt %.

Figure 2A:
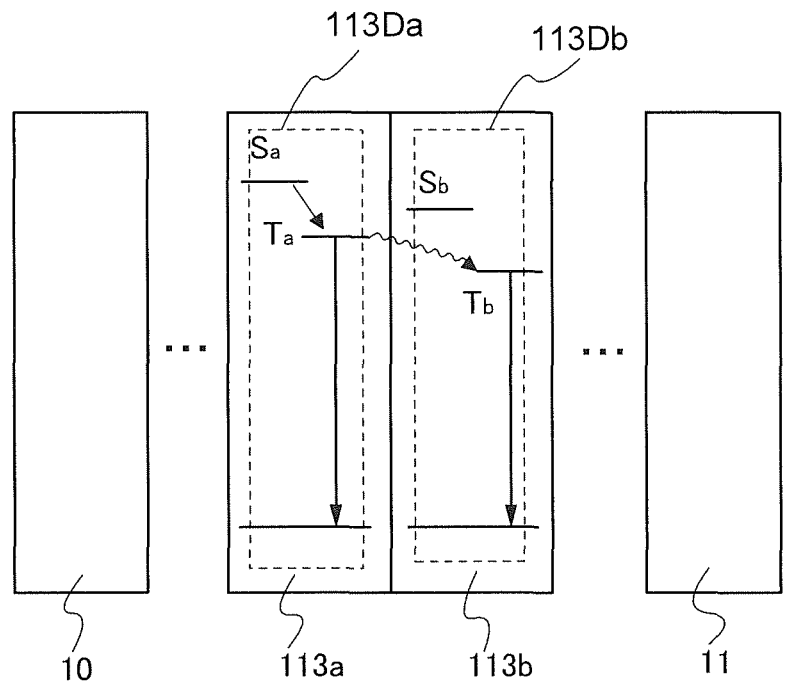
FIGS. 2A and 2B illustrate energy transfer in light-emitting layers.
Figure 2B:
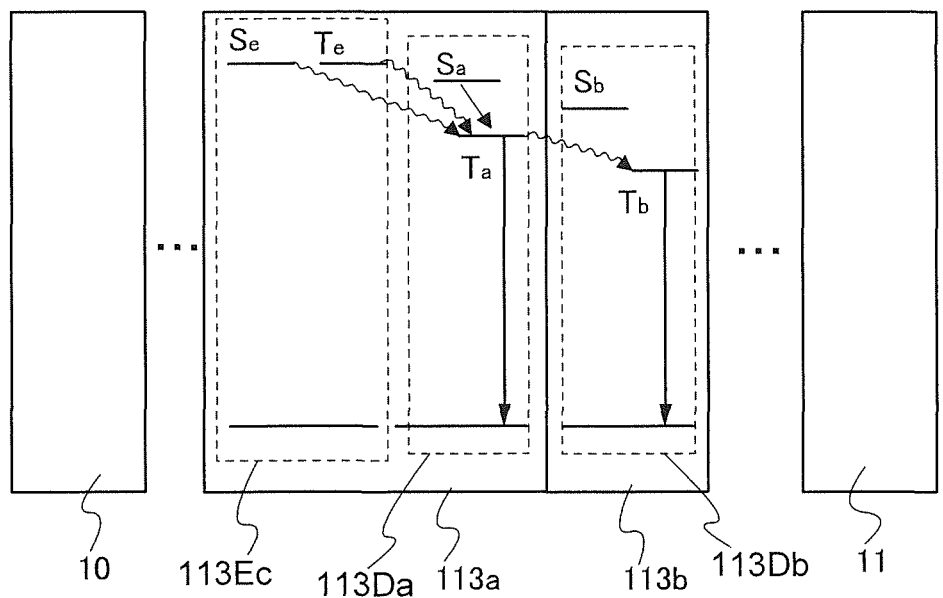

FIGS. 2A and 2B schematically illustrate Förster energy transfer between the phosphorescent compounds in the light-emitting element of one embodiment of the present invention, in which the first phosphorescent compound 113Da and the second phosphorescent compound 113Db emitting light with a wavelength longer than that of light emitted from the first phosphorescent compound are included. In each of FIGS. 2A and 2B, a structure in which the first light-emitting layer 113a and the second light-emitting layer 113b are stacked between an electrode 10 and an electrode 11 is illustrated. Note that one of the electrode 10 and the electrode 11 functions as an anode and the other functions as a cathode. As illustrated in FIG. 2A, first, a singlet excited state formed in the first phosphorescent compound 113Da ($S_a$) is converted into a triplet excited state ($T_a$) by intersystem crossing. In other words, an exciton in the first light-emitting layer 113a is basically brought into $T_a$.

Then, the energy of the exciton in the $T_a$ state, some of which is converted into light emission, can be partly transferred to the triplet excited state of the second phosphorescent compound 113Db ($T_b$) by Förster mechanism. This results from the fact that the first phosphorescent compound 113Da has a light-emitting property (has a high phosphorescence quantum yield $\phi$) and that direct absorption, which corresponds to electron transition from a singlet ground state to a triplet excited state, is observed in the second phosphorescent compound 113Db (an absorption spectrum of a triplet excited state exists). When these conditions are fulfilled, triplet-triplet Förster energy transfer from $T_a$ to $T_b$ is possible.

Note that a singlet excited state of the second phosphorescent compound 113Db ($S_b$) has higher energy than the triplet excited state of the first phosphorescent compound 113Da ($T_a$) in many cases and therefore does not contribute to the above energy transfer so much in many cases. For this reason, the description is omitted here. It is needless to say that when the singlet excited state of the second phosphorescent compound 113Db ($S_b$) has lower energy than the triplet excited state of the first phosphorescent compound 113Da ($T_a$), energy transfer may occur similarly. In that case, energy transferred to the singlet excited state of the second phosphorescent compound 113Db ($S_b$) is transferred to the triplet excited state of the second phosphorescent compound 113Db ($T_b$) by intersystem crossing to contribute to light emission.

Note that to make the above Förster energy transfer efficiently occur between the phosphorescent compounds serving as the dopants, not to the host materials, it is preferable that absorption spectra of the first and second host materials be not in the emission region of the first phosphorescent compound 113Da. In this manner, when energy is transferred directly between dopants without being transferred through the host material (specifically, the second host material), formation of an extra path of energy transfer is suppressed and high emission efficiency can be achieved, which is preferable.

Further, the first host material preferably has a triplet excitation energy higher than that of the first phosphorescent compound so as not to quench the first phosphorescent compound.

As described above, a basic concept of one embodiment of the present invention is an element structure in which the first phosphorescent compound emitting light with the shorter wavelength is mainly excited in a state where the first and second phosphorescent compounds are isolated from each other with the use of the host materials and the stacked-layer structure. Since energy is partly transferred by Förster mechanism to a certain distance (20 nm or less) in such an element structure, excitation energy of the first phosphorescent compound is partly transferred to the second phosphorescent compound. As a result, light emission from each of the first and second phosphorescent compounds can be obtained.

Here, what is more important in one embodiment of the present invention is that the materials and the element structure are determined in consideration of the above energy transfer.

To make Förster energy transfer occur, the energy donor needs to have a high luminescence quantum yield $\phi$. In terms of the luminescence quantum yield, there is no problem in one embodiment of the present invention since a phosphorescent compound (specifically, a light-emitting compound with a phosphorescence quantum yield of 0.1 or more) is used. An important point is that the integral term of the formula (1) is made large, i.e., an emission spectrum F(v) of the energy donor is made to properly overlap with the molar absorption coefficient ε(v) of the energy acceptor.

In general, it is thought that the emission spectrum F(v) of the energy donor simply needs to overlap with a wavelength range in which the molar absorption coefficient ε(v) of the energy acceptor is large (i.e., the product of F(v) and ε(v) simply needs to be large). However, this does not necessarily apply to Förster mechanism because the integral term in the formula (1) is inversely proportional to the frequency ν raised to the fourth power to have wavelength dependence.

For easier understanding, here, the formula (1) is transformed. Since ν=c/λ, where λ denotes a wavelength of light, the formula (1) can be transformed into a formula (2).

[Formula 2]

$$k_F = \frac{9000K^2\phi\ln10}{128\pi^5 n^4 N\tau R^6}\int F(\lambda)\varepsilon(\lambda)\lambda^4 d\lambda \quad (2)$$

In other words, it can be found that the longer the wavelength λ is, the larger the integral term is. In simpler terms, it is indicated that energy transfer occurs more easily on a longer wavelength side. That is, this is not so simple that $F(\lambda)$ needs to overlap with the wavelength range in which the molar absorption coefficient $\varepsilon(\lambda)$ is large. It is necessary that $F(\lambda)$ overlap with a range in which $\varepsilon(\lambda)\lambda^4$ is large.

Thus, in the light-emitting element of one embodiment of the present invention, in order to increase efficiency of energy transfer from the first phosphorescent compound 113Da, a phosphorescent compound allowing a band having the maximum value of an emission spectrum of the first phosphorescent compound 113Da to overlap with a band having the longest-wavelength-side peak of the function $\varepsilon(\lambda)\lambda^4$ of the second phosphorescent compound 113Db is used as the second phosphorescent compound 113Db.

Note that the wavelength of the longest-wavelength-side peak of the function $\varepsilon(\lambda)\lambda^4$ of the second phosphorescent compound preferably overlaps with a phosphorescence spectrum $F(\lambda)$ of the first phosphorescent compound. Further, it is more preferable that a wavelength range in which the band with the above maximum value of the emission spectrum of the first phosphorescent compound 113Da has half of the intensity of the above maximum value overlap with a wavelength range in which the band having the above peak of the function $\varepsilon(\lambda)\lambda^4$ of the second phosphorescent compound has half of the intensity of the above peak, in which case the overlap between the spectra can be larger.

In a light-emitting element having the above-described structure, high emission efficiency can be achieved and the phosphorescent compounds can provide light emissions in a good balance.

For better understanding of such structures of phosphorescent compounds, explanation is made below referring to specific examples. Here, as an example, a case is described where a compound (1) shown below (bis[2-(6-tert-butyl-4-pyrimidinyl-κN3)phenyl-κC](2,4-pentanedionato-κ²O,O') iridium(III) (abbreviation: Ir(tBuppm)₂(acac))) is used as the first phosphorescent compound 113Da and a compound (2) shown below (bis(2,3,5-triphenylpyrazinato)(dipivaloyl-methanato)iridium(III) (abbreviation: Ir(tppr)₂(dpm))) is used as the second phosphorescent compound 113Db which emits light with a wavelength longer than that of light emitted from the first phosphorescent compound 113Da.

[Chemical formula 1]

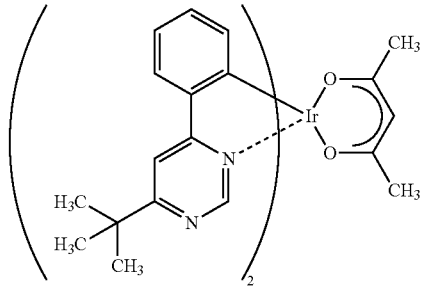

compound (1)

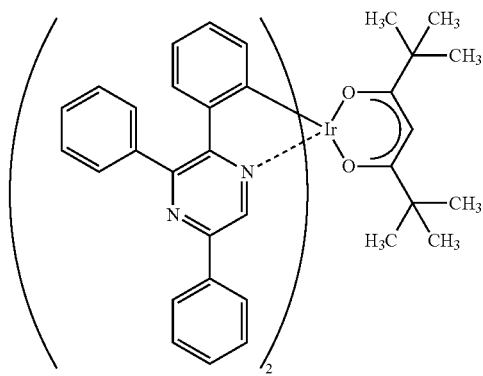

compound (2)

Figure 3A:
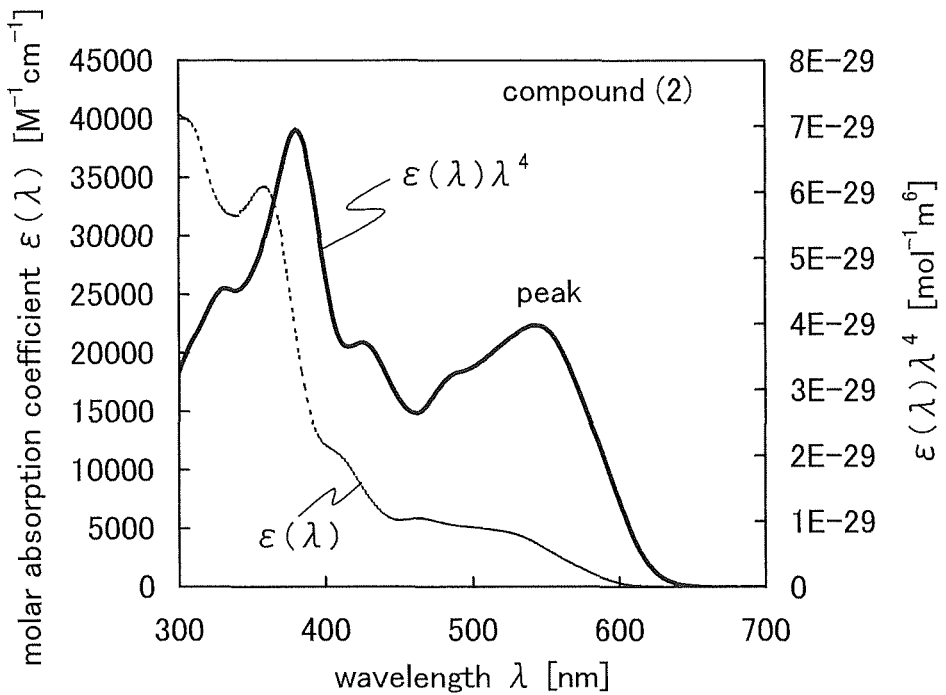
FIGS. 3A and 3B explain Förster energy transfer.

FIG. 3A shows a molar absorption coefficient $\varepsilon(\lambda)$ and $\varepsilon(\lambda)\lambda^4$ of the compound (2) that is the second phosphorescent compound. The molar absorption coefficient $\varepsilon(\lambda)$ gets smaller on a longer wavelength side, but $\varepsilon(\lambda)\lambda^4$ has the peak at around 550 nm (which corresponds to the triplet MLCT absorption band of the compound (2)). As can be seen from this example, affected by the term $\lambda^4$, $\varepsilon(\lambda)\lambda^4$ of the second phosphorescent compound has the peak in the absorption band (triplet MLCT absorption band) located on the longest wavelength side.

Figure 3B:
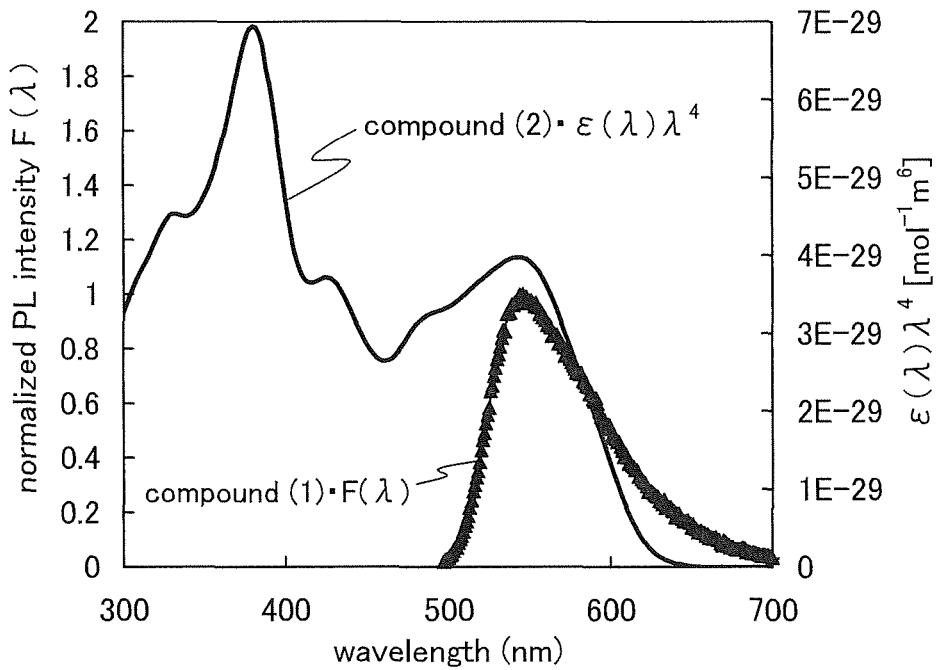

FIG. 3B shows a photoluminescence (PL) spectrum $F(\lambda)$ of the compound (1) and $\varepsilon(\lambda)\lambda^4$ of the compound (2). The compound (1) is the first phosphorescent compound and emits green light with an emission peak at around 545 nm. Around the longest-wavelength-side peak of $\varepsilon(\lambda)\lambda^4$ of the second phosphorescent compound, the PL spectrum $F(\lambda)$ of the first phosphorescent compound largely overlaps with $\varepsilon(\lambda)\lambda^4$, and energy transfer from the first phosphorescent compound to the second phosphorescent compound occurs by Förster mechanism. Note that in this case, since the peak corresponds to the triplet MLCT absorption band, the energy transfer is the triplet-triplet Förster energy transfer ($T_a$-$T_b$ energy transfer in FIGS. 2A and 2B). At this time, the difference between the emission peak wavelength of the PL spectrum $F(\lambda)$ of the first phosphorescent compound and the wavelength of the longest-wavelength-side peak of $\varepsilon(\lambda)\lambda^4$ of the second phosphorescent compound is preferably 0.2 eV or less, in which case energy transfer occurs efficiently. The emission peak wavelength of the PL spectrum $F(\lambda)$ of the compound (1) is 546 nm and the wavelength of the longest-wavelength-side peak of $\varepsilon(\lambda)\lambda^4$ of the compound (2) is 543 nm, with the difference of 3 nm, which corresponds to 0.01 eV. Thus, it turns out energy transfer between the compound (1) and the compound (2) occurs very efficiently.

Note that from the above, it is preferable that absorption spectrum of the second phosphorescent compound shows, on the longest wavelength side, direct absorption which corresponds to electron transition from a singlet ground state to a triplet excited state (e.g., triplet MLCT absorption). Such a structure leads to high efficiency of triplet-triplet energy transfer shown in FIGS. 2A and 2B.

To obtain the above-described recombination region, in the case where the first light-emitting layer 113a is positioned on the anode side, at least the second light-emitting layer 113b preferably has an electron-transport property, and both the first light-emitting layer 113a and the second light-emitting layer 113b may have an electron-transport property. In the case where the first light-emitting layer 113a is positioned on the cathode side, at least the second light-emitting layer 113b preferably has a hole-transport property, and both the first light-emitting layer 113a and the second light-emitting layer 113b may have a hole-transport property.

In addition, in the first light-emitting layer 113a, it is preferable that a band having a peak of the photoluminescence (PL) spectrum $F(\lambda)$ of the first host material 113Ha largely overlap with a band having the longest-wavelength-side peak of the function $\varepsilon(\lambda)\lambda^4$ of the first phosphorescent compound.

However, in general, it is difficult to obtain an overlap between a band having a peak of a photoluminescence (PL) spectrum $F(\lambda)$ of a host material and a band having the longest-wavelength-side peak of the function $\varepsilon(\lambda)\lambda^4$ of a guest material (the first phosphorescent compound 113Da). The reason for this is that since photoluminescence (PL) of the host material is generally fluorescence, which is light emission from an energy level higher than that of phosphorescence, there is high possibility that a triplet excitation energy level of the host material whose fluorescence spectrum is at a wavelength in close proximity to an absorption spectrum on the longest wavelength side of the guest material (a triplet excited state of a guest material) becomes lower than a triplet excitation energy level of the guest material. When the triplet excitation energy level of the host material becomes lower than the triplet excitation energy level of the guest material, the triplet excitation energy of the guest material is transferred to the host material, which causes a reduction in emission efficiency.

Figure 10:
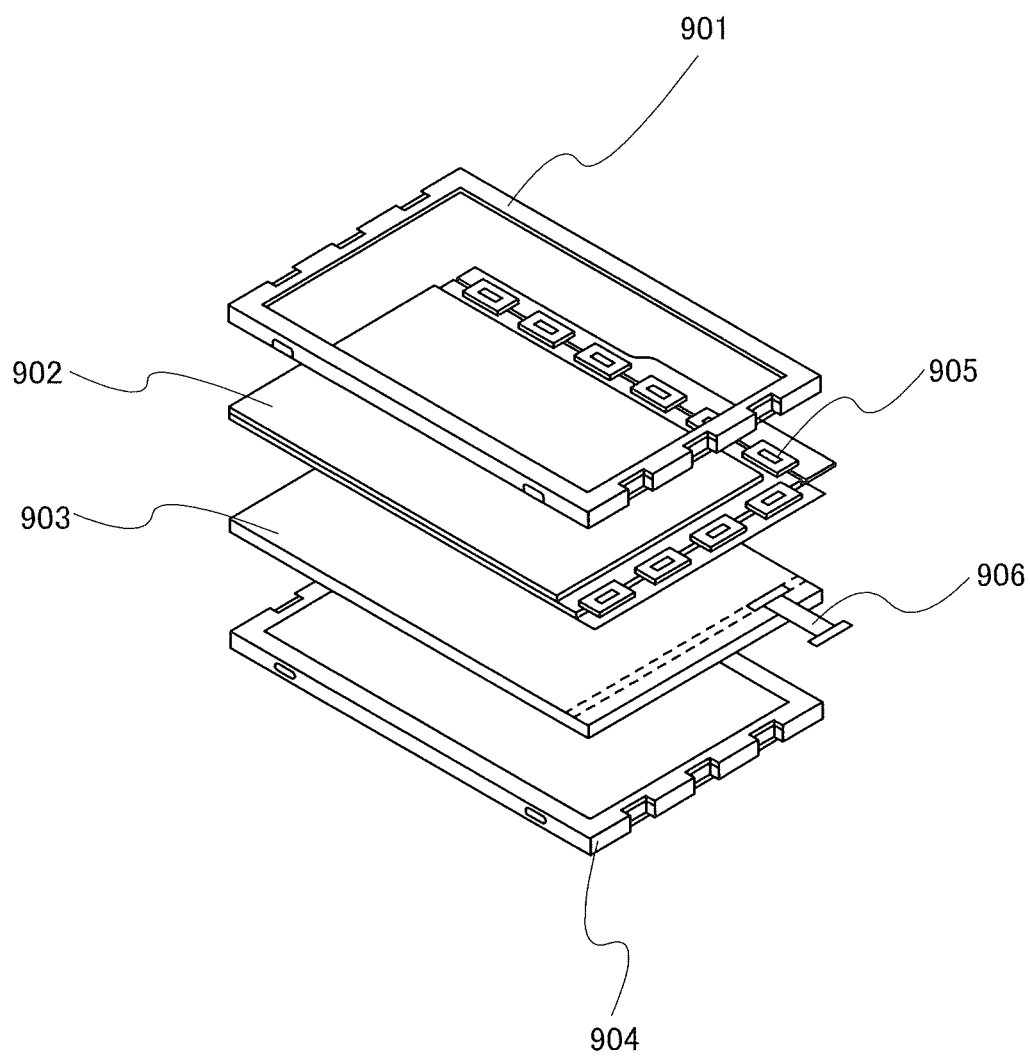
FIG. 10 illustrates an electronic device.
Figure 11:
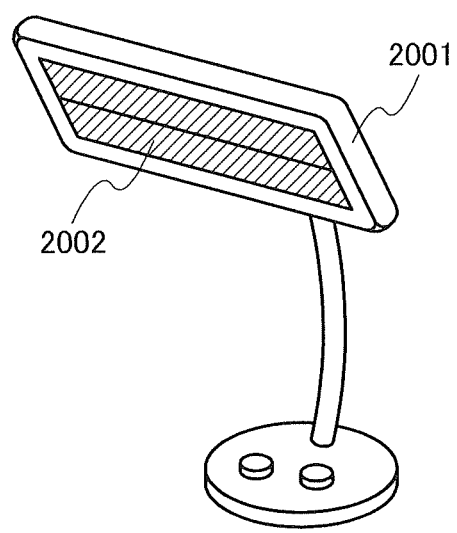
FIG. 11 illustrates a lighting device.

Thus, in this embodiment, it is preferable that the first light-emitting layer 113a further contain the first organic compound 113A and the first host material 113Ha and the first organic compound 113A form an exciplex (also referred to as excited complex) 113Ec (FIG. 1B and FIG. 2B). In FIG. 2B, 10 and 11 denote electrodes, one of which functions as an anode and the other of which functions as a cathode. Note that in the drawings, a singlet excited state and a triplet excited state of the exciplex 113Ec are represented by $S_e$ and $T_e$, respectively, a singlet excited state and a triplet excited state of the first phosphorescent compound 113Da are represented by $S_a$ and $T_a$, respectively, and a singlet excited state and a triplet excited state of the second phosphorescent compound 113Db are represented by $S_b$ and $T_b$, respectively.

In that case, at the time of recombination of carriers (electron and hole) in the first light-emitting layer 113a, the first organic compound 113A and the first host material 113Ha form the exciplex 113Ec by receiving energy as a result of recombination of electrons and holes. Fluorescence from the exciplex 113Ec has a spectrum on a longer wavelength side with respect to a fluorescence spectrum of the first organic compound 113A alone and a fluorescence spectrum of the first host material 113Ha alone, and also has a characteristic in that the singlet excited state $S_e$ and the triplet excited state $T_e$ of the exciplex 113Ec are extremely close to each other in terms of energy. Therefore, when a band having a peak of a PL spectrum $F(\lambda)$ which shows light emission from the singlet excited state of the exciplex 113Ec overlaps with the band having the longest-wavelength-side peak of the function $\varepsilon(\lambda)\lambda^4$ of the guest material (the first phosphorescent compound 113Da) (which corresponds to an absorption spectrum of a triplet excited state $T_a$ of the guest material), both energy transfer from $S_e$ to $T_a$ and energy transfer from $T_e$ to $T_a$ can be enhanced as much as possible. In this case, a difference between an emission peak wavelength of the exciplex 113Ec and a wavelength of a peak of $\varepsilon(\lambda)\lambda^4$ of the guest material (the first phosphorescent compound 113Da) is preferably 0.2 eV or less, in which case energy transfer occurs efficiently. Moreover, the triplet excitation energy levels of the first organic compound 113A and the first host material 113Ha are preferably kept higher than the triplet excitation energy level of the first phosphorescent compound 113Da.

Part of the energy thus transferred to the first phosphorescent compound 113Da is transferred to the second phosphorescent compound 113Db as described above, so that both the first phosphorescent compound 113Da and the second phosphorescent compound 113Db emit light efficiently.

Note that energy transfer from the triplet excited state ($T_e$) of the exciplex 113Ec to the first phosphorescent compound 113Da efficiently occurs by Dexter mechanism. Energy transfer from the singlet excited state ($S_e$) efficiently occurs by the above-described Förster mechanism, whereby efficient energy transfer is achieved as a whole.

There is no particular limitation on the first organic compound 113A and the first host material 113Ha as long as they can form an exciplex; a combination of a compound which is likely to accept electrons (a compound having an electron-trapping property) and a compound which is likely to accept holes (a compound having a hole-trapping property) is preferably employed.

The following are examples of the compound which is likely to accept electrons: a metal complex such as bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBT-BIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl) biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm- II); and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

The following are examples of the compound which is likely to accept holes: a compound having an aromatic amine skeleton such as 4,4'-bis[N-(1-naphthyl)-N-phenylamino]biphenyl (abbreviation: NPB), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

The first organic compound 113A and the first host material 113Ha are not limited to those compounds as long as they can form an exciplex, the band having the peak of the photoluminescence (PL) spectrum $F(\lambda)$ of the exciplex overlaps with the band having the longest-wavelength-side peak of the function $\varepsilon(\lambda)\lambda^4$ of the first phosphorescent compound, and the peak of an emission spectrum of the exciplex has a longer wavelength than a peak of the emission spectrum of the first phosphorescent compound 113Da.

Note that in the case where a compound which is likely to accept electrons and a compound which is likely to accept holes are used for the first organic compound 113A and the first host material 113Ha, carrier balance can be controlled by the mixture ratio of the compounds. Specifically, the ratio of the first organic compound 113A to the first host material 113Ha is preferably from 1:9 to 9:1.

Here, in this structure, the first host material 113Ha and the first organic compound 113A are selected such that an exciplex is formed which allows the band having the peak of the photoluminescence (PL) spectrum $F(\lambda)$ of the exciplex to overlap with the band having the longest-wavelength-side peak of the function $\varepsilon(\lambda)\lambda^4$ of the first phosphorescent compound. It is preferable that the overlap between the bands be as large as possible.

Note that a wavelength of the longest-wavelength-side peak of the function $\varepsilon(\lambda)\lambda^4$ of the first phosphorescent compound preferably overlaps with the photoluminescence (PL) spectrum $F(\lambda)$ of the exciplex. Further, it is more preferable that a wavelength range in which the band with the peak of the photoluminescence (PL) spectrum $F(\lambda)$ of the exciplex has half of the intensity of the above peak overlap with a wavelength range in which the band with the peak of the function $\varepsilon(\lambda)\lambda^4$ of the first phosphorescent compound has half of the intensity of the above peak, in which case the overlap between the spectra can be larger.

In the structure, energy can be efficiently transferred from the exciplex formed from the first host material 113Ha and the first organic compound 113A to the first phosphorescent compound 113Da to enhance the energy transfer efficiency, whereby a light-emitting element with a higher external quantum efficiency can be obtained.

Embodiment 2

In this embodiment, a detailed example of the structure of the light-emitting element described in Embodiment 1 will be described below with reference to FIGS. 1A to 1C.

A light-emitting element in this embodiment includes, between a pair of electrodes, an EL layer including a plurality of layers. In this embodiment, the light-emitting element includes the first electrode 101, the second electrode 102, and the EL layer 103, which is provided between the first electrode 101 and the second electrode 102. Note that in this embodiment, description is made on the assumption that the first electrode 101 functions as an anode and that the second electrode 102 functions as a cathode. In other words, when a voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like can be given. Films of these electrically conductive metal oxides are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer which is in contact with the first electrode 101 in the EL layer 103, an electrode material can be selected regardless of its work function.

There is no particular limitation on the stacked-layer structure of the EL layer 103 as long as the EL layer includes the light-emitting layer 113 which has a structure similar to that described in Embodiment 1. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which the hole-injection layer 111, the hole-transport layer 112, the light-emitting layer 113, the electron-transport layer 114, and the electron-injection layer 115 are stacked in this order over the first electrode 101. Materials included in the layers are specifically given below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis [N-(4-diphenylaminophenyl)-N-phenylamino]biphenyl (abbreviation: DPAB) or N,N-bis{4-[bis(3-methylphenyl) amino]phenyl}-N,N-diphenyl-(1,1'-biphenyl)-4,4'-diamine (abbreviation: DNTPD), a high molecular compound such as poly(ethylenedioxythiophene)/poly(styrenesulfonic acid) (PEDOT/PSS), or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the substance having an acceptor property, 7,7,8,8-tetracyano-2,3,5,6-tetrafluoroquinodimethane (abbreviation: $F_4$-TCNQ), chloranil, and the like can be given. In addition, transition metal oxides can be given. Oxides of the metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable in that their electron-accepting property is high. Among these, molybdenum oxide is particularly preferable in that it is stable in the air, has a low hygroscopic property, and is easily treated.

As the substance having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ cm$^2$/Vs or more is preferably used. Organic compounds that can be used as the substance having a hole-transport property in the composite material are specifically given below.

Examples of the aromatic amine compounds are N,N'-di (p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivatives that can be used for the composite material are 4,4'-di(N-carbazolyl) biphenyl (abbreviation: CBP), 1,3,5-tris[4-(N-carbazolyl) phenyl]benzene (abbreviation: TCPB), 9-[4-(10-phenyl-9-anthryl)phenyl]-9H-carbazole (abbreviation: CzPA), 1,4-bis [4-(N-carbazolyl)phenyl]-2,3,5,6-tetraphenylbenzene, and the like.

Examples of the aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra (tert-butyl)perylene, and the like. Besides, pentacene, coronene, or the like can also be used. The aromatic hydrocarbon which has a hole mobility higher than or equal to $1\times10^{-6}$ cm$^2$/Vs and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A high molecular compound such as poly(N-vinylcarbazole) (abbreviation: PVK), poly(4-vinyltriphenylamine) (abbreviation: PVTPA), poly[N-(4-{N'-[4-(4-diphenylamino) phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD) can also be used.

By providing a hole-injection layer, a high hole-transport property can be achieved to allow a light-emitting element to have a small drive voltage.

The hole-transport layer 112 is a layer that contains a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances mentioned here have high hole-transport properties and are mainly ones that have a hole mobility of $10^{-6}$ cm$^2$/Vs or more. An organic compound given as an example of the substance having a hole-transport property in the composite material described above can also be used for the hole-transport layer 112. A high molecular compound such as poly(N-vinylcarbazole) (abbreviation: PVK) or poly(4-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 is a layer containing the first phosphorescent compound and the second phosphorescent compound. Since the light-emitting layer 113 has a structure similar to that described in Embodiment 1, the light-emitting element in this embodiment can have an extremely high emission efficiency. Embodiment 1 is to be referred to for main structures of the light-emitting layer 113.

There is no particular limitation on materials that can be used as the first phosphorescent compound and the second phosphorescent compound in the light-emitting layer 113 as long as they have the relation described in Embodiment 1. The following can be given as examples of the first phosphorescent compound and the second phosphorescent compound.

The examples are an organometallic iridium complex having a 4H-triazole skeleton such as tris{2-[5-(2-methylphenyl)-4-(2,6-dimethylphenyl)-4H-1,2,4-triazol-3-yl-κN$^2$]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium(III) (abbreviation: Ir(iPrptz-3b)$_3$); an organometallic iridium complex having a 1H-triazole skeleton such as tris[3-methyl-1-(2-methylphenyl)-5-phenyl-1H-1,2,4-triazolato]iridium(III) (abbreviation: Ir(Mptz1-mp)$_3$), or tris(1 1-methyl-5-phenyl-3-propyl-1H-1,2,4-triazolato)iridium(III) (abbreviation: Ir(Prptz1-Me)$_3$); an organometallic iridium complex having an imidazole skeleton such as fac-tris[1-(2,6-diisopropylphenyl)-2-phenyl-1H-imidazole]iridium(III) (abbreviation: Ir(iPrpmi)$_3$) or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^2$']iridium(III) tetrakis(1-pyrazolyl)borate (abbreviation: FIr6), bis[2-(4',6'-difluorophenyl)pyridinato-N,C$^2$']iridium(III) picolinate (abbreviation: FIrpic), bis{2-[3',5'-bis(trifluoromethyl)phenyl]pyridinato-N,C$^2$'}iridium(III) picolinate (abbreviation: Ir(CF$_3$ppy)$_2$(pic)), or bis[2-(4',6'-difluorophenyl)pyridinato-N,C$^2$']iridium(III) acetylacetonate (abbreviation: FIracac). These are compounds emitting blue phosphorescence and have an emission peak at 440 nm to 520 nm. Among the above compounds, an organometallic iridium complex having a polyazole skeleton such as a 4H-triazole skeleton, a 1H-triazole skeleton, or an imidazole skeleton has a high hole-trapping property. Therefore, it is preferable that any of these compounds be used as the first phosphorescent compound in the light-emitting element of one embodiment of the present invention, the first light-emitting layer be provided closer to the cathode than the second light-emitting layer, and the second light-emitting layer have a hole-transport property (specifically, the second host material be a hole-transport material), in which case a recombination region of carriers can be easily controlled to be in the first light-emitting layer. Note that an organometallic iridium complex having a 4H-triazole skeleton has excellent reliability and emission efficiency and thus is particularly preferable.

Other examples are an organometallic iridium complex having a pyrimidine skeleton such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[6-(2-norbornyl)-4-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), or (acetylacetonato)bis(4,6-diphenylpyrimidinato)iridium(II) (abbreviation: Ir(dppm)$_2$(acac)); an organometallic iridium complex having a pyrazine skeleton such as (acetylacetonato)bis(3,5-dimethyl-2-phenylpyrazinato)iridium(III) (abbreviation: Ir(mppr-Me)$_2$(acac)) or (acetylacetonato)bis(5-isopropyl-3-methyl-2-phenylpyrazinato)iridium(III) (abbreviation: Ir(mppr-iPr)$_2$(acac)); an organometallic iridium complex having a pyridine skeleton such as tris(2-phenylpyridinatoN,C$^2$')iridium(III) (abbreviation: Ir(ppy)$_3$), bis(2-phenylpyridinato-N,C$^2$')iridium(III) acetylacetonate (abbreviation: Ir(ppy)$_2$(acac)), bis(benzo[h]quinolinato)iridium(II) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^2$')iridium(III) (abbreviation: Ir(pq)$_3$), or bis(2-phenylquinolinato-N,C$^2$')iridium(III) acetylacetonate (abbreviation: Ir(pq)$_2$(acac)); and a rare earth metal complex such as tris(acetylacetonato)(monophenanthroline)terbium(III) (abbreviation: Tb(acac)$_3$(Phen)). These are mainly compounds emitting green phosphorescence and have an emission peak at 500 nm to 600 nm. Among the above compounds, an organometallic iridium complex having a diazine skeleton such as a pyrimidine skeleton or a pyrazine skeleton has a low hole-trapping property and a high electron-trapping property. Therefore, it is preferable that any of these compounds be used as the first phosphorescent compound in the light-emitting element of one embodiment of the present invention, the first light-emitting layer be provided closer to the anode than the second light-emitting layer, and the second light-emitting layer have an electron-transport property (specifically, the second host material be an electron-transport material), in which case a recombination region of carriers can be easily controlled to be in the first light-emitting layer. Note that an organometallic iridium complex having a pyrimidine skeleton has distinctively high reliability and emission efficiency and thus is particularly preferable.

Still other examples are an organometallic iridium complex having a pyrimidine skeleton such as bis[4,6-bis(3-methylphenyl)pyrimidinato](diisobutylylmethano)iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), or bis[4,6-di(naphthalen-1-yl)pyrimidinato](dipivaloylmethanato)iridium(III) (abbreviation: Ir(d1npm)$_2$(dpm)); an organometallic iridium complex having a pyrazine skeleton such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); an organometallic iridium complex having a pyridine skeleton such as tris(1-phenylisoquinolinato-N,C$^{2'}$)iridium(III) (abbreviation: Ir(piq)$_3$) or bis(1-phenylisoquinolinato-N,C$^{2'}$)iridium (III) acetylacetonate (abbreviation: Ir(piq)$_2$(acac)); a platinum complex such as 2,3,7,8,12,13,17,18-octaethyl-21H, 23H-porphyrin platinum(II) (abbreviation: PtOEP); and a rare earth metal complex such as tris(1,3-diphenyl-1,3-propanedionato)(monophenanthroline)europium(III) (abbreviation: Eu(DBM)$_3$(Phen)) or tris[1-(2-thenoyl)-3,3,3-trifluoroacetonato](monophenanthroline)europium(III) (abbreviation: Eu(TTA)$_3$(Phen)). These are compounds emitting red phosphorescence and have an emission peak at 600 nm to 700 nm. Among the above materials, an organometallic iridium complex having a diazine skeleton such as a pyrimidine skeleton or a pyrazine skeleton has a low hole-trapping property and a high electron-trapping property. Therefore, it is preferable that an organometallic iridium complex having a diazine skeleton be used as the second phosphorescent compound, the first light-emitting layer be provided closer to the cathode than the second light-emitting layer, and the second light-emitting layer have a hole-transport property (specifically, the second host material be a hole-transport material), in which case a recombination region of carriers can be easily controlled to be in the first light-emitting layer. Note that an organometallic iridium complex having a pyrimidine skeleton has distinctively high reliability and emission efficiency and thus is particularly preferable. Further, because an organometallic iridium complex having a pyrazine skeleton can provide red light emission with favorable chromaticity, the use of the organometallic iridium complex in a white light-emitting element improves a color rendering property of the white light-emitting element.

It is also possible to select a first phosphorescent material and a second phosphorescent material which have the relation described in Embodiment 1, from known phosphorescent materials in addition to the above phosphorescent compounds.

Note that instead of phosphorescent compounds (the first phosphorescent compound 113a and the second phosphorescent compound 113b), materials exhibiting thermally activated delayed fluorescence, i.e., thermally activated delayed fluorescent (TADF) materials, may be used. Here, the term "delayed fluorescence" refers to light emission having a spectrum similar to that of normal fluorescence and an extremely long lifetime. The lifetime is 10$^{-6}$ seconds or longer, preferably 10$^{-3}$ seconds or longer. Specific examples of the thermally activated delayed fluorescent materials include a fullerene, a derivative thereof, an acridine derivative such as proflavine, and eosin. Besides, a metal-containing porphyrin can be used, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: SnF$_2$(Proto IX)), a mesoporphyrin-tin fluoride complex (abbreviation: SnF$_2$(Meso IX)), a hematoporphyrin-tin fluoride complex (abbreviation: SnF$_2$(Hemato IX)), a coproporphyrin tetramethyl ester-tin fluoride complex (abbreviation: SnF$_2$(Copro III-4Me)), an octaethylporphyrin-tin fluoride complex (abbreviation: SnF$_2$(OEP)), an etioporphyrin-tin fluoride complex (abbreviation: SnF$_2$(Etio I)), and an octaethylporphyrin-platinum chloride complex (abbreviation: PtCl$_2$(OEP)). Alternatively, a heterocyclic compound including a n-electron rich heteroaromatic ring and a n-electron deficient heteroaromatic ring can be used, such as 2-(biphenyl-4-yl)-4,6-bis(12-phenylindolo[2,3-a]carbazol-11-yl)-1,3,5-triazine (abbreviation: PIC-TRZ). Note that a material in which the n-electron rich heteroaromatic ring is directly bonded to the n-electron deficient heteroaromatic ring is particularly preferably used because the donor property of the n-electron rich heteroaromatic ring and the acceptor property of the π-electron deficient heteroaromatic ring are both increased and the energy difference between the S$_1$ level and the T$_1$ level becomes small.

There is no particular limitation on the materials which can be used as the first and second host materials; a variety of carrier transporting materials may be selected and appropriately combined such that the element structure illustrated in FIGS. 1A to 1C is obtained.

The following are examples of the host material having an electron-transport property: a metal complex such as bis(10-hydroxybenzo[h]quinolinato)beryllium(II) (abbreviation: BeBq$_2$), bis(2-methyl-8-quinolinolato)(4-phenylphenolato) aluminum(III) (abbreviation: BAlq), bis(8-quinolinolato) zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton such as 3,5-bis [3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

The following are examples of the host material having a hole-transport property: a compound having an aromatic amine skeleton such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2- amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

Host materials can be selected from known substances as well as from the above host materials. Note that as the host materials, substances having a triplet level (energy gap between a ground state and a triplet excited state) higher than that of the phosphorescent compound are preferably selected. It is preferable that these host materials do not have an absorption spectrum in the blue wavelength range. Specifically, an absorption edge of the absorption spectrum is preferably at 440 nm or less.

For formation of the light-emitting layer 113 having the above-described structure, co-evaporation by a vacuum evaporation method can be used, or alternatively an inkjet method, a spin coating method, a dip coating method, or the like using a mixed solution can be used.

The electron-transport layer 114 is a layer containing a substance having an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here have high electron-transport properties and are mainly ones that have an electron mobility of $10^{-6}$ cm$^2$/Vs or more. Note that any of the above-described host materials having electron-transport properties may be used for the electron-transport layer 114.

Furthermore, the electron-transport layer 114 is not limited to a single layer and may be a stack of two or more layers containing any of the above substances.

Between the electron-transport layer and the light-emitting layer, a layer that controls transport of electron carriers may be provided. This is a layer formed by addition of a small amount of a substance having a high electron-trapping property to a material having a high electron-transport property as described above, and the layer is capable of adjusting carrier balance by suppressing transport of electron carriers. Such a structure is very effective in preventing a problem (such as a reduction in element lifetime) caused when electrons pass through the light-emitting layer.

In addition, the electron-injection layer 115 may be provided in contact with the second electrode 102 between the electron-transport layer 114 and the second electrode 102. For the electron-injection layer 115, an alkali metal, an alkaline earth metal, or a compound thereof such as lithium fluoride (LiF), cesium fluoride (CsF), or calcium fluoride (CaF$_2$) can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Further, any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference between the first electrode 101 and the second electrode 102, and holes and electrons recombine in the light-emitting layer 113 which contains a substance having a high light-emitting property, so that light is emitted. That is, a light-emitting region is formed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113 is formed using a substance having a wider band gap than the light-emitting substance of the light-emitting layer or the emission center substance included in the light-emitting layer.

A light-emitting element in this embodiment is preferably fabricated over a substrate of glass, plastic, or the like. As the way of stacking layers over the substrate, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered TFT. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

Note that this embodiment can be combined with any of the other embodiments as appropriate.

Embodiment 3

In this embodiment, a light-emitting device using the light-emitting element described in Embodiments 1 and 2 will be described.

In this embodiment, the light-emitting device using the light-emitting element described in Embodiments 1 and 2 is described with reference to FIGS. 4A and 4B. Note that FIG. 4A is a top view of the light-emitting device and FIG. 4B is a cross-sectional view taken along the lines A-B and C-D in FIG. 4A. This light-emitting device includes a driver circuit portion (source line driver circuit) 601, a pixel portion 602, and a driver circuit portion (gate line driver circuit) 603, which are to control light emission of the light-emitting element and illustrated with dotted lines. Moreover, a reference numeral 604 denotes a sealing substrate; 625, a drying agent; 605, a sealing material; and 607, a space surrounded by the sealing material 605.

Reference numeral 608 denotes a wiring for transmitting signals to be inputted into the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 4B. The driver circuit portion and the pixel portion are formed over an element substrate 610; the source line driver circuit 601, which is a driver circuit portion, and one of the pixels in the pixel portion 602 are illustrated here.

As the source line driver circuit 601, a CMOS circuit in which an n-channel TFT 623 and a p-channel TFT 624 are combined is formed. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching TFT 611, a current controlling TFT 612, and a first electrode 613 electrically connected to a drain of the current controlling TFT 612. Note that to cover an end portion of the first electrode 613, an insulator 614 is formed, for which a positive photosensitive acrylic resin film is used here.

In order to improve coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

In addition, the EL layer 616 is formed by any of a variety of methods such as an evaporation method using an evaporation mask, an inkjet method, and a spin coating method. The EL layer 616 has a structure similar to that described in Embodiments 1 and 2. Further, for another material included in the EL layer 616, any of low molecular compounds and high molecular compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element is the light-emitting element described in Embodiments 1 and 2. In the light-emitting device of this embodiment, the pixel portion, which includes a plurality of light-emitting elements, may include both the light-emitting element described in Embodiments 1 and 2 and a light-emitting element having a different structure.

Further, the sealing substrate 604 is attached to the element substrate 610 with the sealing material 605, so that a light-emitting element 618 is provided in the space 607 surrounded by the element substrate 610, the sealing substrate 604, and the sealing material 605. The space 607 may be filled with filler, and may be filled with an inert gas (such as nitrogen or argon), or the sealing material 605. It is preferable that the sealing substrate be provided with a recessed portion and the drying agent 625 be provided in the recessed portion, in which case deterioration due to influence of moisture can be suppressed.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate formed of fiberglass reinforced plastic (FRP), poly(vinyl fluoride) (PVF), polyester, acrylic, or the like can be used.

As described above, the light-emitting device which uses the light-emitting element described in Embodiments 1 and 2 can be obtained.

The light-emitting device in this embodiment is fabricated using the light-emitting element described in Embodiments 1 and 2 and thus can have favorable characteristics. Specifically, since the light-emitting element described in Embodiments 1 and 2 has high emission efficiency, the light-emitting device can have reduced power consumption. In addition, since the light-emitting element has low drive voltage, the light-emitting device can be driven at low voltage.

Figure 5A:
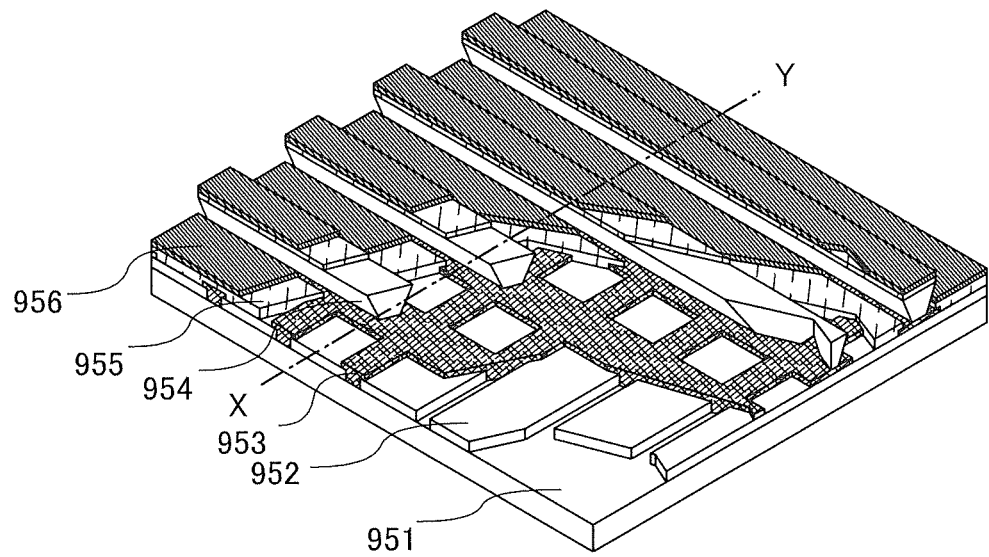
FIGS. 5A and 5B are conceptual diagrams of a passive matrix light-emitting device.
Figure 5B:
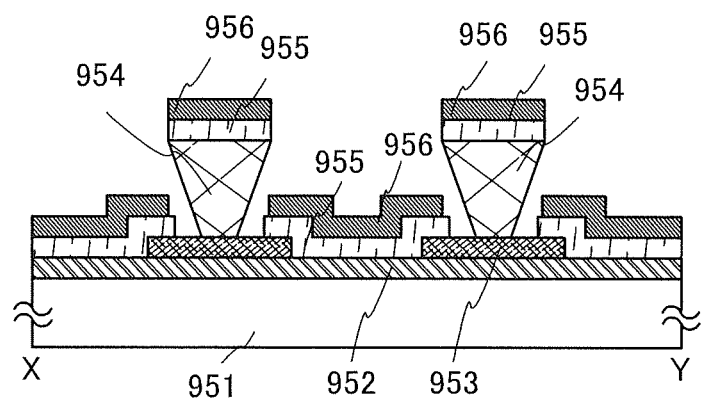

Although an active matrix light-emitting device is described in this embodiment as described above, a passive matrix light-emitting device may be manufactured. FIGS. 5A and 5B illustrate a passive matrix light-emitting device manufactured using the present invention. FIG. 5A is a perspective view of the light-emitting device, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. In addition, a partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition wall layer 954 is trapezoidal, and the lower side (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). The partition layer 954 thus provided can prevent defects in the light-emitting element due to static electricity or the like. The passive matrix light-emitting device can also be driven with low power consumption by including the light-emitting element in Embodiments 1 and 2 which is capable of operating at low voltage. Further, the light-emitting device can have high reliability by including the light-emitting element described in Embodiments 1 and 2.

Further, for performing full color display, a coloring layer or a color conversion layer may be provided in a light path through which light from the light-emitting element passes to the outside of the light-emitting device. An example of a light-emitting device in which full color display is achieved with the use of a coloring layer and the like is illustrated in FIGS. 6A and 6B. In FIG. 6A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G and 1024B of light-emitting elements, a partition wall 1025, an EL layer 1028, a second electrode 1029 of the light-emitting elements, a sealing substrate 1031, and a sealant 1032 are illustrated. Further, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In this embodiment, light emitted from some of the light-emitting layers does not pass through the coloring layers, while light emitted from the others of the light-emitting layers passes through the coloring layers. Since light which does not pass through the coloring layers is white and light which passes through any one of the coloring layers is red, blue, or green, an image can be displayed using pixels of the four colors.

Figure 7:
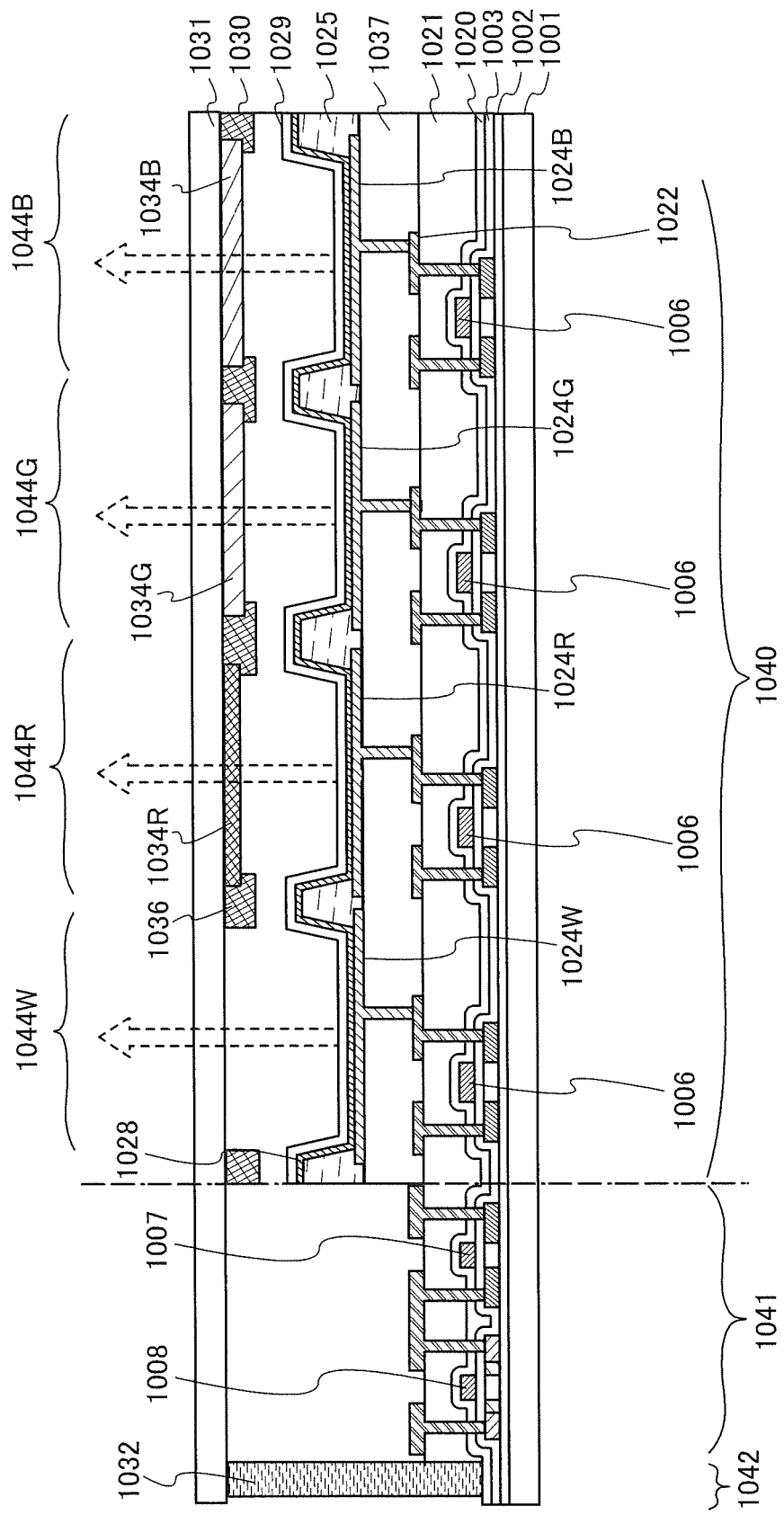
FIG. 7 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 7 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. Then, a third interlayer insulating film 1037 is formed to cover an electrode 1022. The third interlayer insulating film 1037 may have a planarization function. The third interlayer insulating film 1037 can be formed using a material similar to that of the second interlayer insulating film, and can alternatively be formed using any other known material.

The first electrodes 1024W, 1024R, 1024G, and 1024B of the light-emitting elements each serve as an anode here, but may serve as a cathode. Further, in the case of a light-emitting device having a top emission structure as illustrated in FIG. 7, the first electrodes are preferably reflective electrodes. The EL layer 1028 is formed to have a structure similar to the structure described in Embodiments 1 and 2, with which white light emission can be obtained. As the structure with which white light emission can be obtained, in the case where two EL layers are used, a structure with which blue light is obtained from a light-emitting layer in one of the EL layers and orange light is obtained from a light-emitting layer of the other of the EL layers; a structure in which blue light is obtained from a light-emitting layer of one of the EL layers and red light and green light are obtained from a light-emitting layer of the other of the EL layers; and the like can be given. Further, in the case where three EL layers are used, red light, green light, and blue light are obtained from respective light-emitting layers, so that a light-emitting element which emits white light can be obtained. Needless to say, the structure with which white light emission is obtained is not limited thereto as long as the structure described in Embodiments 1 and 2 is used.

The coloring layers are each provided in a light path through which light from the light-emitting element passes to the outside of the light-emitting device. In the case of the light-emitting device having a bottom emission structure as illustrated in FIG. 6A, the coloring layers 1034R, 1034G, and 1034B can be provided on the transparent base material 1033 and then fixed to the substrate 1001. The coloring layers may be provided between the gate insulating film 1003 and the first interlayer insulating film 1020 as illustrated in FIG. 6B. In the case of a top emission structure as illustrated in FIG. 7, sealing can be performed with the sealing substrate 1031 on which the coloring layers (the red coloring layer 1034R, the green coloring layer 1034Q and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) 1035 may be covered with the overcoat layer 1036. Note that a light-transmitting substrate is used as the sealing substrate 1031.

When voltage is applied between the pair of electrodes of the thus obtained organic light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in Embodiments 1 and 2; thus, a light-emitting device with low power consumption can be obtained.

Further, although an example in which full color display is performed using four colors of red, green, blue, and white is shown here, there is no particular limitation and full color display using three colors of red, green, and blue may be performed.

This embodiment can be freely combined with any of other embodiments.

Embodiment 4

Figure 8A:
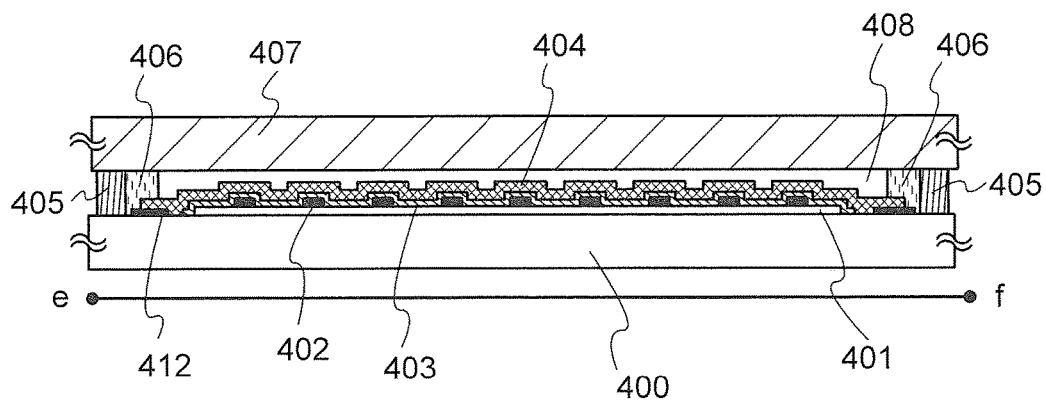
FIGS. 8A and 8B are conceptual diagrams of a lighting device.
Figure 8B:
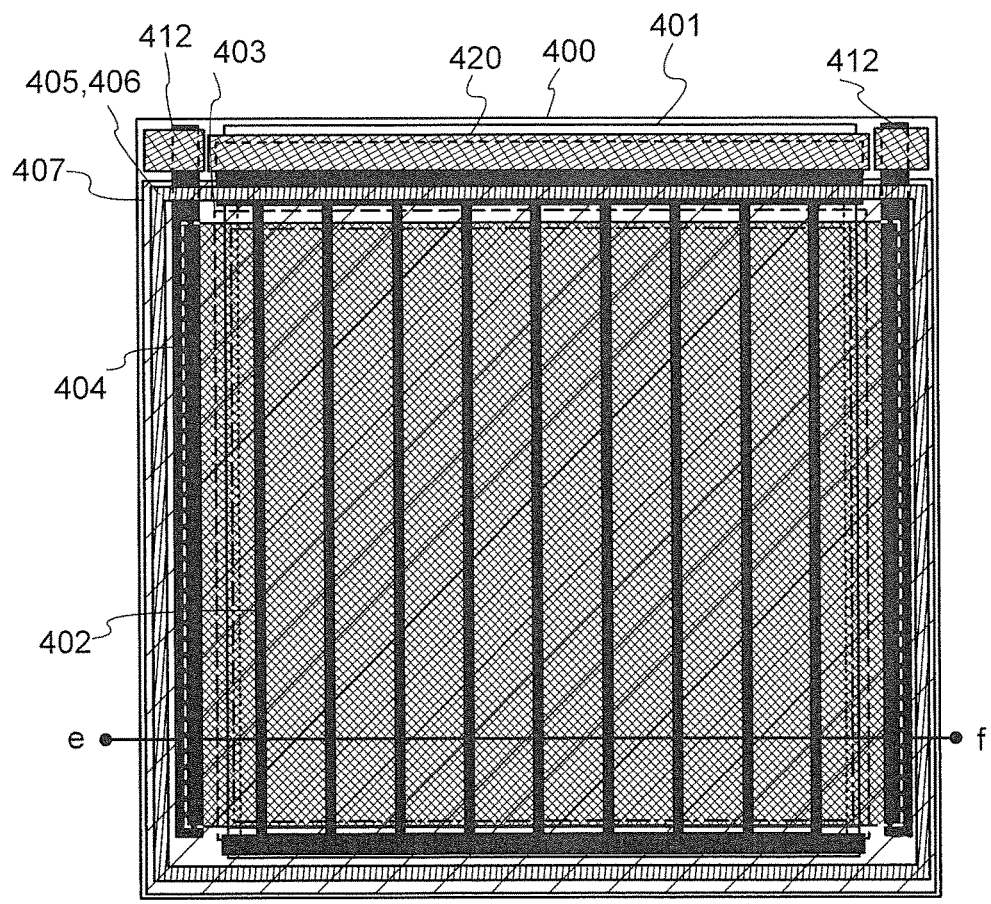

In this embodiment, an example in which the light-emitting element described in Embodiments 1 and 2 is used for a lighting device will be described with reference to FIGS. 8A and 8B. FIG. 8B is a top view of the lighting device, and FIG. 8A is a cross-sectional view taken along the line e-f in FIG. 8B.

In the lighting device in this embodiment, a first electrode 401 is formed over a substrate 400 which is a support and has a light-transmitting property. The first electrode 401 corresponds to the first electrode 101 in Embodiment 3.

An auxiliary electrode 402 is provided over the first electrode 401. Since light emission is extracted through the first electrode 401 side in the example given in this embodiment, the first electrode 401 is formed using a material having a light-transmitting property. The auxiliary electrode 402 is provided in order to compensate for the low conductivity of the material having a light-transmitting property, and has a function of suppressing luminance unevenness in a light emission surface due to voltage drop caused by the high resistance of the first electrode 401. The auxiliary electrode 402 is formed using a material having at least higher conductivity than the material of the first electrode 401, and is preferably formed using a material having high conductivity such as aluminum. Note that surfaces of the auxiliary electrode 402 other than a portion thereof in contact with the first electrode 401 are preferably covered with an insulating layer. This is for suppressing light emission over the upper portion of the auxiliary electrode 402, which cannot be extracted, for reducing a reactive current, and for suppressing a reduction in power efficiency. Note that a pad 412 for applying a voltage to a second electrode 404 may be formed at the same time as the formation of the auxiliary electrode 402.

An EL layer 403 is formed over the first electrode 401 and the auxiliary electrode 402. The EL layer 403 has the structure described in Embodiments 1 and 2. Refer to the descriptions for the structure. Note that the EL layer 403 is preferably formed to be slightly larger than the first electrode 401 when seen from above, in which case the EL layer 403 can also serve as an insulating layer that suppresses a short circuit between the first electrode 401 and the second electrode 404.

The second electrode 404 is formed to cover the EL layer 403. The second electrode 404 corresponds to the second electrode 102 in Embodiment 3 and has a similar structure. In this embodiment, it is preferable that the second electrode 404 be formed using a material having high reflectance because light emission is extracted through the first electrode 401 side. In this embodiment, the second electrode 404 is connected to the pad 412, whereby voltage is applied.

As described above, the lighting device described in this embodiment includes a light-emitting element including the first electrode 401, the EL layer 403, and the second electrode 404 (and the auxiliary electrode 402). Since the light-emitting element is a light-emitting element with high emission efficiency, the lighting device in this embodiment can be a lighting device having low power consumption. Furthermore, since the light-emitting element is a light-emitting element having high reliability, the lighting device in this embodiment can be a lighting device having high reliability.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 can be mixed with a desiccant which enables moisture to be adsorbed, increasing reliability.

When parts of the pad 412, the first electrode 401, and the auxiliary electrode 402 are extended to the outside of the sealing materials 405 and 406, the extended parts can serve as external input terminals. An IC chip 420 mounted with a converter or the like may be provided over the external input terminals.

As described above, since the lighting device described in this embodiment includes the light-emitting element described in Embodiments 1 and 2 as an EL element, the lighting device can be a lighting device having low power consumption. Further, the lighting device can be a lighting device having low drive voltage. Furthermore, the lighting device can be a lighting device having high reliability.

Embodiment 5

In this embodiment, examples of electronic devices each including the light-emitting element described in Embodiments 1 and 2 will be described. The light-emitting element described in Embodiments 1 and 2 has high emission efficiency and reduced power consumption. As a result, the electronic devices described in this embodiment can each include a light-emitting portion having reduced power consumption. In addition, the electronic devices can be driven at low voltage since the light-emitting element described in Embodiments 1 and 2 has low drive voltage.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

Figure 9A:
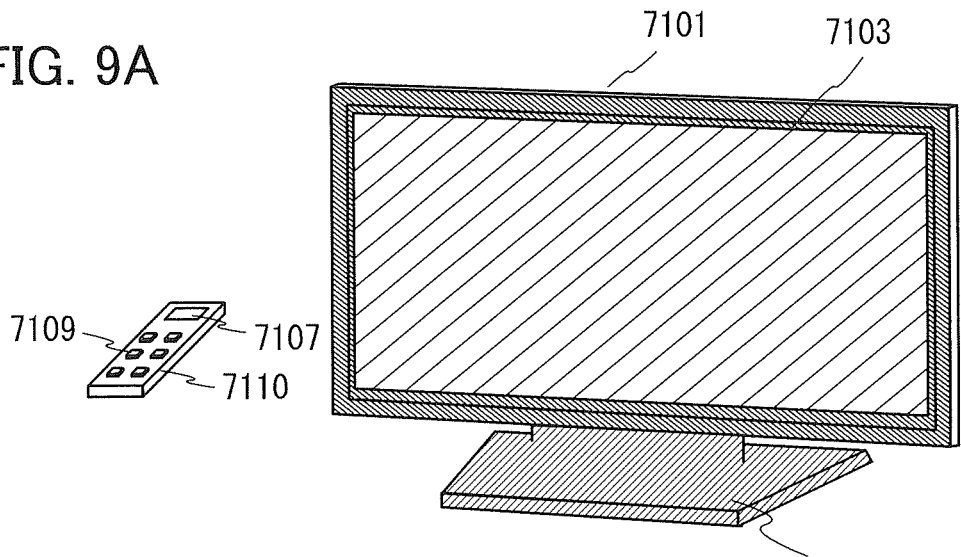
Figure 9A:
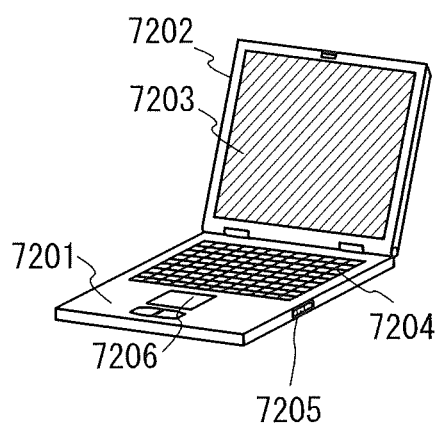
Figure 9A:
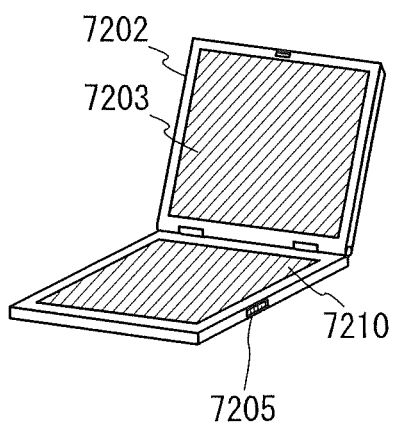

FIG. 9A illustrates an example of a television device. In the television device, a display portion 7103 is incorporated in a housing 7101. In addition, here, the housing 7101 is supported by a stand 7105. Images can be displayed on the display portion 7103, and in the light-emitting portion 7103, the light-emitting elements described in Embodiments 1 and 2 are arranged in a matrix. The light-emitting elements can have high emission efficiency. Further, the light-emitting elements can be driven at low voltage. Furthermore, the light-emitting elements can have a long lifetime. Therefore, the television device including the display portion 7103 which is formed using the light-emitting elements can be a television device having reduced power consumption. Further, the television device can be a television device having low drive voltage. Furthermore, the television device can be a television device having high reliability.

Operation of the television device can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 9B1 illustrates a computer, which includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203, which are the same as that described in Embodiment 2 or 3. The computer illustrated in FIG. 9B1 may have a structure illustrated in FIG. 9B2. The computer illustrated in FIG. 9B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may be also a touch screen. Connecting the two screens with a hinge can prevent troubles; for example, the screens can be prevented from being cracked or broken while the computer is being stored or carried. The light-emitting elements can have high emission efficiency. Therefore, this computer having the display portion 7203 which is formed using the light-emitting elements consumes less power.

Figure 9C:
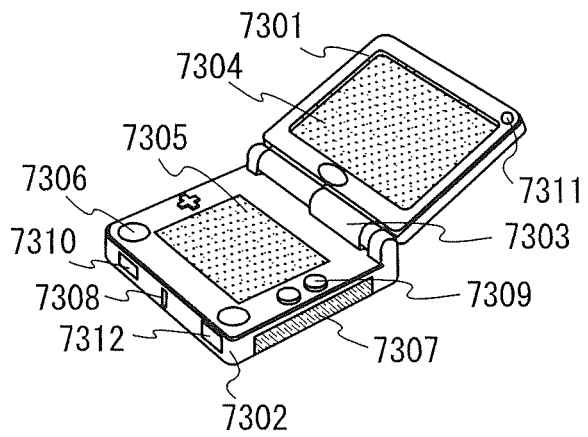

FIG. 9C illustrates a portable game machine having two housings, a housing 7301 and a housing 7302, which are connected with a joint portion 7303 so that the portable game machine can be opened or folded. The housing 7301 incorporates a display portion 7304 including the light-emitting elements described in Embodiments 1 and 2 and arranged in a matrix, and the housing 7302 incorporates a display portion 7305. In addition, the portable game machine illustrated in FIG. 9C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion which includes the light-emitting elements described in Embodiments 1 and 2 and arranged in a matrix is used as at least either the display portion 7304 or the display portion 7305, or both, and the structure can include other accessories as appropriate. The portable game machine illustrated in FIG. 9C has a function of reading out a program or data stored in a storage medium to display it on the display portion, and a function of sharing information with another portable game machine by wireless communication. Note that functions of the portable game machine illustrated in FIG. 9C are not limited to them, and the portable game machine can have various functions. Since the light-emitting elements used in the display portion 7304 have high emission efficiency, the portable game machine including the above-described display portion 7304 can be a portable game machine having reduced power consumption. Since the light-emitting elements used in the display portion 7304 each can be driven at low voltage, the portable game machine can also be a portable game machine having low drive voltage. Furthermore, since the light-emitting elements used in the display portion 7304 each have a long lifetime, the portable game machine can be highly reliable.

Figure 9D:
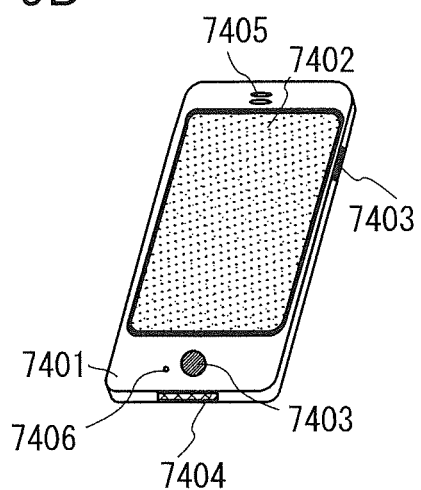

FIG. 9D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone 7400 has the display portion 7402 including the light-emitting elements described in Embodiments 1 and 2 and arranged in a matrix. The light-emitting elements can have high emission efficiency. Further, the light-emitting elements can be driven at low voltage. Furthermore, the light-emitting elements can have a long lifetime. Therefore, the mobile phone including the display portion 7402 which is formed using the light-emitting elements can be a mobile phone having reduced power consumption. Further, the mobile phone can be a mobile phone having low drive voltage. Furthermore, the mobile phone can be a mobile phone having high reliability.

When the display portion 7402 of the mobile phone illustrated in FIG. 9D is touched with a finger or the like, data can be input into the mobile phone. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode mainly for inputting characters is selected for the display portion 7402 so that characters displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone, display on the screen of the display portion 7402 can be automatically changed by determining the orientation of the mobile phone (whether the mobile phone is placed horizontally or vertically for a landscape mode or a portrait mode).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device having the light-emitting element described in Embodiments 1 and 2 is wide so that this light-emitting device can be applied to electronic devices in a variety of fields. By using the light-emitting element described in Embodiments 1 and 2, an electronic device having reduced power consumption can be obtained.

FIG. 10 illustrates an example of a liquid crystal display device using the light-emitting element described in Embodiments 1 and 2 for a backlight. The liquid crystal display device illustrated in FIG. 10 includes a housing 901, a liquid crystal layer 902, a backlight unit 903, and a housing 904. The liquid crystal layer 902 is connected to a driver IC 905. The light-emitting element described in Embodiments 1 and 2 is used in the backlight unit 903, to which current is supplied through a terminal 906.

The light-emitting element described in Embodiments 1 and 2 is used for the backlight of the liquid crystal display device; thus, the backlight can have reduced power consumption. In addition, the use of the light-emitting element described in Embodiment 2 enables manufacture of a planar-emission lighting device and further a larger-area planar-emission lighting device; therefore, the backlight can be a larger-area backlight, and the liquid crystal display device can also be a larger-area device. Furthermore, the light-emitting device using the light-emitting element described in Embodiment 2 can be thinner than a conventional one; accordingly, the display device can also be thinner.

FIG. 11 illustrates an example in which the light-emitting element described in Embodiments 1 and 2 is used for a table lamp which is a lighting device. The table lamp illustrated in FIG. 11 includes a housing 2001 and a light source 2002, and the light-emitting device described in Embodiment 4 is used for the light source 2002.

Figure 12:
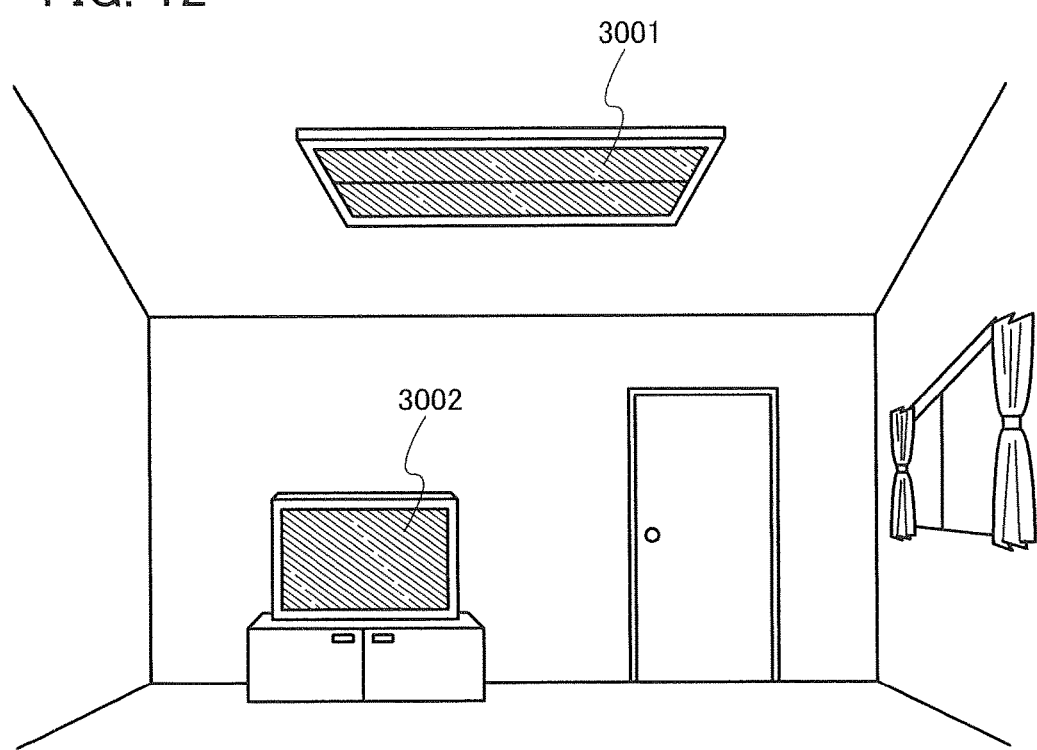
FIG. 12 illustrates a lighting device and a display device.

FIG. 12 illustrates an example in which the light-emitting element described in Embodiments 1 and 2 is used for an indoor lighting device 3001 and a display device 3002. Since the light-emitting element described in Embodiments 1 and 2 has reduced power consumption, a lighting device that has reduced power consumption can be obtained. Further, since the light-emitting element described in Embodiments 1 and 2 can have a large area, the light-emitting element can be used for a large-area lighting device. Furthermore, since the light-emitting element described in Embodiments 1 and 2 is thin, the light-emitting element can be used for a lighting device having a reduced thickness.

Figure 13:
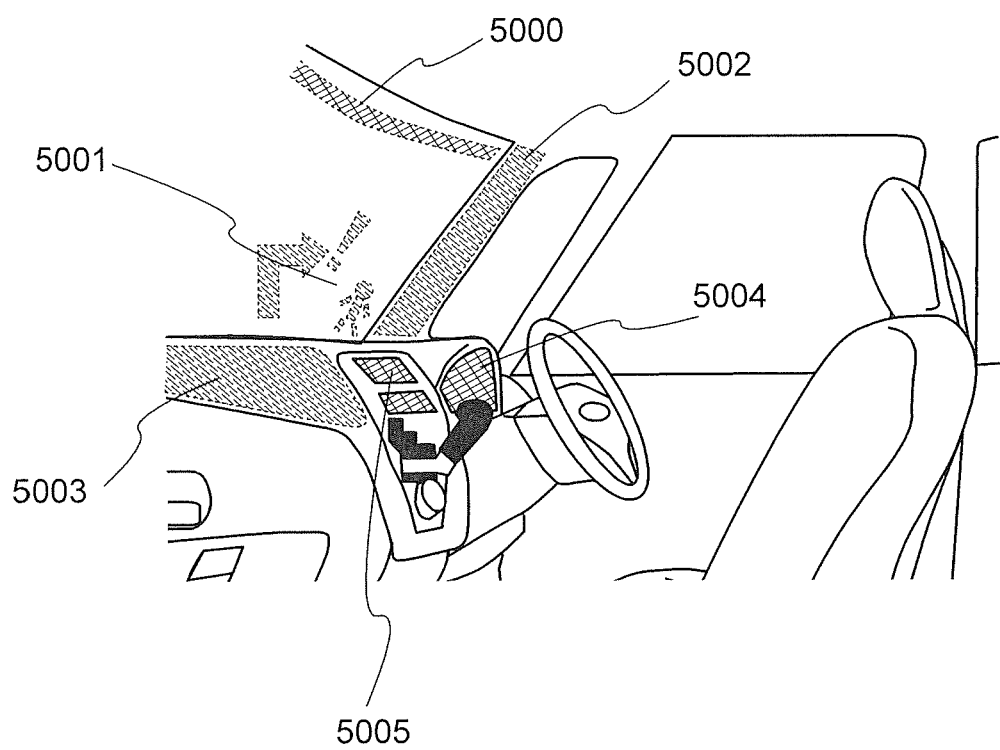
FIG. 13 illustrates car-mounted display devices and lighting devices.

The light-emitting element described in Embodiments 1 and 2 can also be used for an automobile windshield or an automobile dashboard. FIG. 13 illustrates one mode in which the light-emitting elements described in Embodiment 2 are used for an automobile windshield and an automobile dashboard. Displays 5000 to 5005 each include the light-emitting element described in Embodiments 1 and 2.

The display 5000 and the display 5001 are display devices which are provided in the automobile windshield and in which the light-emitting elements described in Embodiments 1 and 2 are incorporated. The light-emitting element described in Embodiments 1 and 2 can be formed into what is called a see-through display device, through which the opposite side can be seen, by including a first electrode and a second electrode formed of electrodes having light-transmitting properties. Such see-through display devices can be provided even in the windshield of the car, without hindering the vision. Note that in the case where a transistor for driving is provided, a transistor having a light-transmitting property, such as an organic transistor using an organic semiconductor material or a transistor using an oxide semiconductor, is preferably used.

The display 5002 is a display device which is provided in a pillar portion and in which the light-emitting elements described in Embodiments 1 and 2 are incorporated. The display 5002 can compensate for the view hindered by the pillar portion by showing an image taken by an imaging unit provided in the car body. Similarly, the display 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display 5004 and the display 5005 can provide a variety of kinds of information such as navigation data, a speedometer, a tachometer, a mileage, a fuel meter, a gearshift indicator, and air-condition setting. The content or layout of the display can be changed freely by a user as appropriate. Note that such information can also be shown by the displays 5000 to 5003. The displays 5000 to 5005 can also be used as lighting devices.

The light-emitting element described in Embodiments 1 and 2 can have high emission efficiency and low power consumption. Therefore, load on a battery is small even when a number of large screens such as the displays 5000 to 5005 are provided, which provides comfortable use. For that reason, the light-emitting device and the lighting device each of which includes the light-emitting element described in Embodiments 1 and 2 can be suitably used as an in-vehicle light-emitting device and an in-vehicle lighting device.

Figure 14A:
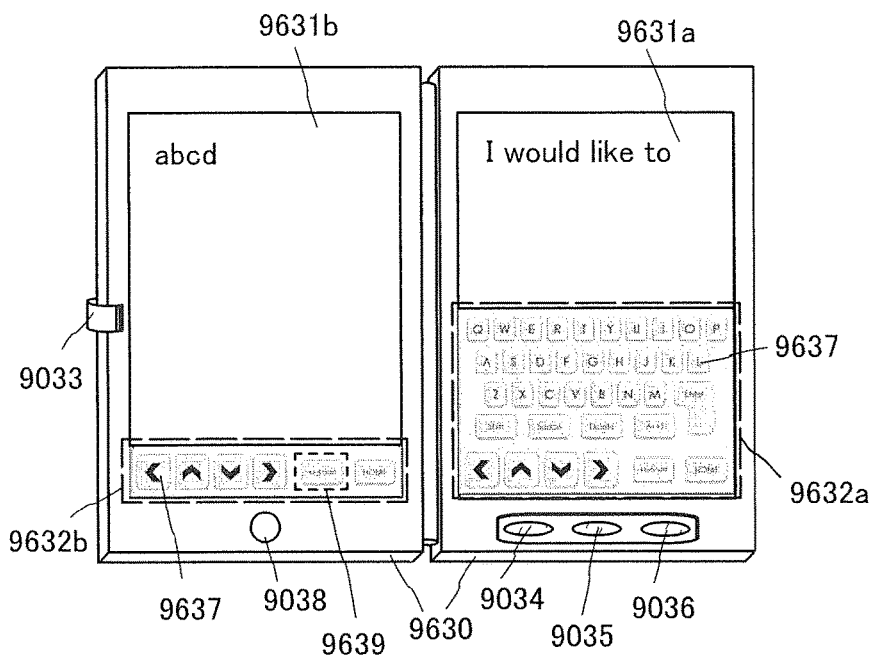
FIGS. 14A to 14C illustrate an electronic device.
Figure 14B:
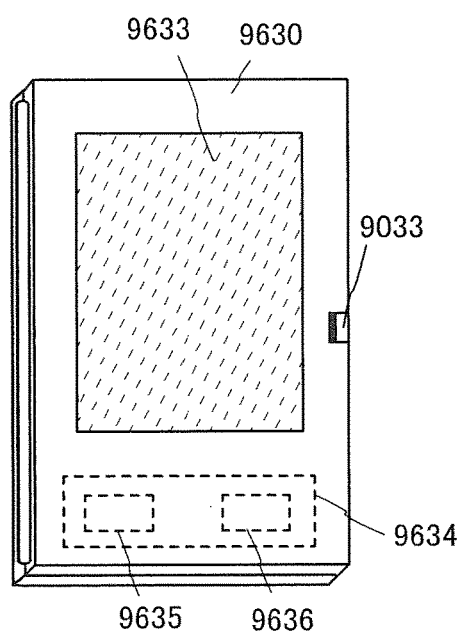

FIGS. 14A and 14B illustrate an example of a foldable tablet terminal. FIG. 14A illustrates the tablet terminal which is unfolded. The tablet terminal includes a housing 9630, a display portion 9631*a*, a display portion 9631*b*, a display mode switch 9034, a power switch 9035, a power-saving mode switch 9036, a clasp 9033, and an operation switch 9038. Note that in the tablet terminal, one or both of the display portion 9631*a* and the display portion 9631*b* is/are formed using a light-emitting device which includes the light-emitting element described in Embodiments 1 and 2.

Part of the display portion 9631*a* can be a touchscreen region 9632*a* and data can be input when a displayed operation key 9637 is touched. Although half of the display portion 9631*a* has only a display function and the other half has a touchscreen function, one embodiment of the present invention is not limited to the structure. The whole display portion 9631*a* may have a touchscreen function. For example, a keyboard is displayed on the entire region of the display portion 9631*a* so that the display portion 9631*a* is used as a touchscreen; thus, the display portion 9631*b* can be used as a display screen.

Like the display portion 9631*a*, part of the display portion 9631*b* can be a touchscreen region 9632*b*. When a switching button 9639 for showing/hiding a keyboard on the touchscreen is touched with a finger, a stylus, or the like, the keyboard can be displayed on the display portion 9631*b*.

Touch input can be performed in the touchscreen region 9632*a* and the touchscreen region 9632*b* at the same time.

The display mode switch 9034 can switch the display between portrait mode, landscape mode, and the like, and between monochrome display and color display, for example. The power-saving switch 9036 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

Although FIG. 14A illustrates an example in which the display portion 9631*a* and the display portion 9631*b* have the same display area, one embodiment of the present invention is not limited to the example. The display portion 9631*a* and the display portion 9631*b* may have different display areas and different display quality. For example, higher definition images may be displayed on one of the display portions 9631*a* and 9631*b*.

FIG. 14B illustrates the tablet terminal which is folded. The tablet terminal in this embodiment includes the housing 9630, a solar cell 9633, a charge and discharge control circuit 9634, a battery 9635, and a DC-to-DC converter 9636. As an example, FIG. 14B illustrates the charge and discharge control circuit 9634 including the battery 9635 and the DC-to-DC converter 9636.

Since the tablet terminal is foldable, the housing 9630 can be closed when the tablet terminal is not in use. As a result, the display portion 9631*a* and the display portion 9631*b* can be protected, thereby providing a tablet terminal with high endurance and high reliability for long-term use.

The tablet terminal illustrated in FIGS. 14A and 14B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 can be provided on one or both surfaces of the housing 9630, so that the battery 9635 can be charged efficiently.

Figure 14C:
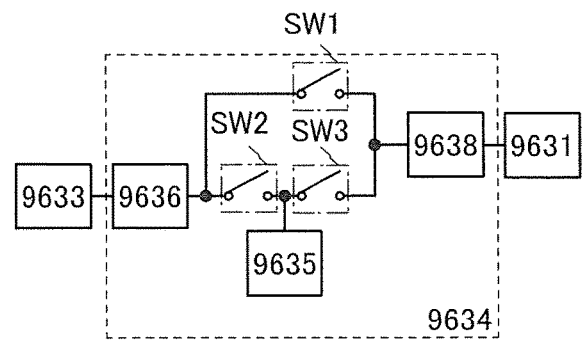

The structure and operation of the charge and discharge control circuit 9634 illustrated in FIG. 14B will be described with reference to a block diagram of FIG. 14C. FIG. 14C illustrates the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 illustrated in FIG. 14B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet terminal having the shape illustrated in FIGS. 14A to 14C as long as the display portion 9631 is included.

Example 1

In this example, a method for fabricating a light-emitting element which corresponds to one embodiment of the present invention described in Embodiment 1 and Embodiment 2 and the characteristics thereof are described. Structural formulae of organic compounds used in this example are shown below.

[Chemical formula 2]

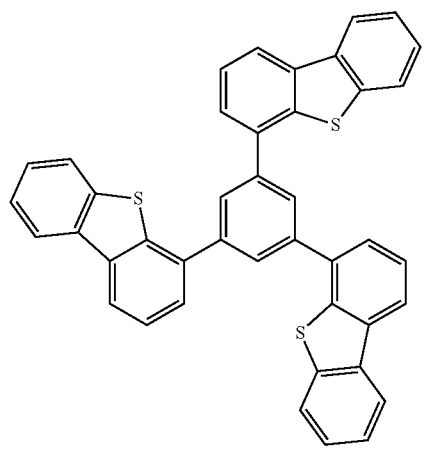

DBT3P-II  (i)

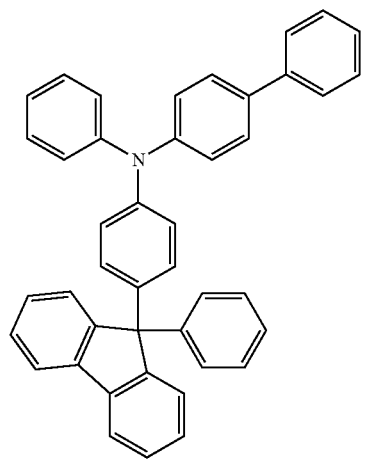

BPAFLP  (ii)

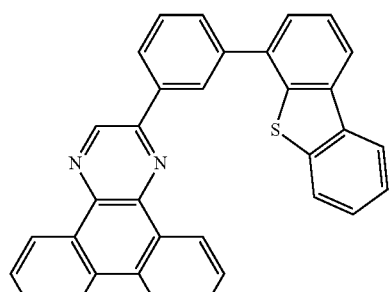

2mDBTPDBq-II  (iii)

-continued

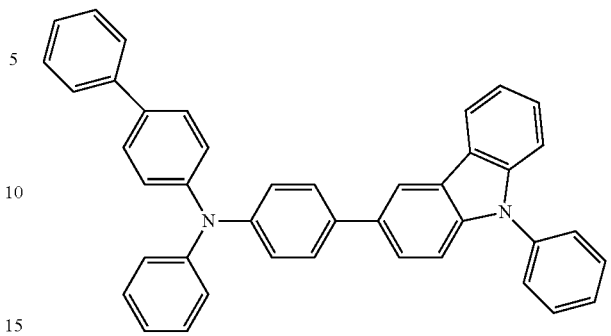

PCBA1BP  (iv)

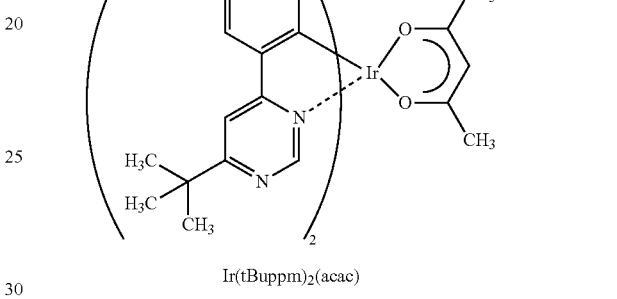

Ir(tBuppm)$_2$(acac)  (v)

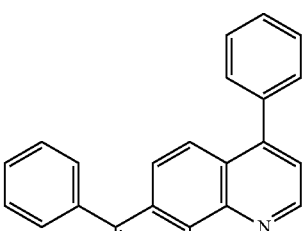

Ir(tppr)$_2$(dpm)  (vi)

BPhen  (vii)

Next, a method for fabricating the light-emitting element in this example is described below.

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 33 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Further, over the hole-transport layer 112, 2-[3-(dibenzothiophen-4-yl)phenyl]dibenzo[f,h]quinoxaline (abbreviation: 2mDBTPDBq-II) represented by Structural Formula (iii), 4-phenyl-4'-(9-phenyl-9H-carbazol-3-yl)triphenylamine (abbreviation: PCBA1BP) represented by Structural Formula (iv), and bis[2-(6-tert-butyl-4-pyrimidinyl-κN3)phenyl-κC](2,4-pentanedionato-κ²O,O')iridium(III) (abbreviation: Ir(tBuppm)$_2$(acac)) represented by Structural Formula (v) were deposited by co-evaporation to a thickness of 20 nm with a mass ratio of 2mDBTPDBq-II to PCBA1BP and Ir(tBuppm)$_2$(acac) being 0.8:0.2:0.05, so that the first light-emitting layer 113a was formed; then, 2mDBTPDBq-II and bis(2,3,5-triphenylpyrazinato)(dipivaloylmethanato)iridium(III) (abbreviation: Ir(tppr)$_2$(dpm)) represented by Structural Formula (vi) were deposited by co-evaporation to a thickness of 20 nm with a mass ratio of 2mDBTPDBq-II to Ir(tppr)$_2$(dpm) being 1:0.06, so that the second light-emitting layer 113b was formed. Note that 2mDBTPDBq-II, which is a host material, and PCBA1BP form an exciplex.

Then, the electron-transport layer 114 was formed over the light-emitting layer 113 in such a way that a 15-nm-thick film of 2mDBTPDBq-II was formed and a 15-nm-thick film of bathophenanthroline (abbreviation: BPhen) represented by Structural Formula (vii) was formed.

After the formation of the electron-transport layer 114, lithium fluoride (LiF) was deposited by evaporation to a thickness of 1 nm, so that the electron-injection layer 115 was formed.

Lastly, aluminum was deposited by evaporation to a thickness of 200 nm to form the second electrode 102 functioning as a cathode. Thus, a light-emitting element 1 in this example was fabricated.

Note that in all the above evaporation steps, evaporation was performed by a resistance-heating method.

Table 1 shows an element structure of the light-emitting element 1 obtained as described above.

TABLE 1

| Hole-injection Layer | Hole-transport Layer | Light-emitting Layer | | Electron-transport Layer | | Electron-injection Layer |
|---|---|---|---|---|---|---|
| | | First Light-emitting Layer | Second Light-emitting Layer | | | |
| DBT3P-II: MoO$_x$ 4:2 33 nm | BPAFLP 20 nm | 2mDBTPDBq-II: PCBA1BP: Ir(tBuppm)$_2$(acac) 0.8:0.2:0.05 20 nm | 2mDBTPDBq-II: Ir(tppr)$_2$(dpm) 1:0.06 20 nm | 2mDBTPDBq-II 15 nm | Bphen 15 nm | LiF 1 nm |

The light-emitting element 1 was sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing).

In the light-emitting element 1, Ir(tBuppm)$_2$(acac) and Ir(tppr)$_2$(dpm) were used as the first phosphorescent compound 113Da and the second phosphorescent compound 113Db, respectively. Here, a relation between a PL spectrum of Ir(tBuppm)$_2$(acac) and $\varepsilon(\lambda)\lambda^4$ of Ir(tppr)$_2$(dpm) is described. Note that $\lambda$ denotes a wavelength and $\varepsilon(\lambda)$ denotes a molar absorption coefficient.

Figure 20A:
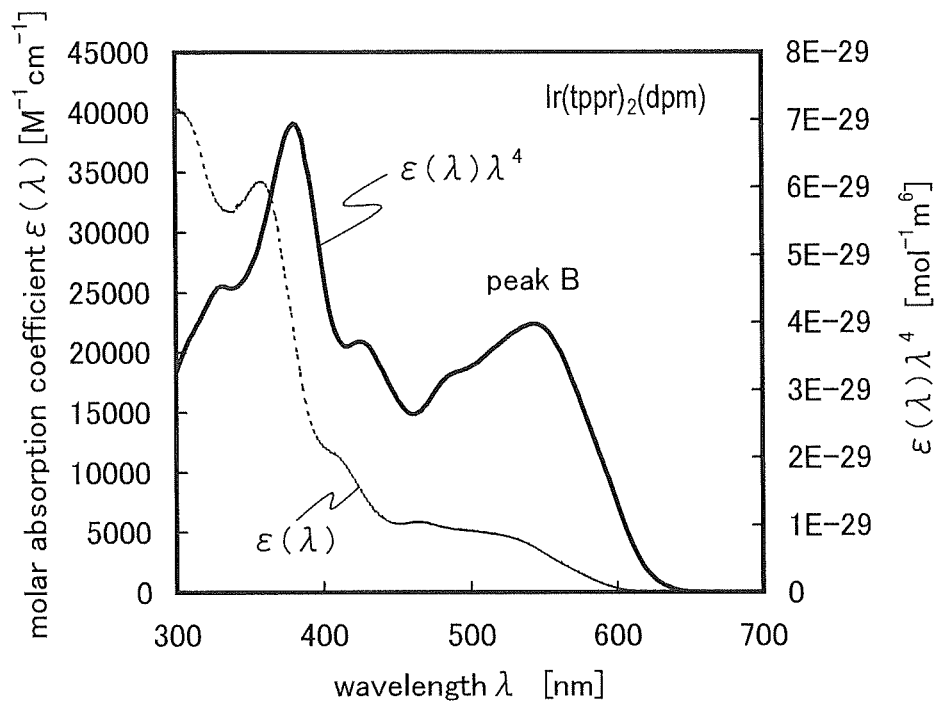
FIGS. 20A and 20B explain Förster energy transfer in a light-emitting element 1.

FIG. 20A shows graphs of the molar absorption coefficient $\varepsilon(\lambda)$ and $\varepsilon(\lambda)\lambda^4$ of Ir(tppr)$_2$(dpm). While the molar absorption coefficient $\varepsilon(\lambda)\lambda^4$ does not have a noticeable peak in a region on a longer wavelength side, the graph of $\varepsilon(\lambda)\lambda^4$ has a peak including a local maximum value at 543 nm. This peak shows triplet MLCT absorption of Ir(tppr)$_2$(dpm). When this peak has an overlap with an emission peak of the first phosphorescent compound 113Da, energy transfer efficiency can be largely increased.

Figure 20B:
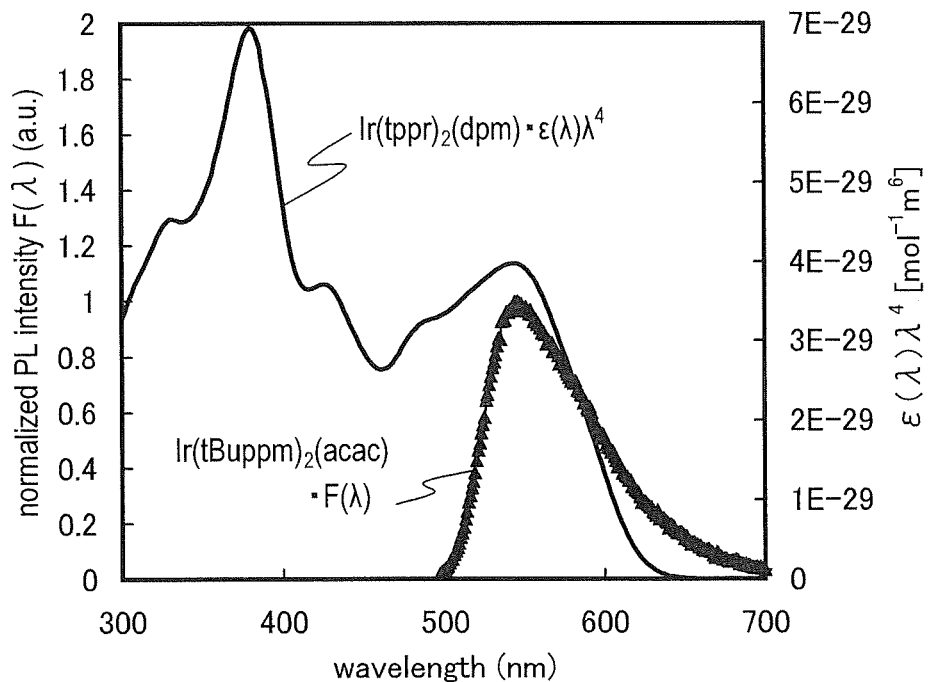

FIG. 20B shows the PL spectrum F($\lambda$) of Ir(tBuppm)$_2$(acac) which is the first phosphorescent compound 113Da and the graph of $\varepsilon(\lambda)\lambda^4$ of Ir(tppr)$_2$(dpm) which is the second phosphorescent compound 113Db. As seen from the graph, a band having a peak of the PL spectrum F($\lambda$) of Ir(tBuppm)$_2$(acac) largely overlaps with the band having the longest-wavelength-side peak of $\varepsilon(\lambda)\lambda^4$ of Ir(tppr)$_2$(dpm), which indicates that the combination enables extremely efficient energy transfer. Further, Ir(tBuppm)$_2$(acac) which is the first phosphorescent compound 113Da has an emission peak at 546 nm, and the spectrum showing $\varepsilon(\lambda)\lambda^4$ of Ir(tppr)$_2$(dpm) which is the second phosphorescent compound 113Db has a longer-wavelength-side local maximum at 543 nm, so that the difference is 3 nm. The wavelengths 546 nm and 543 nm correspond to 2.27 eV and 2.28 eV, respectively, so that the difference is 0.01 eV, which is less than 0.2 eV; thus, the positions of the peaks also suggest occurrence of efficient energy transfer.

Figure 21A:
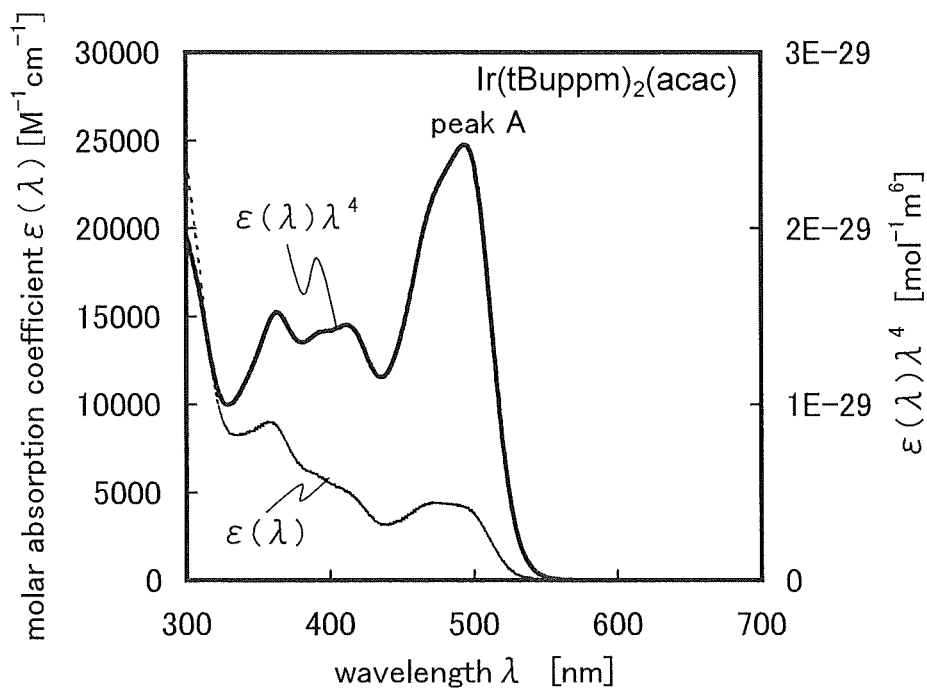
FIGS. 21A and 21B explain Förster energy transfer in a light-emitting element 1.

Next, FIG. 21A shows graphs of the molar absorption coefficient $\varepsilon(\lambda)$ and $\varepsilon(\lambda)\lambda^4$ of Ir(tBuppm)$_2$(acac) which is the first phosphorescent compound 113Da. While a peak in a region on the longer wavelength side has a lower intensity than a peak on the shorter wavelength side in the graph of the molar absorption coefficient $\varepsilon(\lambda)$, the graph of $\varepsilon(\lambda)\lambda^4$ has a peak with a high intensity at 494 nm. The peak which has this peak shows triplet MLCT absorption of Ir(tBuppm)$_2$(acac). When this peak has an overlap with an emission peak of an energy donor, energy transfer efficiency can be largely increased.

Figure 21B:
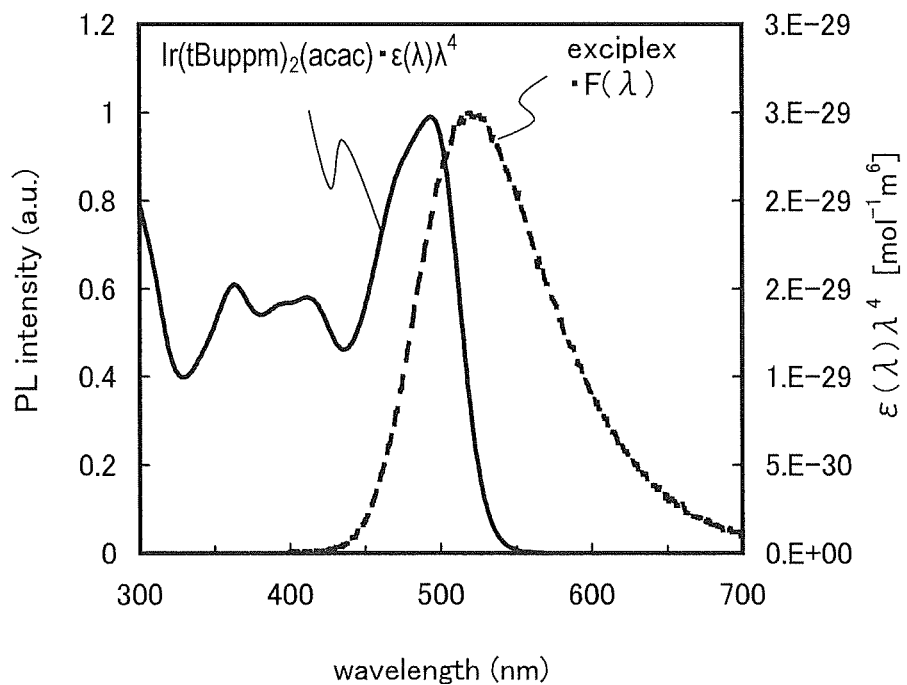
Figure 23:
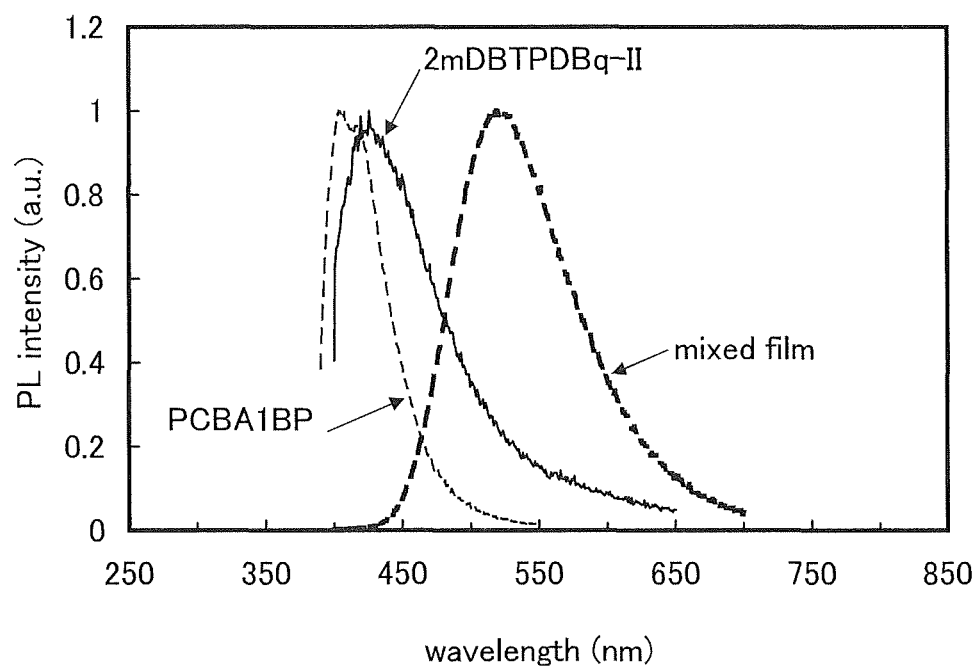
FIG. 23 shows PL spectra of 2mDBTPDBq-II, PCBA1BP, and a mixed film thereof.

Here, in the light-emitting element 1 in this example, 2mDBTPDBq-II which is the first host material and PCBA1BP which is the first organic compound form the exciplex 113Ec, and energy is transferred from the exciplex 113Ec to the first phosphorescent compound 113Da. FIG. 23 shows PL spectra of 2mDBTPDBq-II, PCBA1BP, and a mixed film thereof (a mass ratio of 2mDBTPDBq-II to PCBA1BP is 0.8:0.2), and it can be found that 2mDBTP-DBq-II and PCBA1BP which is the first organic compound formed the exciplex 113Ec. FIG. 21B shows a PL spectrum F($\lambda$) of the exciplex and the graph of $\varepsilon(\lambda)\lambda^4$ of Ir(tBuppm)$_2$(acac) which is the first phosphorescent compound 113Da. As seen from the graph, a band having a peak of the PL spectrum F($\lambda$) of the exciplex overlaps with the band having the longest-wavelength-side peak of $\varepsilon(\lambda)\lambda^4$ of Ir(tBuppm)$_2$(acac), which indicates that the combination enables efficient energy transfer. Further, the PL spectrum of the exciplex has a peak at 519 nm, and the spectrum showing $\varepsilon(\lambda)\lambda^4$ of Ir(tBuppm)$_2$(acac) which is the first phosphorescent compound 113Da has a longer-wavelength-side local maximum at 494 nm, so that the difference is 25 nm. The wavelengths 519 nm and 494 nm respectively correspond to 2.39 eV and 2.51 eV when converted into energy, so that the difference is 0.12 eV, which is less than 0.2 eV; thus, the positions of the peaks also suggest occurrence of efficient energy transfer.

Note that as can be seen from FIG. 23, the PL spectrum of 2mDBTPDBq-II which is the first host material 113Ha has a peak at 426 nm, which corresponds to 2.91 eV when converted into energy. Further, the PL spectrum of PCBA1BP which is the first organic compound 113A has a peak at 405 nm, which corresponds to 3.06 eV when converted into energy. The spectrum showing $\varepsilon(\lambda)\lambda^4$ of Ir(tBuppm)$_2$(acac) has the longer-wavelength-side peak at 494 nm, which corresponds to 2.51 eV when converted into energy. Therefore, the difference with 2mDBTPDBq-II that is the first host material 113Ha is 0.4 eV and the difference with PCBA1BP that is the first organic compound 113A is 0.55 eV, each of which exceeds 0.2 eV; thus, it can be found that energy is not readily transferred from 2mDBTPDBq-II or PCBA1BP to Ir(tBuppm)$_2$(acac).

Figure 22:
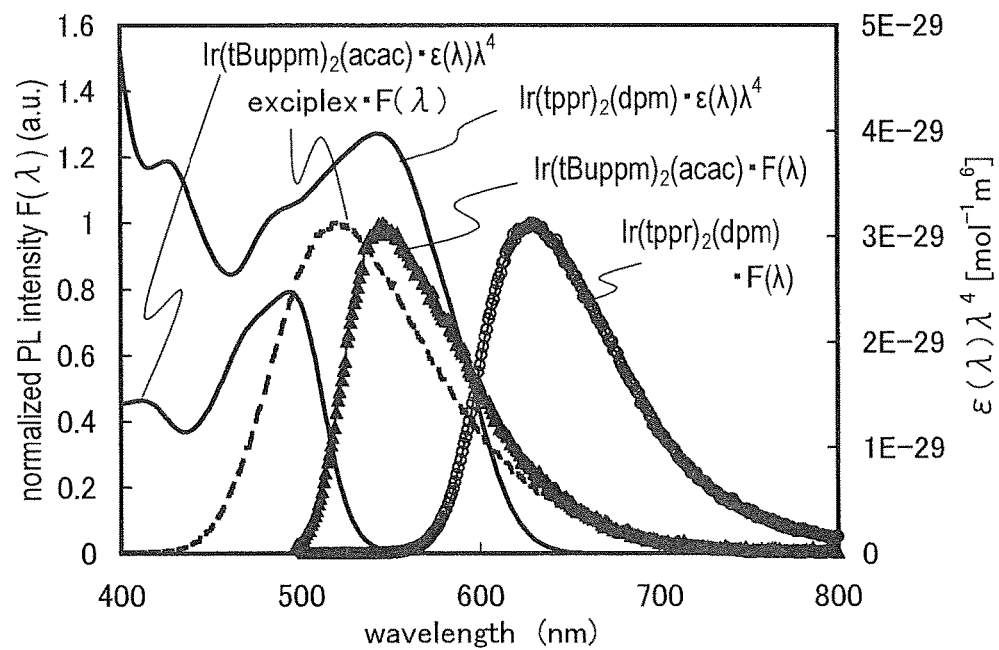
FIG. 22 explains Förster energy transfer in a light-emitting element 1.

FIG. 22 shows the PL spectrum F($\lambda$) of the exciplex, the PL spectrum F($\lambda$) of Ir(tBuppm)$_2$(acac), a PL spectrum F($\lambda$) of Ir(tppr)$_2$(dpm), $\varepsilon(\lambda)\lambda^4$ of Ir(tBuppm)$_2$(acac), and $\varepsilon(\lambda)\lambda^4$ of Ir(tppr)$_2$(dpm). It can be found that energy can be transferred stepwise first from the exciplex to Ir(tBuppm)$_2$(acac) by utilizing the overlap between the PL spectrum of the exciplex and $\varepsilon(\lambda)\lambda^4$ of Ir(tBuppm)$_2$(acac) (around a peak A), and then from Ir(tBuppm)$_2$(acac) to Ir(tppr)$_2$(dpm) by utilizing the overlap between the PL spectrum of Ir(tBuppm)$_2$(acac) and $\varepsilon(\lambda)\lambda^4$ of Ir(tppr)$_2$(dpm) (around a peak B). Note that direct energy transfer from the exciplex to Ir(tppr)$_2$(dpm) which is the second phosphorescent compound is also possible. The reason for this is that, as can be seen from FIG. 22, $\varepsilon(\lambda)\lambda^4$ of Ir(tppr)$_2$(dpm) also overlaps with the PL spectrum F($\lambda$) of the exciplex on a shorter wavelength side of the triplet MLCT absorption band (around the peak B) of Ir(tppr)$_2$(dpm).

Element characteristics of the light-emitting element were measured. Note that the measurement was carried out at room temperature (in an atmosphere kept at 25° C.).

Figure 15:
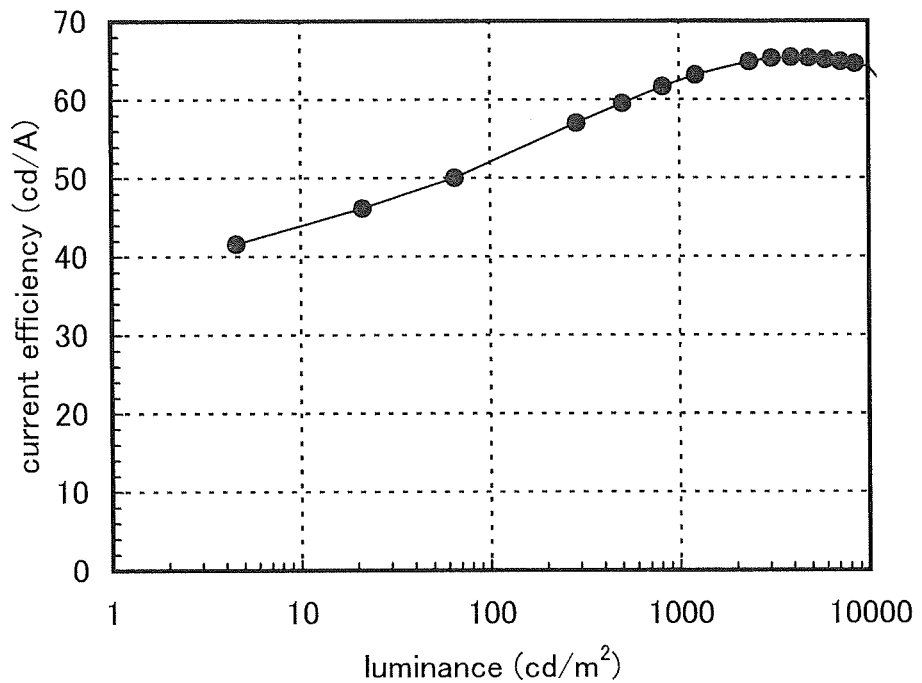
FIG. 15 shows luminance-current efficiency characteristics of a light-emitting element 1.
Figure 16:
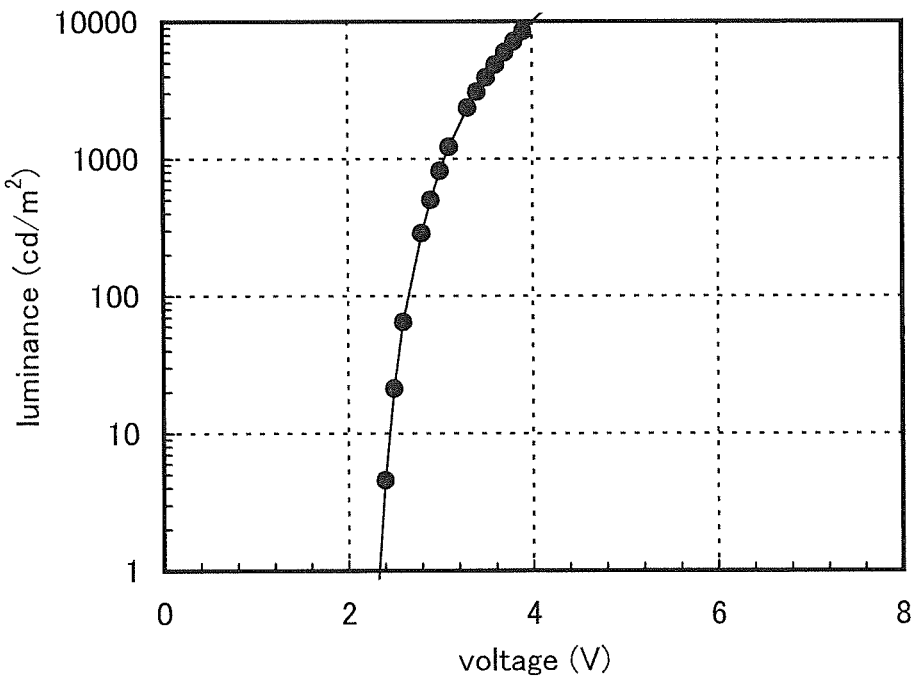
FIG. 16 shows voltage-luminance characteristics of a light-emitting element 1.
Figure 17:
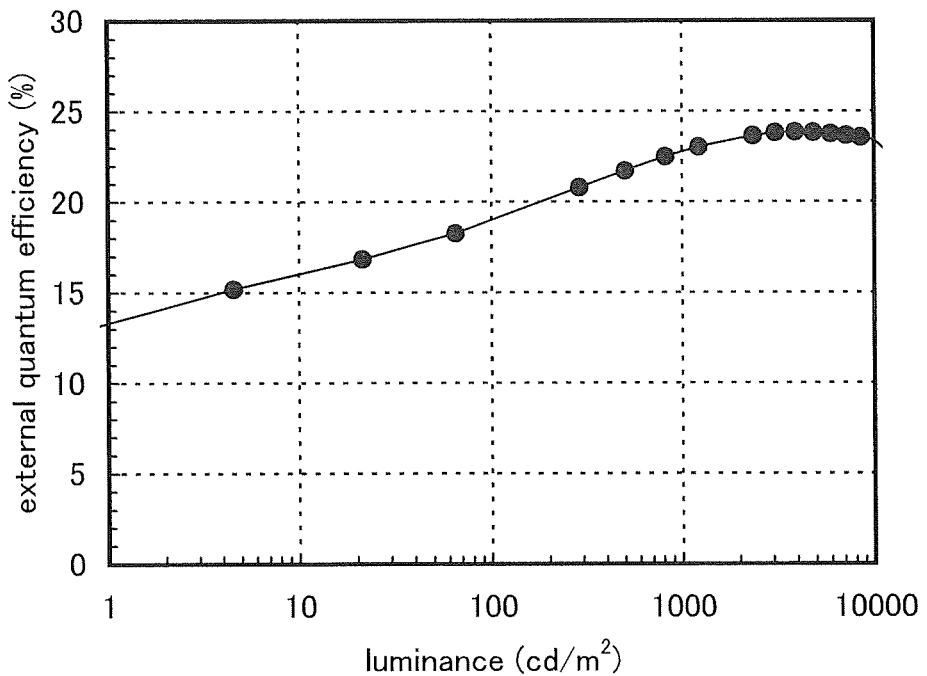
FIG. 17 shows luminance-external quantum efficiency characteristics of a light-emitting element 1.
Figure 18:
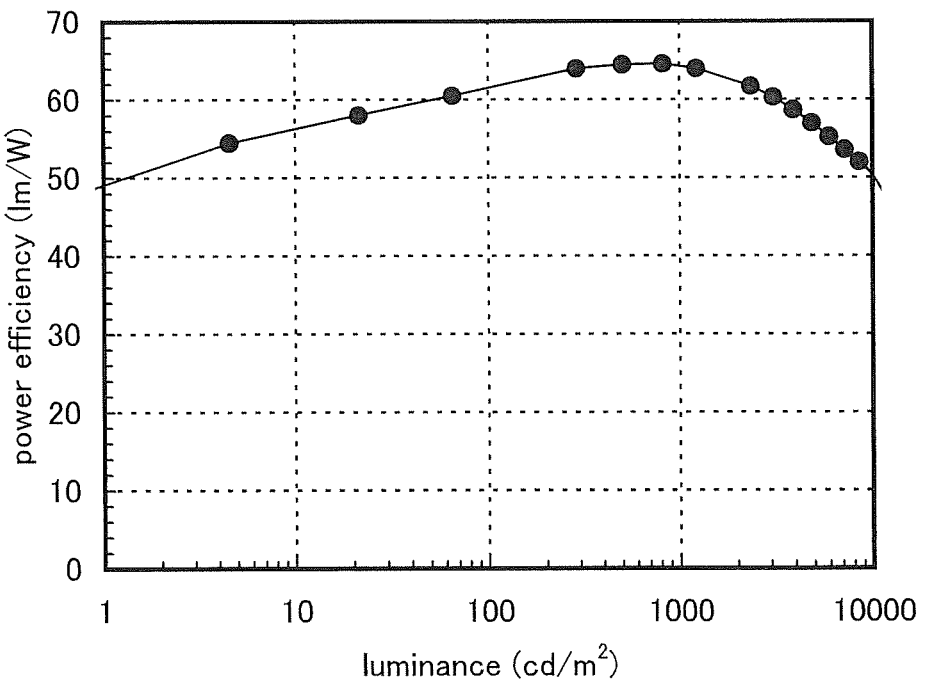
FIG. 18 shows luminance-power efficiency characteristics of a light-emitting element 1.

FIG. 15 shows luminance-current efficiency characteristics of the light-emitting element 1. In FIG. 15, the horizontal axis indicates luminance (cd/m$^2$), and the vertical axis indicates current efficiency (cd/A). FIG. 16 shows voltage-luminance characteristics thereof. In FIG. 16, the horizontal axis indicates voltage (V) and the vertical axis indicates luminance (cd/m$^2$). FIG. 17 shows luminance-external quantum efficiency characteristics thereof. In FIG. 17, the horizontal axis indicates luminance (cd/m$^2$) and the vertical axis indicates external quantum efficiency (%). FIG. 18 shows luminance-power efficiency characteristics thereof. In FIG. 18, the horizontal axis indicates luminance (cd/m$^2$) and the vertical axis indicates power efficiency (lm/w).

From the above, the light-emitting element 1 turned out to have excellent element characteristics. In particular, as can be seen from FIG. 15, FIG. 17, and FIG. 18, the light-emitting element has extremely high emission efficiency and had a high external quantum efficiency not less than 20% at around a practical luminance (1000 cd/m$^2$). In addition, the current efficiency was around 60 cd/A and the power efficiency was around 60 lm/W, which are excellent values.

Figure 19:
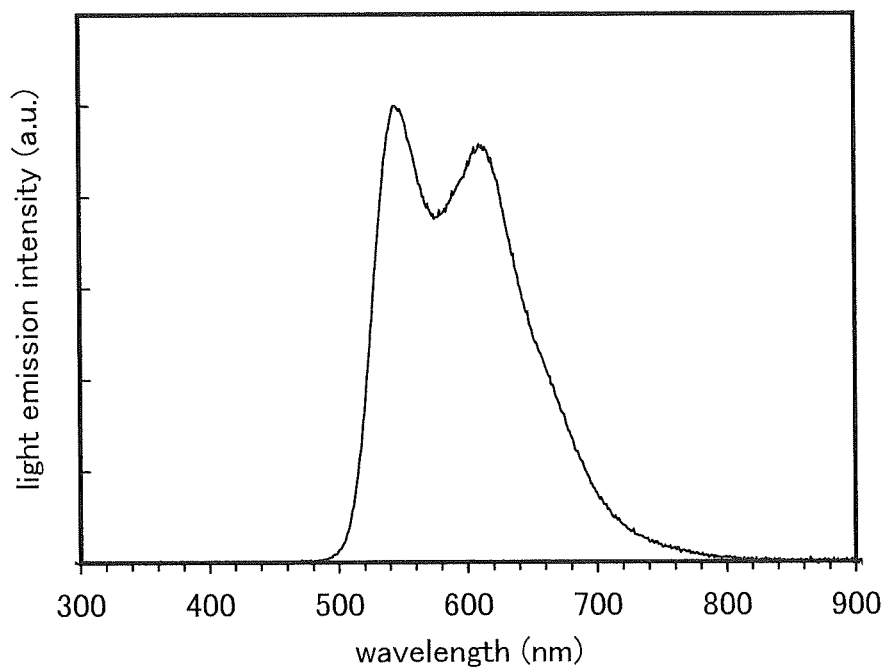
FIG. 19 shows an emission spectrum of a light-emitting element 1.

FIG. 19 shows an emission spectrum of the light-emitting element 1 which was obtained when a current of 0.1 mA was made to flow in the light-emitting element 1. In FIG. 19, the horizontal axis indicates a wavelength (nm) and the vertical axis indicates light emission intensity (arbitrary unit). FIG. 19 indicates that the light-emitting element 1 shows an emission spectrum including light with a wavelength in a green wavelength range which originates from bis[2-(6-tert-butyl-4-pyrimidinyl-κN3)phenyl-κC](2,4-pentanedionato-κ$^2$O,O')iridium(I II) (abbreviation: Ir(tBuppm)$_2$(acac)) and light with a wavelength in a red wavelength range which originates from bis(2,3,5-triphenylpyrazinato)(dipivaloylmethanato)iridium(III) (abbreviation: Ir(tppr)$_2$(dpm)) in a good balance.

From the above, it was shown that the light-emitting element 1 corresponding to one embodiment of the present invention has high emission efficiency and provides lights from two kinds of emission center substances in a good balance.

Example 2

In this example, a method for fabricating a light-emitting element which corresponds to one embodiment of the present invention described in Embodiment 1 and Embodiment 2 and the characteristics thereof are described. Structural formulae of organic compounds used in this example are shown below.

[Chemical formula 3]
(viii)
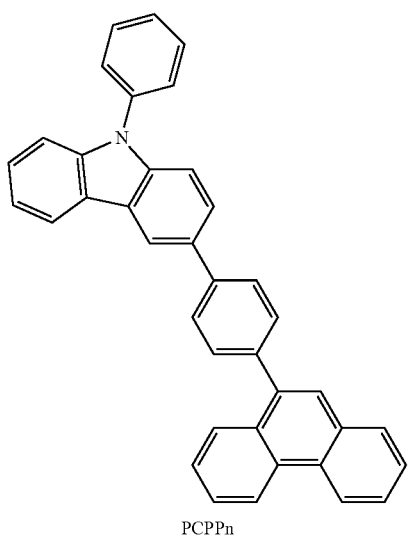
PCPPn
(ii)
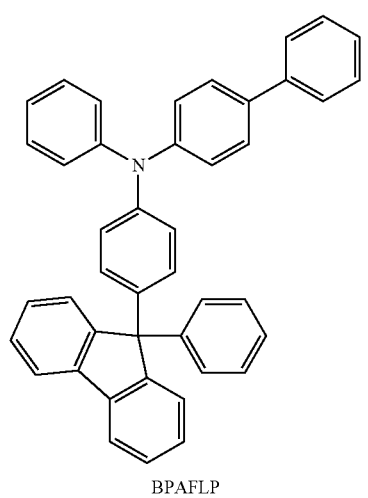
BPAFLP
(ix)
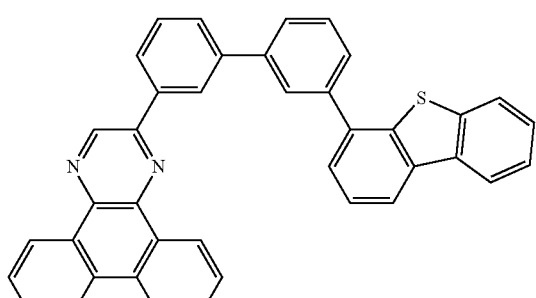
2mDBTPDBq-II
(x)
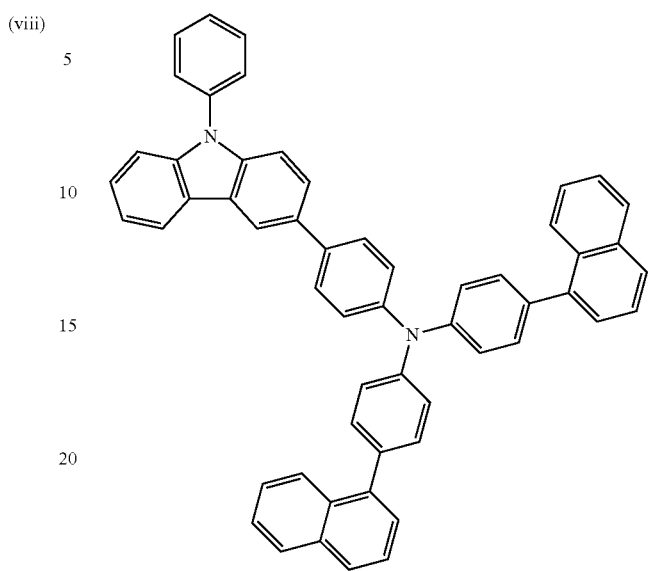
PCBNBB
(v)
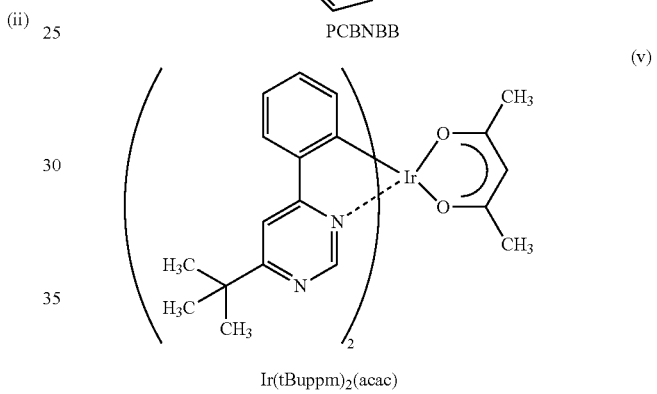
Ir(tBuppm)$_2$(acac)
(vii)
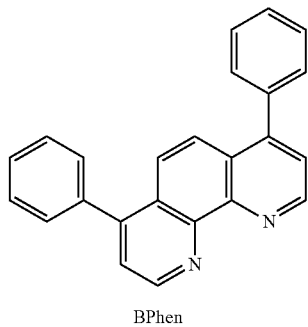
BPhen -continued

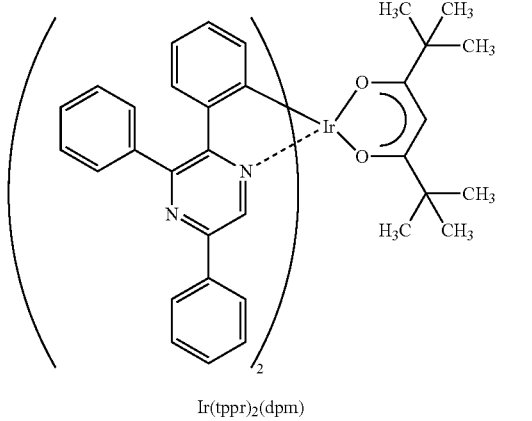

Ir(tppr)$_2$(dpm)    (vi)

Next, a method for fabricating the light-emitting element in this example is described below.

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 3-[4-(9-phenanthryl)-phenyl]-9-phenyl-9H-carbazole (abbreviation: PCPPn) represented by Structural Formula (viii) and molybdenum(VI) oxide were deposited by co-evaporation by an evaporation method using resistance heating, so that the hole-injection layer 111 was formed. The thickness of the hole-injection layer 111 was set to 33.3 nm, and the weight ratio of PCPPn to molybdenum oxide was adjusted to 1:0.5. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Further, over the hole-transport layer 112, 2-[3'-(dibenzothiophen-4-yl)biphenyl-3-yl]dibenzo[f,h]quinoxaline (abbreviation: 2mDBTBPDBq-II) represented by Structural Formula (ix), 4,4'-di(1-naphthyl)-4"-(9-phenyl-9H-carbazol-3-yl)triphenylamine (abbreviation: PCBNBB) represented by Structural Formula (x), and bis[2-(6-tert-butyl-4-pyrimidinyl-κN3)phenyl-κC](2,4-pentanedionato-κ$^2$O,O') iridium(I II) (abbreviation: Ir(tBuppm)$_2$(acac)) represented by Structural Formula (v) were deposited by co-evaporation to a thickness of 20 nm with a mass ratio of 2mDBTBPDBq-II to PCBNBB and Ir(tBuppm)$_2$(acac) being 0.8:0.2:0.06, so that the first light-emitting layer 113a was formed; then, 2mDBTBPDBq-II and bis(2,3,5-triphenylpyrazinato)(dipivaloylmethanato)iridium(III) (abbreviation: Ir(tppr)$_2$(dpm)) represented by Structural Formula (vi) were deposited by co-evaporation to a thickness of 20 nm with a mass ratio of 2mDBTBPDBq-II to Ir(tppr)$_2$(dpm) being 1:0.06, so that the second light-emitting layer 113b was formed. Note that 2mDBTBPDBq-II, which is a host material, and PCBNBB form an exciplex.

Then, the electron-transport layer 114 was formed over the light-emitting layer 113 in such a way that a 15-nm-thick film of 2mDBTBPDBq-II was formed and a 15-nm-thick film of bathophenanthroline (abbreviation: BPhen) represented by Structural Formula (vii) was formed.

After the formation of the electron-transport layer 114, lithium fluoride (LiF) was deposited by evaporation to a thickness of 1 nm, so that the electron-injection layer 115 was formed.

Lastly, aluminum was deposited by evaporation to a thickness of 200 nm to form the second electrode 102 functioning as a cathode. Thus, a light-emitting element 2 in this example was fabricated.

Note that in all the above evaporation steps, evaporation was performed by a resistance-heating method.

Table 2 shows an element structure of the light-emitting element 2 obtained as described above.

TABLE 2

| Hole-injection Layer | Hole-transport Layer | Light-emitting Layer | | Electron-transport Layer | Electron-injection Layer |
| --- | --- | --- | --- | --- | --- |
| | | First Light-emitting Layer | Second Light-emitting Layer | | |
| PCPPn: MoO$_x$ 4:2 33 nm | BPAFLP 20 nm | 2mDBTBPDBq-II: PCBNBB: Ir(tBuppm)$_2$(acac) 0.8:0.2:0.06 20 nm | 2mDBTBPDBq-II: Ir(tppr)$_2$(dpm) 1:0.06 20 nm | 2mDBTBPDBq-II 15 nm  Bphen 15 nm | LiF 1 nm |

The light-emitting element 2 was sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing).

In the light-emitting element 2, as in the light-emitting element 1, Ir(tBuppm)$_2$(acac) and Ir(tppr)$_2$(dpm) were used as the first phosphorescent compound 113Da and the second phosphorescent compound 113Db, respectively. Thus, the relation between the PL spectrum of Ir(tBuppm)$_2$(acac) and $\varepsilon(\lambda)\lambda^4$ of Ir(tppr)$_2$(dpm) is the same as in the case of the light-emitting element 1, and the description thereof is not repeated. The description made with reference to FIGS. 20A and 20B in Example 1 is to be referred to. Accordingly, it is suggested that energy transfer efficiently occurs between the first phosphorescent compound 113Da and the second phosphorescent compound 113Db in the light-emitting element 2.

Element characteristics of the light-emitting element were measured. Note that the measurement was carried out at room temperature (in an atmosphere kept at 25° C.).

Figure 24:
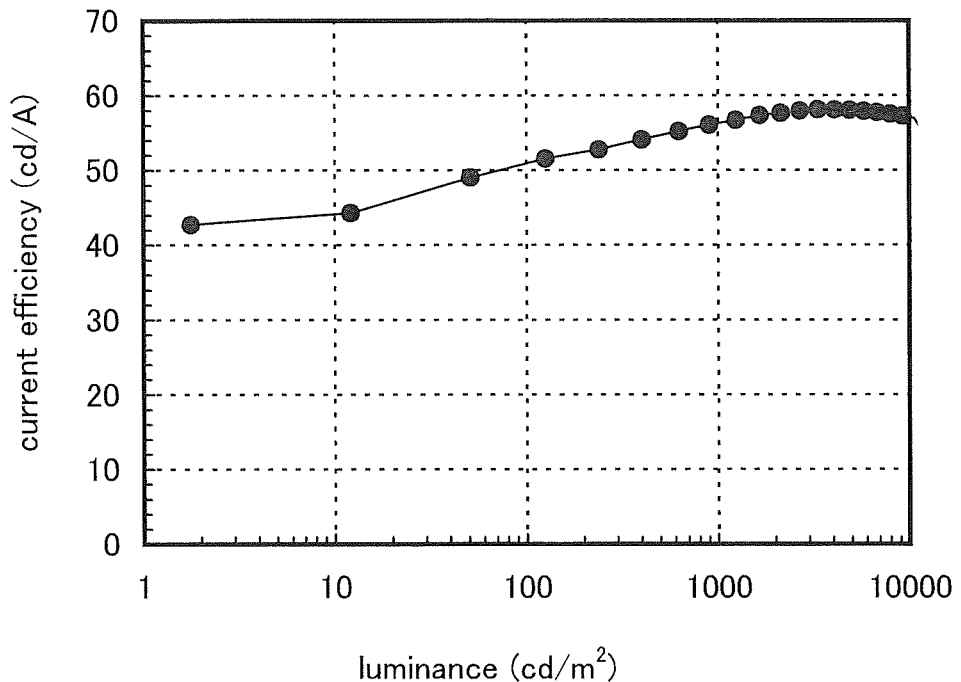
FIG. 24 shows luminance-current efficiency characteristics of a light-emitting element 2.
Figure 25:
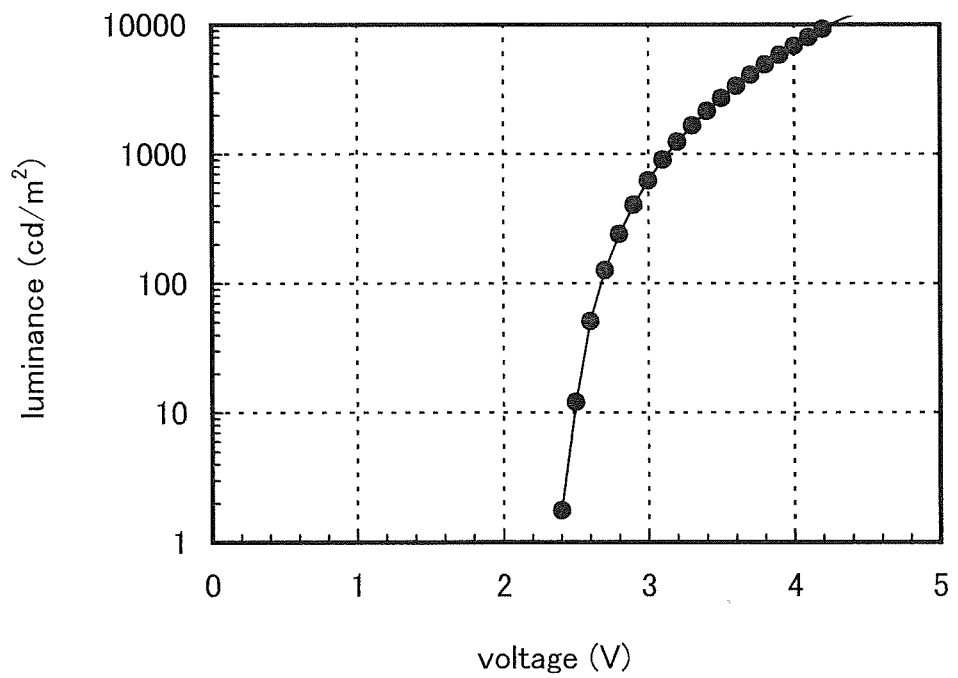
FIG. 25 shows voltage-luminance characteristics of a light-emitting element 2.
Figure 26:
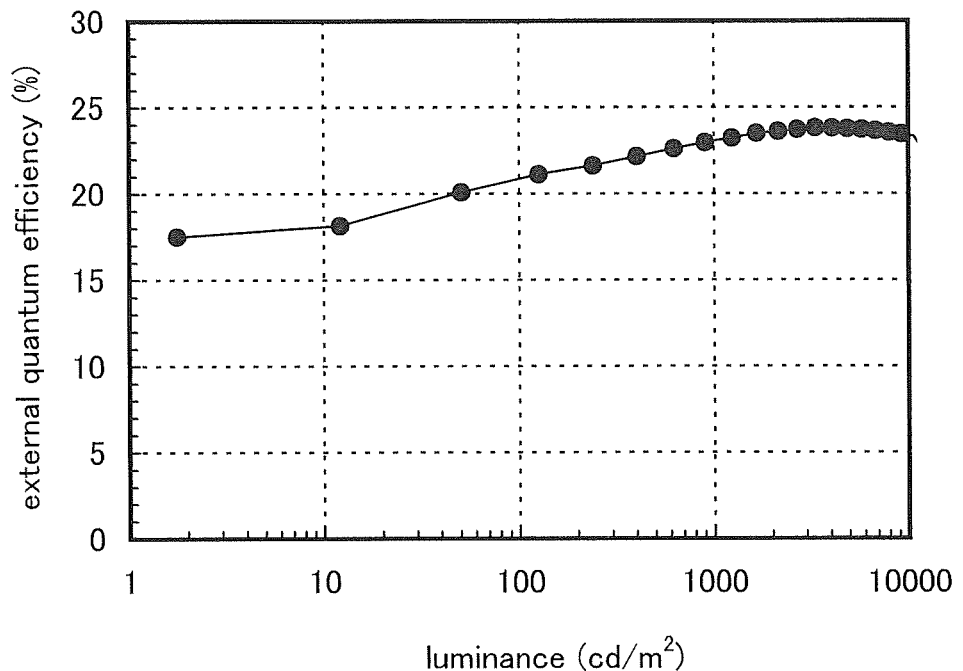
FIG. 26 shows luminance-external quantum efficiency characteristics of a light-emitting element 2.
Figure 27:
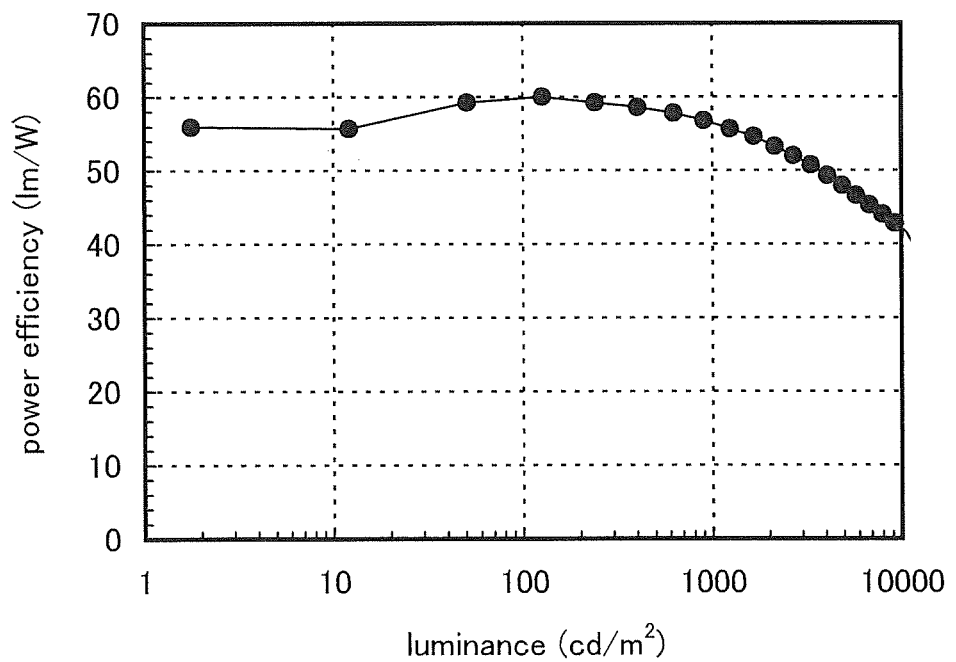
FIG. 27 shows luminance-power efficiency characteristics of a light-emitting element 2.

FIG. 24 shows luminance-current efficiency characteristics of the light-emitting element 2. FIG. 25 shows voltage-luminance characteristics thereof. FIG. 26 shows luminance-external quantum efficiency characteristics thereof. FIG. 27 shows luminance-power efficiency characteristics thereof.

From the above, the light-emitting element 2 turned out to have excellent element characteristics. In particular, as can be seen from FIG. 24, FIG. 26, and FIG. 27, the light-emitting element has extremely high emission efficiency and had a high external quantum efficiency not less than 20% at around a practical luminance (1000 cd/m$^2$). In addition, the current efficiency was around 60 cd/A and the power efficiency was around 60 lm/W, which are excellent values.

Figure 28:
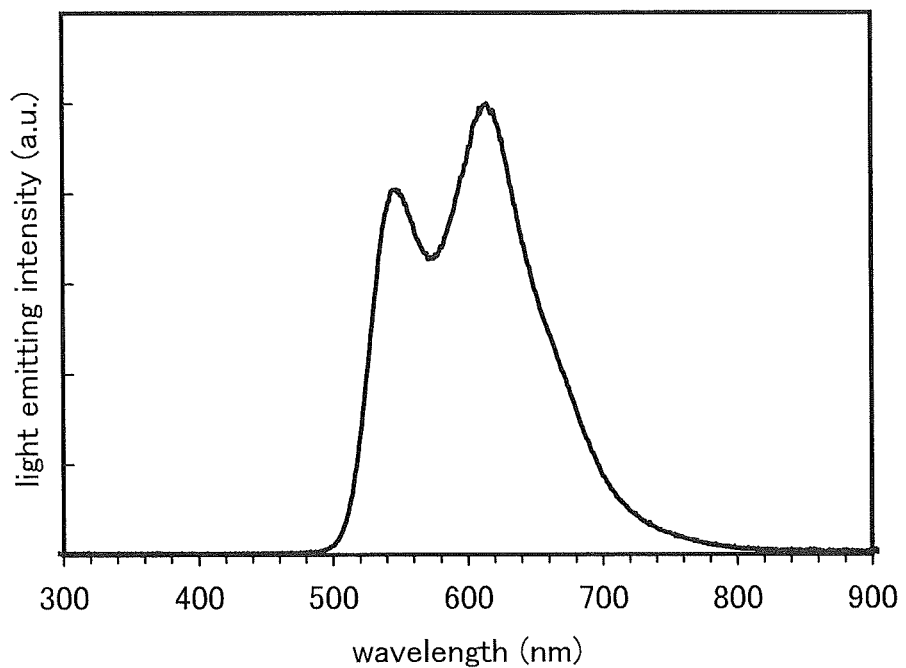
FIG. 28 shows an emission spectrum of a light-emitting element 2.

FIG. 28 shows an emission spectrum of the light-emitting element 2 which was obtained when a current of 0.1 mA was made to flow in the light-emitting element 2. FIG. 28 indicates that the light-emitting element 2 shows an emission spectrum including light with a wavelength in a green wavelength range which originates from bis[2-(6-tert-butyl-4-pyrimidinyl-κN3)phenyl-κC](2,4-pentanedionato-κ$^2$O, O')iridium(I II) (abbreviation: Ir(tBuppm)$_2$(acac)) and light with a wavelength in a red wavelength range which originates from bis(2,3,5-triphenylpyrazinato)(dipivaloylmethanato)iridium(III) (abbreviation: Ir(tppr)$_2$(dpm)) in a good balance.

Figure 29:
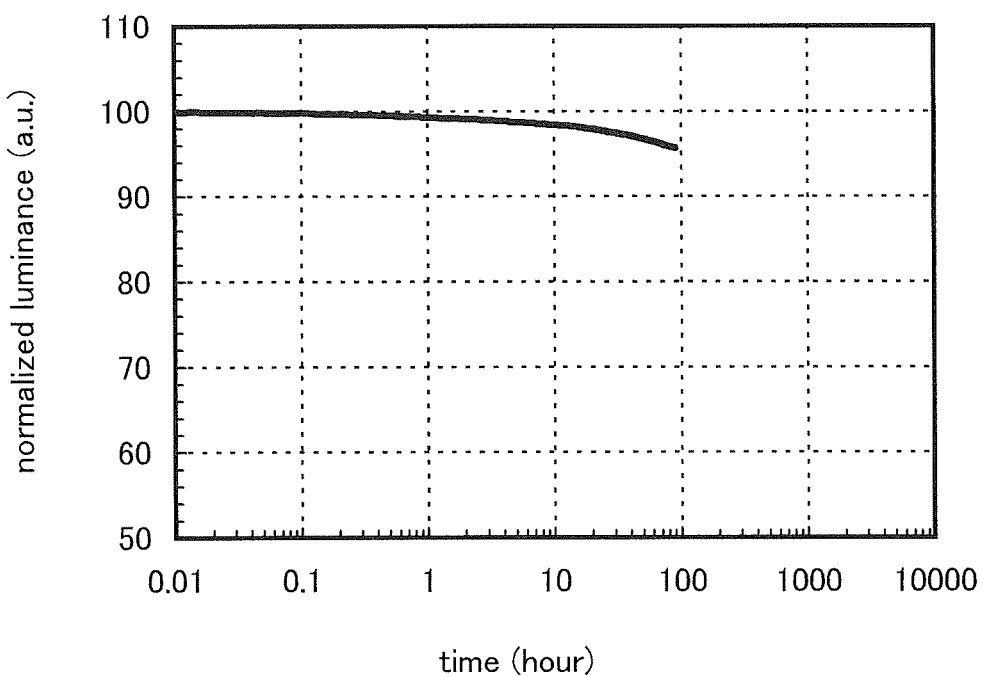
FIG. 29 shows a result of a reliability test of a light-emitting element 2.

Further, FIG. 29 shows the results of a reliability test under conditions where the initial luminance of 5000 cd/m$^2$ was taken as 100%, and the current density was constant. As seen in FIG. 29, despite the reliability test with the initial luminance of 5000 cd/m$^2$, the light-emitting element 2 kept 96% of the initial luminance after 70 hours elapsed; thus, it was revealed that the light-emitting element has high reliability.

From the above, it was shown that the light-emitting element 2 corresponding to one embodiment of the present invention has high emission efficiency and provides lights from two kinds of emission center substances in a good balance. It was also shown that the light-emitting element has high reliability and a long lifetime.

Example 3

In this example, a method for fabricating a light-emitting element which corresponds to one embodiment of the present invention described in Embodiment 1 and Embodiment 2 and the characteristics thereof are described. Structural formulae of organic compounds used in this example are shown below.

[Chemical formula 4]

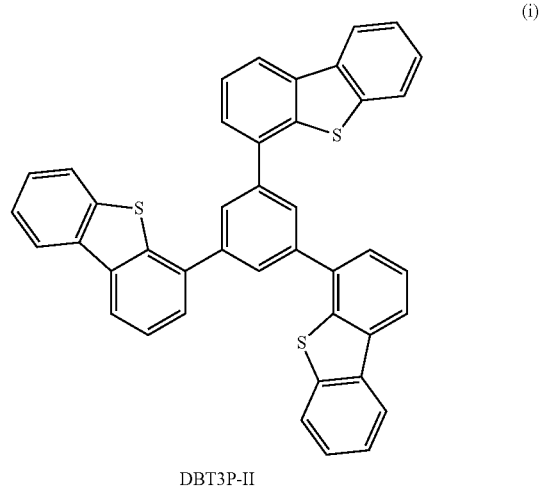

(i)

DBT3P-II

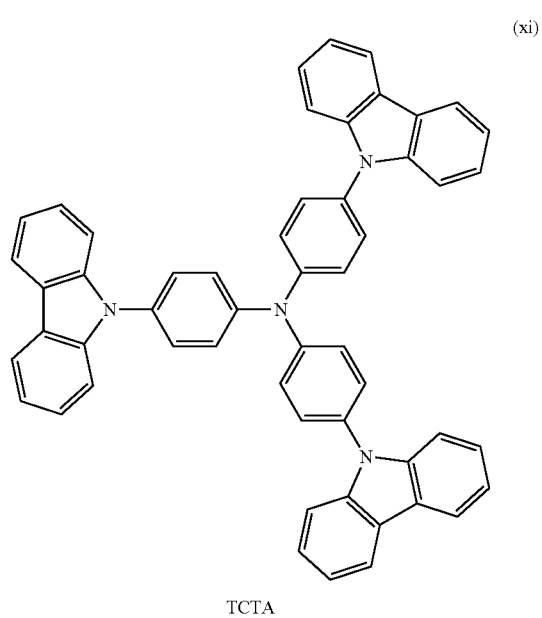

(xi)

TCTA

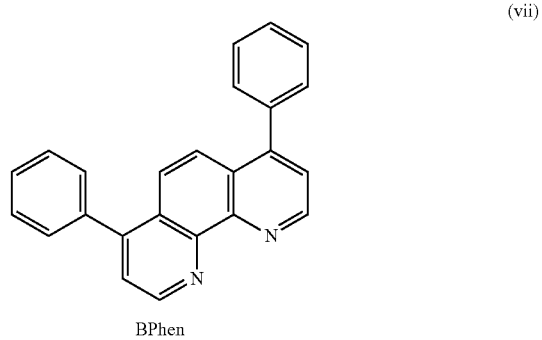

(vii)

BPhen

-continued

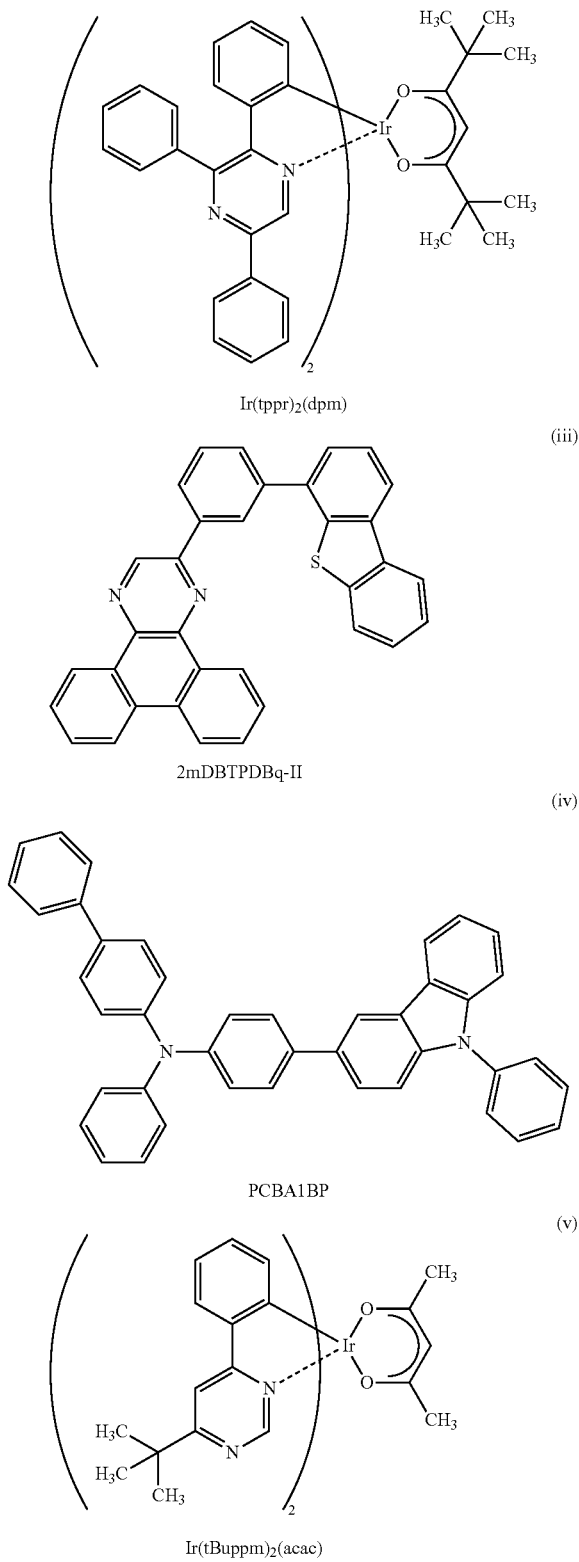

Ir(tppr)₂(dpm)

2mDBTPDBq-II

PCBA1BP

Ir(tBuppm)₂(acac)

Next, a method for fabricating the light-emitting element in this example is described below.

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 40 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4,4',4''-tri(N-carbazolyl)triphenylamine (abbreviation: TCTA) which is represented by Structural Formula (xi) was formed to a thickness of 10 nm over the hole-injection layer 111 to form the hole-transport layer 112.

Further, over the hole-transport layer 112, TCTA and bis(2,3,5-triphenylpyrazinato)(dipivaloylmethanato)iridium (III) (abbreviation: Ir(tppr)₂(dpm)) represented by Structural Formula (vi) were deposited by co-evaporation to a thickness of 10 nm with a mass ratio of TCTA to Ir(tppr)₂(dpm) being 1:0.1, so that the second light-emitting layer 113b was formed; then, 2-[3-(dibenzothiophen-4-yl)phenyl]dibenzo[f,h]quinoxaline (abbreviation: 2mDBTPDBq-II) represented by Structural Formula (iii), 4-phenyl-4'-(9-phenyl-9H-carbazol-3-yl)triphenylamine (abbreviation: PCBA1BP) represented by Structural Formula (iv), and bis[2-(6-tert-butyl-4-pyrimidinyl-κN3)phenyl-κC](2,4-pentanedionato-κ²O,O') iridium(I II) (abbreviation: Ir(tBuppm)₂(acac)) represented by Structural Formula (v) were deposited by co-evaporation to a thickness of 5 nm with a mass ratio of 2mDBTPDBq-II to PCBA1BP and Ir(tBuppm)₂(acac) being 0.8:0.2:0.05, so that the first light-emitting layer 113a was formed. Note that 2mDBTPDBq-II, which is a host material, and PCBA1BP form an exciplex.

Then, the electron-transport layer 114 was formed over the light-emitting layer 113 in such a way that 2mDBTP-DBq-II and Ir(tBuppm)₂(acac) were deposited by co-evaporation to a thickness of 20 nm with a mass ratio of 2mDBT-PDBq-II to Ir(tBuppm)₂(acac) being 1:0.05, a film of 2mDBTPDBq-II was formed to a thickness of 10 nm, and a film of bathophenanthroline (abbreviation: BPhen) represented by Structural Formula (vii) was then formed to a thickness of 20 nm.

After the formation of the electron-transport layer 114, lithium fluoride (LiF) was deposited by evaporation to a thickness of 1 nm, so that the electron-injection layer 115 was formed.

Lastly, aluminum was deposited by evaporation to a thickness of 200 nm to form the second electrode 102 functioning as a cathode. Thus, a light-emitting element 3 in this example was fabricated.

Note that in all the above evaporation steps, evaporation was performed by a resistance-heating method.

Table 3 shows an element structure of the light-emitting element 3 obtained as described above. The materials in the hole-transport layer and the second host material of the light-emitting element 3 are very different from those of the light-emitting element 1 and the light-emitting element 2. In addition, there are also big differences in the positions of the first and second light-emitting layers with respect to the electrode and the structure of the electron-transport layer.

current efficiency was around 60 cd/A and the power efficiency was around 70 lm/W, which are excellent values.

Figure 34:
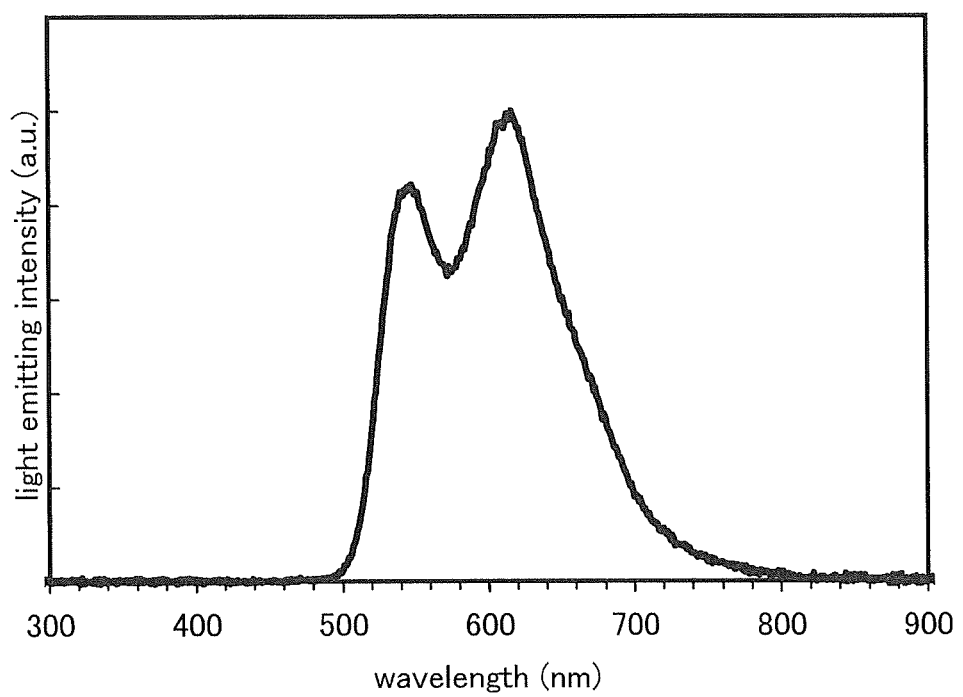
FIG. 34 shows an emission spectrum of a light-emitting element 3.

FIG. 34 shows an emission spectrum of the light-emitting element 3 which was obtained when a current of 0.1 mA was made to flow in the light-emitting element 3. FIG. 34 indicates that the light-emitting element 3 shows an emission spectrum including light with a wavelength in a green wavelength range which originates from bis[2-(6-tert-butyl-4-pyrimidinyl-κN3)phenyl-κC](2,4-pentanedionato-κ$^2$O, O')iridium(III) (abbreviation: Ir(tBuppm)$_2$(acac)) and light with a wavelength in a red wavelength range which originates from bis(2,3,5-triphenylpyrazinato)(dipivaloylmethanato)iridium(III) (abbreviation: Ir(tppr)$_2$(dpm)) in a good balance.

From the above, it was shown that the light-emitting element 3 corresponding to one embodiment of the present invention has high emission efficiency and provides lights from two kinds of emission center substances in a good

TABLE 3

| Hole-injection Layer | Hole-transport Layer | Light-emitting Layer | | Electron-transport Layer | Electron-injection Layer |
| --- | --- | --- | --- | --- | --- |
| | | Second Light-emitting Layer | First Light-emitting Layer | | |
| DBT3P-II: MoO$_x$ 4:2 40 nm | TCTA 10 nm | TCTA: Ir(tppr)$_2$(dpm) 1:0.1 10 nm | 2mDBTPDBq-II: PCBA1BP: Ir(tBuppm)$_2$(acac) 0.8:0.2:0.05 5 nm | 2mDBTPDBq-II: Ir(tBuppm)$_2$(acac) 0.8:0.05 20 nm | 2mDBTPDBq-II 10 nm  Bphen 20 nm | LiF 1 nm |

The light-emitting element 3 was sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing).

In the light-emitting element 3, as in the light-emitting element 1, Ir(tBuppm)$_2$(acac) and Ir(tppr)$_2$(dpm) were used as the first phosphorescent compound 113Da and the second phosphorescent compound 113Db, respectively. Thus, the relation between the PL spectrum of Ir(tBuppm)$_2$(acac) and ε(λ)λ$^4$ of Ir(tppr)$_2$(dpm) is the same as in the case of the light-emitting element 1, and the description thereof is not repeated. The description made with reference to FIGS. 20A and 20B in Example 1 is to be referred to. Accordingly, it is suggested that energy transfer efficiently occurs between the first phosphorescent compound 113Da and the second phosphorescent compound 113Db in the light-emitting element 3.

Element characteristics of the light-emitting element were measured. Note that the measurement was carried out at room temperature (in an atmosphere kept at 25° C.).

Figure 30:
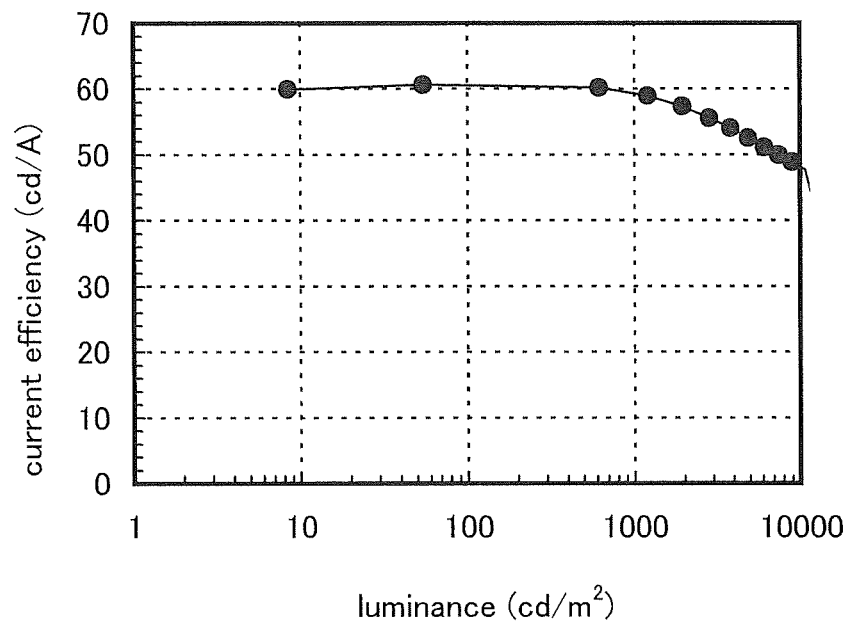
FIG. 30 shows luminance-current efficiency characteristics of a light-emitting element 3.
Figure 31:
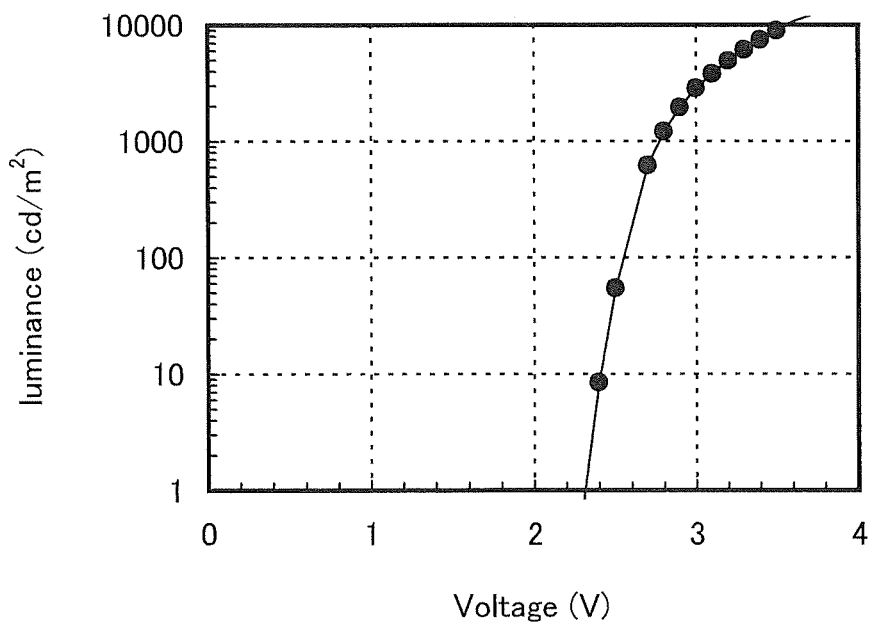
FIG. 31 shows voltage-luminance characteristics of a light-emitting element 3.
Figure 32:
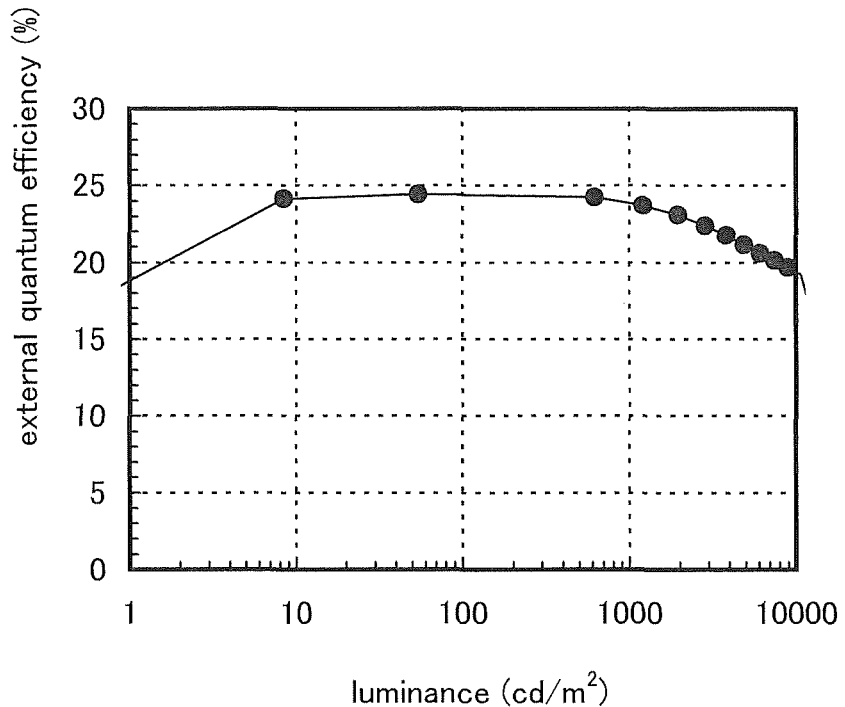
FIG. 32 shows luminance-external quantum efficiency characteristics of a light-emitting element 3.
Figure 33:
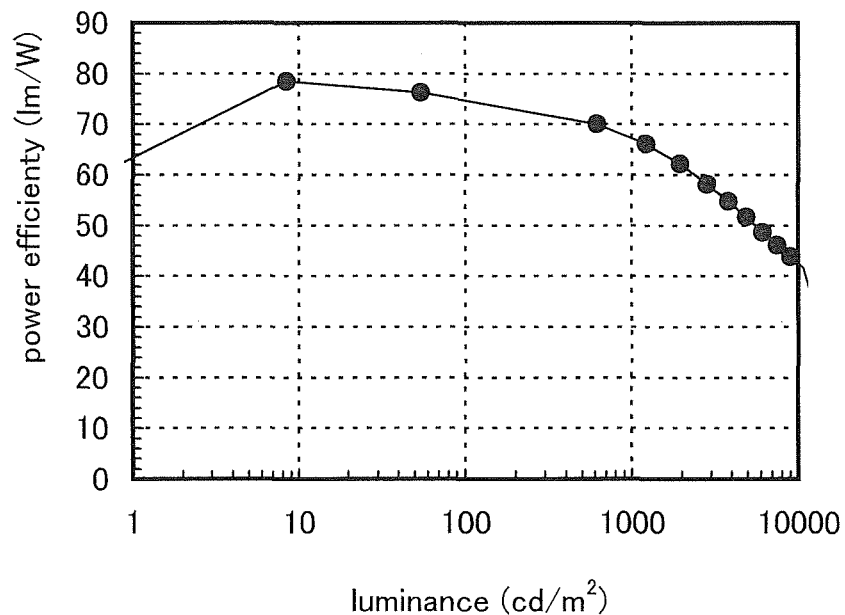
FIG. 33 shows luminance-power efficiency characteristics of a light-emitting element 3.

FIG. 30 shows luminance-current efficiency characteristics of the light-emitting element 3. FIG. 31 shows voltage-luminance characteristics thereof. FIG. 32 shows luminance-external quantum efficiency characteristics thereof. FIG. 33 shows luminance-power efficiency characteristics thereof.

From the above, the light-emitting element 3 turned out to have excellent element characteristics. In particular, as can be seen from FIG. 30, FIG. 32, and FIG. 33, the light-emitting element has extremely high emission efficiency and had a high external quantum efficiency not less than 20% at around a practical luminance (1000 cd/m$^2$). In addition, the balance, although the host material which is different from that of the light-emitting element 1 or 2 is used.

Example 4

In this example, a method for fabricating a light-emitting element which corresponds to one embodiment of the present invention described in Embodiment 1 and Embodiment 2 and the characteristics thereof are described. Structural formulae of organic compounds used in this example are shown below.

[Chemical formula 5]

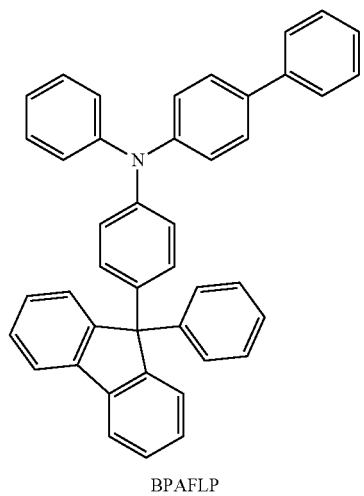

(ii)

BPAFLP (iii)
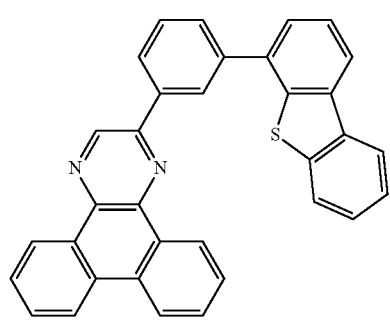
2mDBTPDBq-II
(iv)
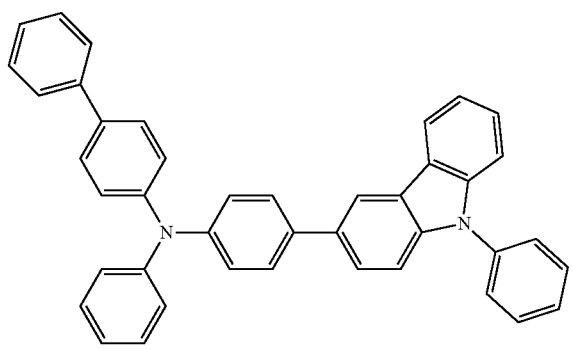
PCBA1BP
(xii)
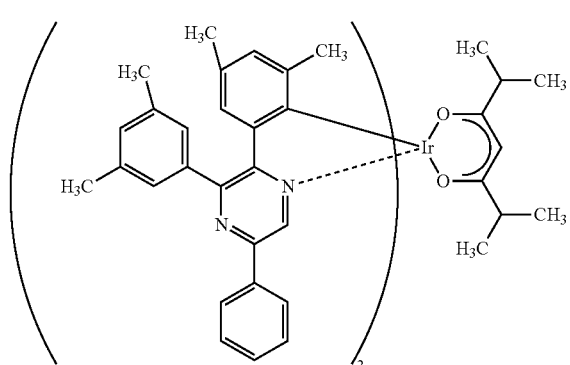
Ir(dmdppr-P)$_2$(dibm)
(v)
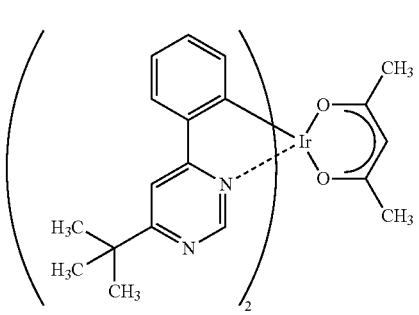
Ir(tBuppm)$_2$(acac)
(vii)
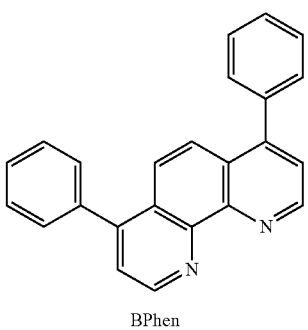
BPhen
(xiii)
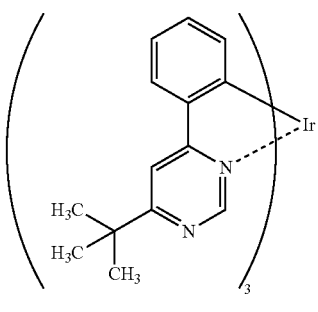
Ir(tBuppm)$_3$ Next, a method for fabricating the light-emitting elements (a light-emitting element 4 and a light-emitting element 5) in this example is described below.

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4-phenyl-4'-(9-phenylfluoren-9-yl)triphenylamine (abbreviation: BPAFLP) represented by Structural Formula (ii) and molybdenum(VI) oxide were deposited by co-evaporation by an evaporation method using resistance heating, so that the hole-injection layer 111 was formed. The thickness of the hole-injection layer 111 was set to 33.3 nm, and the weight ratio of BPAFLP to molybdenum oxide was adjusted to 1:0.5. Note that the co-evaporation method refers to an evaporation method in which evaporation is carried out from a plurality of evaporation sources at the same time in one treatment chamber.

Next, a film of BPAFLP was formed to a thickness of 20 nm over the hole-injection layer 111 to form the hole-transport layer 112.

Further, over the hole-transport layer 112, 2-[3-(dibenzothiophen-4-yl)phenyl]dibenzo[f,h]quinoxaline (abbreviation: 2mDBTPDBq-II) represented by Structural Formula (iii), 4-phenyl-4'-(9-phenyl-9H-carbazol-3-yl)triphenylamine (abbreviation: PCBA1BP) represented by Structural Formula (iv), and bis[2-(6-tert-butyl-4-pyrimidinyl-κN3) phenyl-κC](2,4-pentanedionato-κ$^2$O,O')iridium(II) (abbreviation: Ir(tBuppm)$_2$(acac)) represented by Structural Formula (v) were deposited by co-evaporation to a thickness of 20 nm with a mass ratio of 2mDBTPDBq-II to PCBA1BP and Ir(tBuppm)$_2$(acac) being 0.8:0.2:0.06, so that the first light-emitting layer 113a was formed; then, 2mDBTPDBq-II and bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]) represented by Structural Formula (xii) were deposited by co-evaporation to a thickness of 20 nm with a mass ratio of 2mDBTPDBq-II to [Ir(dmdppr-P)$_2$(dibm)] being 1:0.06, so that the second light-emitting layer 113b was formed. Note that 2mDBTPDBq-II, which is a host material, and PCBA1BP form an exciplex.

Then, the electron-transport layer 114 was formed over the light-emitting layer 113 in such a way that a 15-nm-thick film of 2mDBTPDBq-II was formed and a 15-nm-thick film of bathophenanthroline (abbreviation: BPhen) represented by Structural Formula (vii) was formed.

After the formation of the electron-transport layer 114, lithium fluoride (LiF) was deposited by evaporation to a thickness of 1 nm, so that the electron-injection layer 115 was formed.

Lastly, aluminum was deposited by evaporation to a thickness of 200 nm to form the second electrode 102 functioning as a cathode. Thus, the light-emitting element 4 in this example was fabricated.

The light-emitting element 5 was fabricated in the same way as the light-emitting element 4 except that the first light-emitting layer 113a contained, instead of [Ir(tBuppm)$_2$(acac)], tris[2-(6-tert-butyl-4-pyrimidinyl-κN3)phenyl-κC]iridium(III) (abbreviation: [Ir(tBuppm)$_3$)]) represented by Structural Formula (xiii).

Note that in all the above evaporation steps, evaporation was performed by a resistance-heating method.

Tables 4 and 5 respectively show element structures of the light-emitting elements 4 and 5 obtained as described above.

TABLE 4

| | | Light-emitting Layer | | | |
|---|---|---|---|---|---|
| Hole-injection Layer | Hole-transport Layer | First Light-emitting Layer | Second Light-emitting Layer | Electron-transport Layer | Electron-injection Layer |
| BPAFLP: MoO$_x$ 4:2 33 nm | BPAFLP 20 nm | 2mDBTPDBq-II: PCBA1BP: Ir(tBuppm)$_2$(acac) 0.8:0.2:0.06 20 nm | 2mDBTPDBq-II: Ir(dmdppr-P)$_2$(dibm) 1:0.06 20 nm | 2mDBTPDBq-II 15 nm Bphen 15 nm | LiF 1 nm |

TABLE 5

| | | Light-emitting Layer | | | |
|---|---|---|---|---|---|
| Hole-injection Layer | Hole-transport Layer | First Light-emitting Layer | Second Light-emitting Layer | Electron-transport Layer | Electron-injection Layer |
| BPAFLP: MoO$_x$ | BPAFLP 20 nm | 2mDBTPDBq-II: PCBA1BP: | 2mDBTPDBq-II: Ir(dmdppr-P)$_2$(dibm) | 2mDBTPDBq-II 15 nm Bphen 15 nm | LiF 1 nm |

TABLE 5-continued

| | | Light-emitting Layer | | | |
|---|---|---|---|---|---|
| Hole-injection Layer | Hole-transport Layer | First Light-emitting Layer | Second Light-emitting Layer | Electron-transport Layer | Electron-injection Layer |
| 4:2 33 nm | | Ir(tBuppm)$_3$ 0.8:0.2:0.06 20 nm | 1:0.06 20 nm | | |

The light-emitting elements 4 and 5 were sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing).

In the light-emitting element 4, Ir(tBuppm)$_2$(acac) and [Ir(dmdppr-P)$_2$(dibm)] were used as the first phosphorescent compound 113Da and the second phosphorescent compound 113Db, respectively. Here, a relation between a PL spectrum of Ir(tBuppm)$_2$(acac) and $\varepsilon(\lambda)\lambda^4$ of [Ir(dmdppr-P)$_2$(dibm)] is described. Note that $\lambda$ denotes a wavelength and $\varepsilon(\lambda)$ denotes a molar absorption coefficient.

Figure 45A:
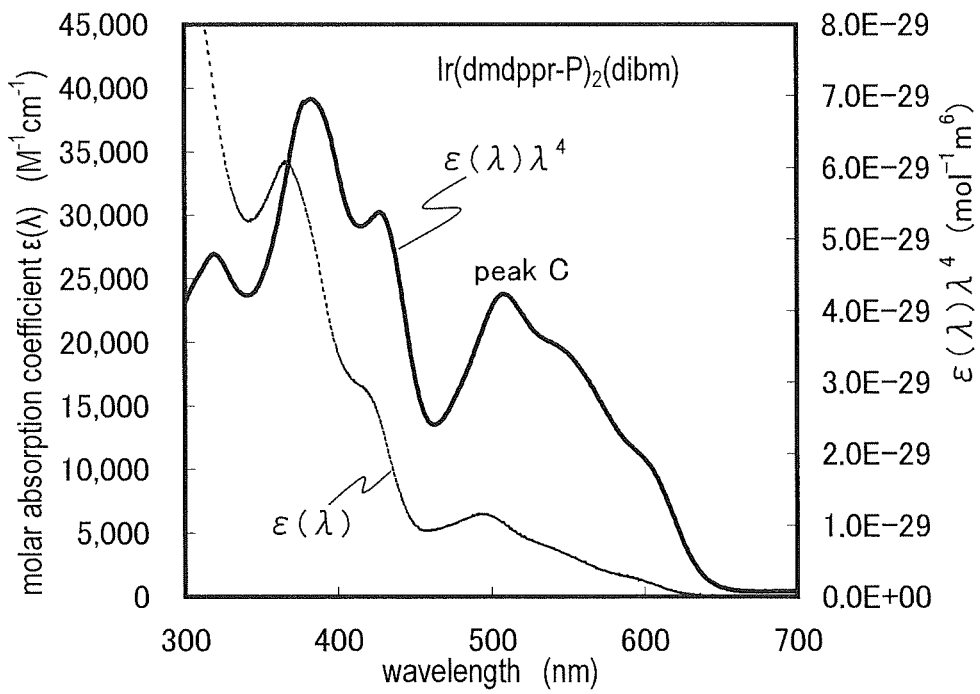
FIGS. 45A and 45B explain Förster energy transfer in a light-emitting element 4.

FIG. 45A shows graphs of the molar absorption coefficient $\varepsilon(\lambda)$ and $\varepsilon(\lambda)\lambda^4$ of [Ir(dmdppr-P)$_2$(dibm)], which is the second phosphorescent compound 113Db in the light-emitting element 4. While the molar absorption coefficient $\varepsilon(\lambda)$ does not have a noticeable peak in a region on a longer wavelength side, the graph of $\varepsilon(\lambda)\lambda^4$ has a peak including a local maximum value at 509 nm and shoulders at around 550 nm and 605 nm. This peak shows triplet MLCT absorption of [Ir(dmdppr-P)$_2$(dibm)]. When this peak has an overlap with an emission peak of the first phosphorescent compound 113Da, energy transfer efficiency can be largely increased.

Figure 45B:
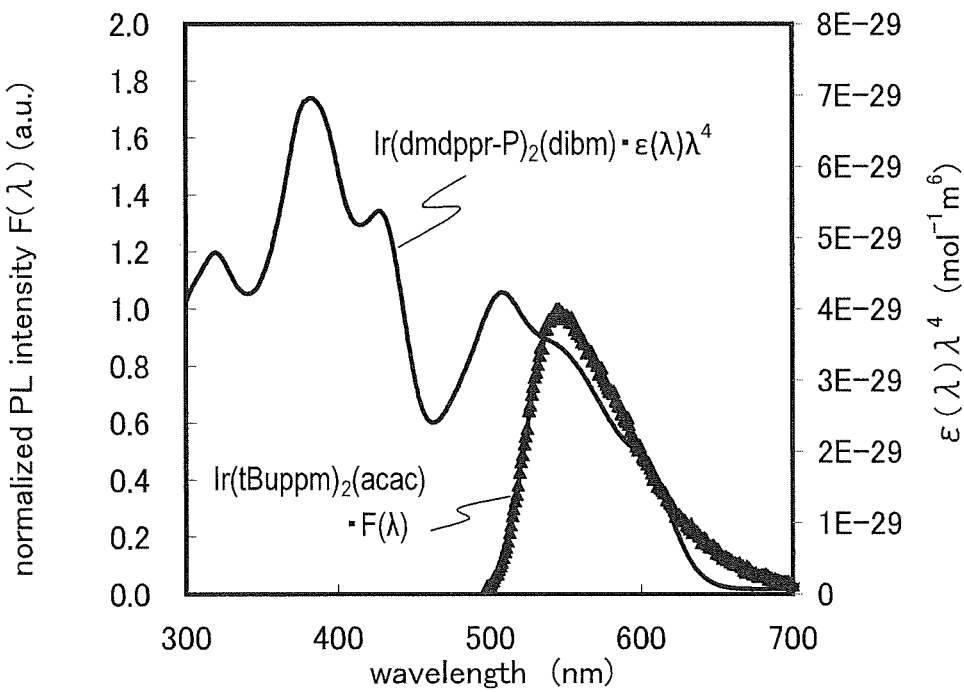

FIG. 45B shows the PL spectrum F($\lambda$) of Ir(tBuppm)$_2$(acac) which is the first phosphorescent compound 113Da in the light-emitting element 4 and the graph of $\varepsilon(\lambda)\lambda^4$ of [Ir(dmdppr-P)$_2$(dibm)] which is the second phosphorescent compound 113Db. As seen from the graph, a band having a peak of the PL spectrum F($\lambda$) of Ir(tBuppm)$_2$(acac) largely overlaps with the band having the longest-wavelength-side peak of $\varepsilon(\lambda)\lambda^4$ of [Ir(dmdppr-P)$_2$(dibm)], which indicates that the combination enables extremely efficient energy transfer. Further, Ir(tBuppm)$_2$(acac) which is the first phosphorescent compound 113Da has an emission peak at 546 nm, and the spectrum showing $\varepsilon(\lambda)\lambda^4$ of [Ir(dmdppr-P)$_2$(dibm)] which is the second phosphorescent compound 113Db has a longer-wavelength-side local maximum at 509 nm, so that the difference is 37 nm. The wavelengths 546 nm and 509 nm correspond to 2.27 eV and 2.44 eV, respectively, so that the difference is 0.17 eV, which is less than 0.2 eV; thus, the positions of the peaks also suggest occurrence of efficient energy transfer. Note that although the longer-wavelength-side peak (peak C) in the spectrum showing $\varepsilon(\lambda)\lambda^4$ of [Ir(dmdppr-P)$_2$(dibm)] hardly overlaps with the spectrum F($\lambda$) of Ir(tBuppm)$_2$(acac), the band including the peak C in the spectrum showing $\varepsilon(\lambda)\lambda^4$ of [Ir(dmdppr-P)$_2$(dibm)] has a broad shape on the longer wavelength side, and on the longer wavelength side, the spectrum has a large overlap with the emission spectrum F($\lambda$) of Ir(tBuppm)$_2$(acac). Accordingly, extremely efficient energy transfer is achieved.

In the light-emitting element 4, 2mDBTPDBq-II, which is the first host material, and PCBA1BP, which is the first organic compound, form an exciplex, so that energy is efficiently transferred to Ir(tBuppm)$_2$(acac), which is the first phosphorescent compound 113Da. The relation is similar to that in the light-emitting element 1 and described in detail in Example 1; thus, the description is not repeated. The corresponding description in Example 1 is to be referred to.

Figure 46:
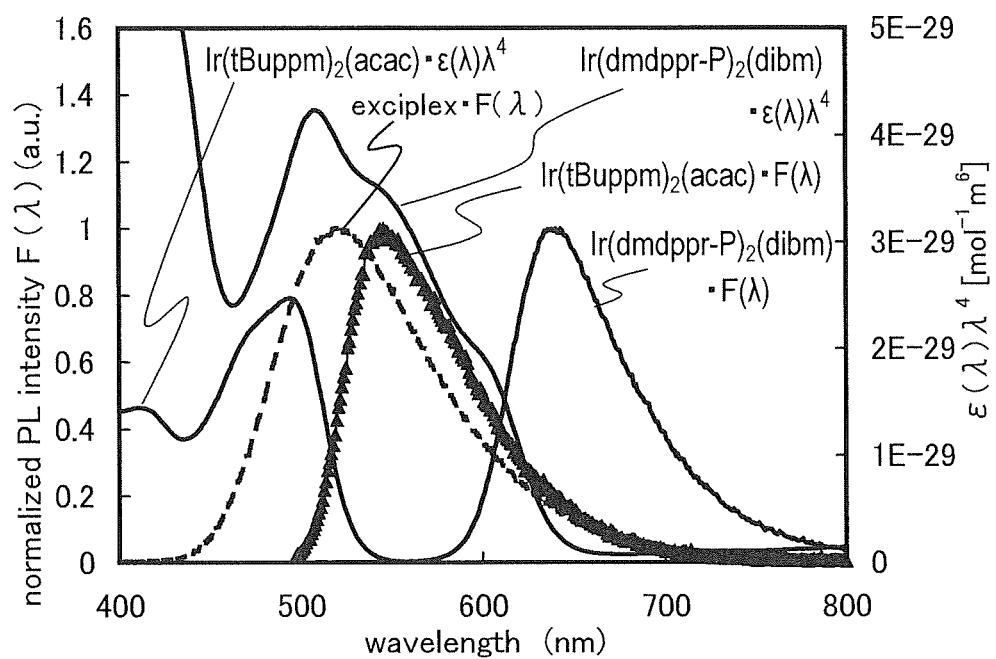
FIG. 46 explains Förster energy transfer in a light-emitting element 4.

FIG. 46 shows the PL spectrum F($\lambda$) of the exciplex, the PL spectrum F($\lambda$) of Ir(tBuppm)$_2$(acac), a PL spectrum F($\lambda$) of [Ir(dmdppr-P)$_2$(dibm)], $\varepsilon(\lambda)\lambda^4$ of Ir(tBuppm)$_2$(acac), and $\varepsilon(\lambda)\lambda^4$ of [Ir(dmdppr-P)$_2$(dibm)]. It can be found that energy can be transferred stepwise first from the exciplex to Ir(tBuppm)$_2$(acac) by utilizing the overlap between the PL spectrum of the exciplex and $\varepsilon(\lambda)\lambda^4$ of Ir(tBuppm)$_2$(acac) (around the peak A), and then from Ir(tBuppm)$_2$(acac) to [Ir(dmdppr-P)$_2$(dibm)] by utilizing the overlap between the PL spectrum of Ir(tBuppm)$_2$(acac) and $\varepsilon(\lambda)\lambda^4$ of [Ir(dmdppr-P)$_2$(dibm)] (around a range from the peak C to 650 nm). Note that direct energy transfer from the exciplex to [Ir(dmdppr-P)$_2$(dibm)] which is the second phosphorescent compound is also possible. The reason for this is that, as can be seen from FIG. 46, $\varepsilon(\lambda)\lambda^4$ of [Ir(dmdppr-P)$_2$(dibm)] also overlaps with the PL spectrum F($\lambda$) of the exciplex in the triplet MLCT absorption band (around the peak C) of [Ir(dmdppr-P)$_2$(dibm)].

In the light-emitting element 5, Ir(tBuppm)$_3$ and [Ir(dmdppr-P)$_2$(dibm)] were used as the first phosphorescent compound 113Da and the second phosphorescent compound 113Db, respectively. Here, a relation between a PL spectrum of Ir(tBuppm)$_3$ and $\varepsilon(\lambda)\lambda^4$ of [Ir(dmdppr-P)$_2$(dibm)] is described. Note that $\lambda$ denotes a wavelength and $\varepsilon(\lambda)$ denotes a molar absorption coefficient.

Figure 47A:
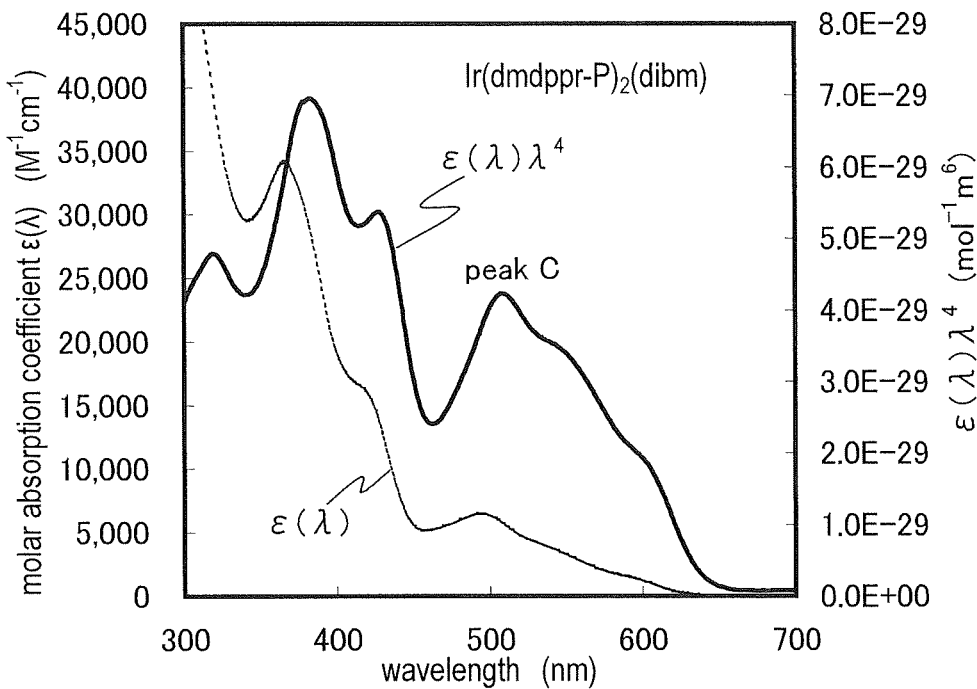
FIGS. 47A and 47B explain Förster energy transfer in a light-emitting element 5.

FIG. 47A shows graphs of the molar absorption coefficient $\varepsilon(\lambda)$ and $\varepsilon(\lambda)\lambda^4$ of [Ir(dmdppr-P)$_2$(dibm)], which is the second phosphorescent compound 113Db in the light-emitting element 5. While the molar absorption coefficient $\varepsilon(\lambda)$ does not have a noticeable peak in a region on a longer wavelength side, the graph of $\varepsilon(\lambda)\lambda^4$ has a peak including a local maximum value at 509 nm and shoulders at around 550 nm and 605 nm. This peak shows triplet MLCT absorption of [Ir(dmdppr-P)$_2$(dibm)]. When this peak has an overlap with an emission peak of the first phosphorescent compound 113Da, energy transfer efficiency can be largely increased.

Figure 47B:
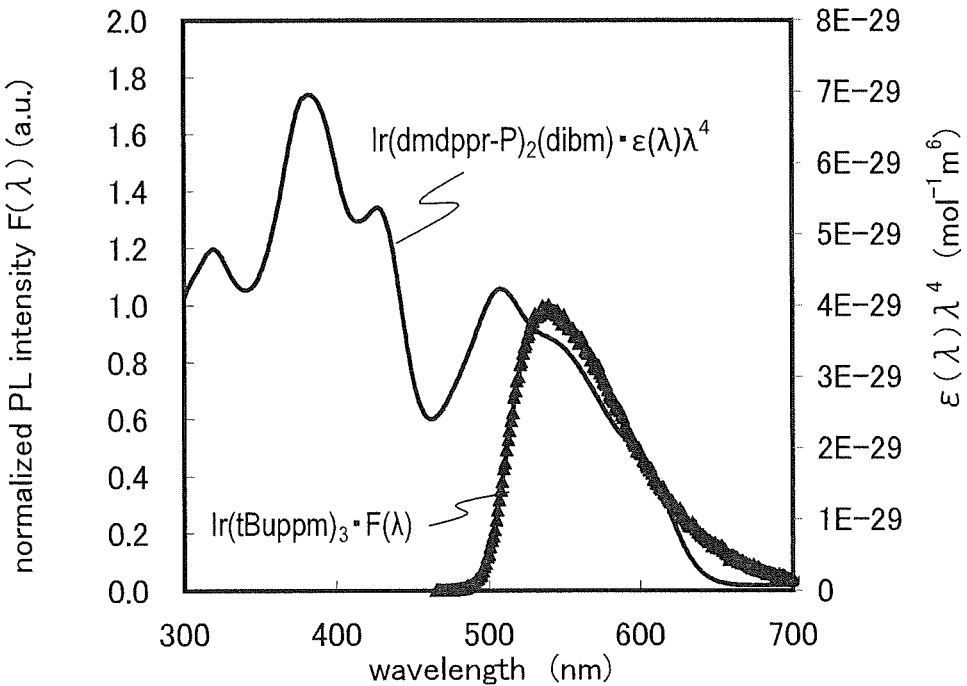

FIG. 47B shows the PL spectrum F($\lambda$) of Ir(tBuppm)$_3$ which is the first phosphorescent compound 113Da in the light-emitting element 5 and the graph of $\varepsilon(\lambda)\lambda^4$ of [Ir(dmdppr-P)$_2$(dibm)] which is the second phosphorescent compound 113Db. As seen from the graph, a band having a peak of the PL spectrum F($\lambda$) of Ir(tBuppm)$_3$ largely overlaps with the band having the longest-wavelength-side peak of $\varepsilon(\lambda)\varepsilon^4$ of [Ir(dmdppr-P)$_2$(dibm)], which indicates that the combination enables extremely efficient energy transfer. Further, Ir(tBuppm)$_3$ which is the first phosphorescent compound 113Da has an emission peak at 540 nm, and the spectrum showing $\varepsilon(\lambda)\lambda^4$ of [Ir(dmdppr-P)$_2$(dibm)] which is the second phosphorescent compound 113Db has a longerwavelength-side local maximum at 509 nm, so that the difference is 31 nm. The wavelengths 540 nm and 509 nm correspond to 2.30 eV and 2.44 eV, respectively, so that the difference is 0.14 eV, which is less than 0.2 eV; thus, the positions of the peaks also suggest occurrence of efficient energy transfer. Note that although the longer-wavelength-side local maximum (peak C) in the spectrum showing $\varepsilon(\lambda)\lambda^4$ of [Ir(dmdppr-P)$_2$(dibm)] hardly overlaps with the spectrum F($\lambda$) of Ir(tBuppm)$_3$, the band including the peak C in the spectrum showing $\varepsilon(\lambda)\lambda^4$ of [Ir(dmdppr-P)$_2$(dibm)] has a broad shape on the longer wavelength side, and on the longer wavelength side, the spectrum has a large overlap with the emission spectrum F($\lambda$) of Ir(tBuppm)$_3$. Accordingly, extremely efficient energy transfer is achieved.

Figure 48A:
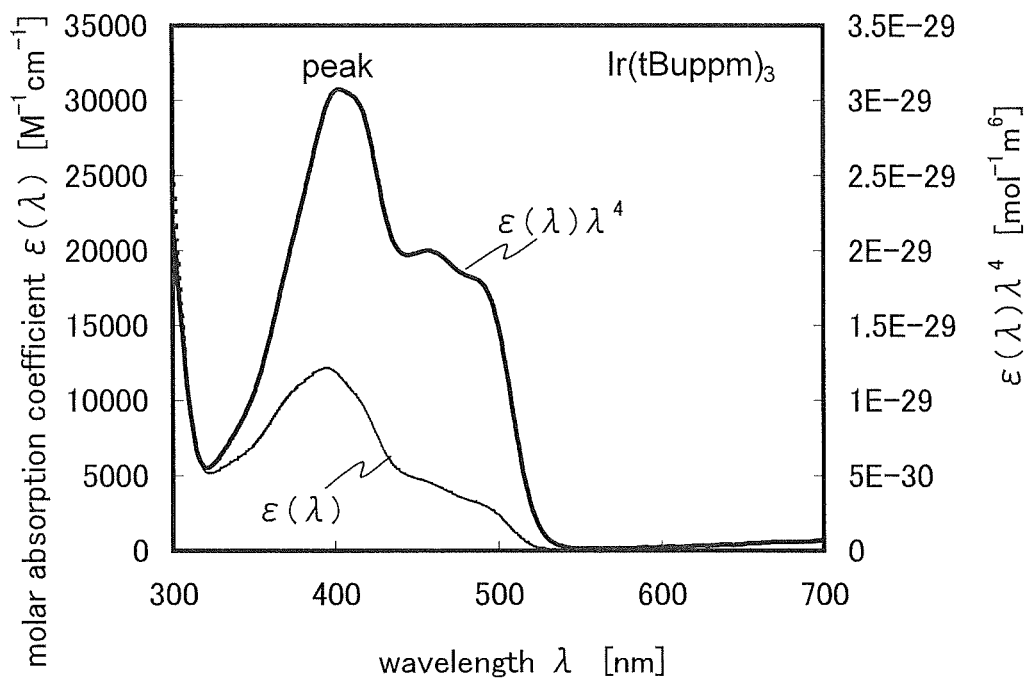
FIGS. 48A and 48B explain Förster energy transfer in a light-emitting element 5.

Next, FIG. 48A shows graphs of the molar absorption coefficient $\varepsilon(\lambda)$ and $\varepsilon(\lambda)\lambda^4$ of Ir(tBuppm)$_3$, which is the first phosphorescent compound 113Da in the light-emitting element 5. The graph of $\varepsilon(\lambda)\lambda^4$ has peaks with high intensities at 409 nm and 465 nm and a peak including a shoulder at 494 nm. This peak shows triplet MLCT absorption of Ir(tBuppm)$_3$. When this peak has an overlap with an emission peak of an energy donor, energy transfer efficiency can be largely increased.

Figure 48B:
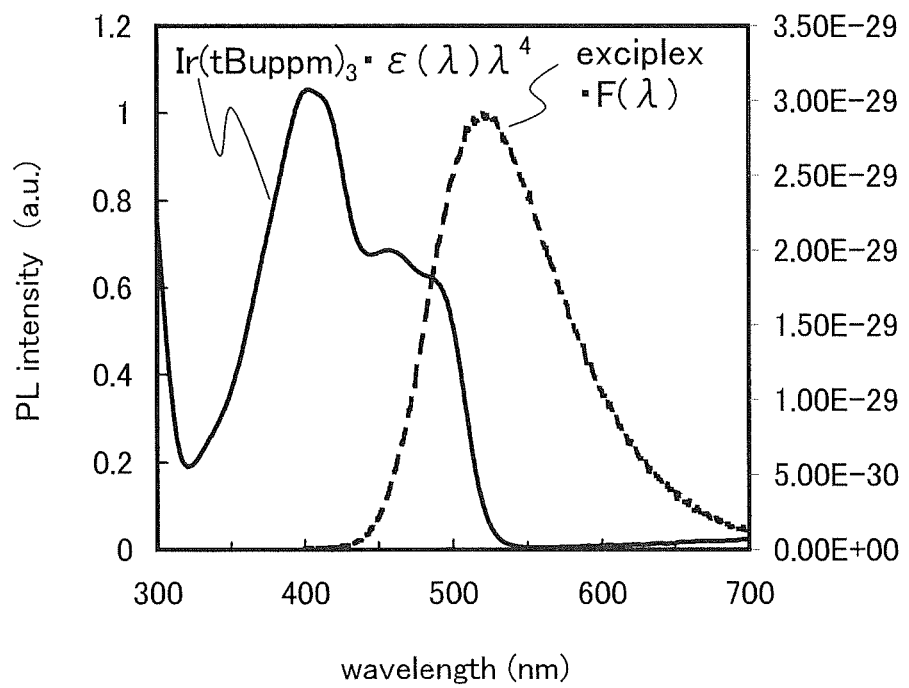

Here, in the light-emitting element 5 in this example, 2mDBTPDBq-II which is the first host material and PCBA1BP which is the first organic compound form the exciplex 113Ec, and energy is transferred from the exciplex 113Ec to the first phosphorescent compound 113Da. FIG. 23 shows PL spectra of 2mDBTPDBq-II, PCBA1BP, and a mixed film thereof (a mass ratio of 2mDBTPDBq-II to PCBA1BP is 0.8:0.2), and it can be found that 2mDBTPDBq-II and PCBA1BP which is the first organic compound formed the exciplex 113Ec. FIG. 48B shows a PL spectrum F($\lambda$) of the exciplex and the graph of $\varepsilon(\lambda)\lambda^4$ of Ir(tBuppm)$_3$ which is the first phosphorescent compound 113Da. As seen from the graph, part of a wavelength range in which a band having a peak of the PL spectrum F($\lambda$) of the exciplex has half of the intensity of the peak overlaps with part of a wavelength range in which a band with the longest-wavelength-side peak of $\varepsilon(\lambda)\lambda^4$ of Ir(tBuppm)$_3$ has half of the intensity of the peak, which indicates that the combination enables efficient energy transfer.

Figure 49:
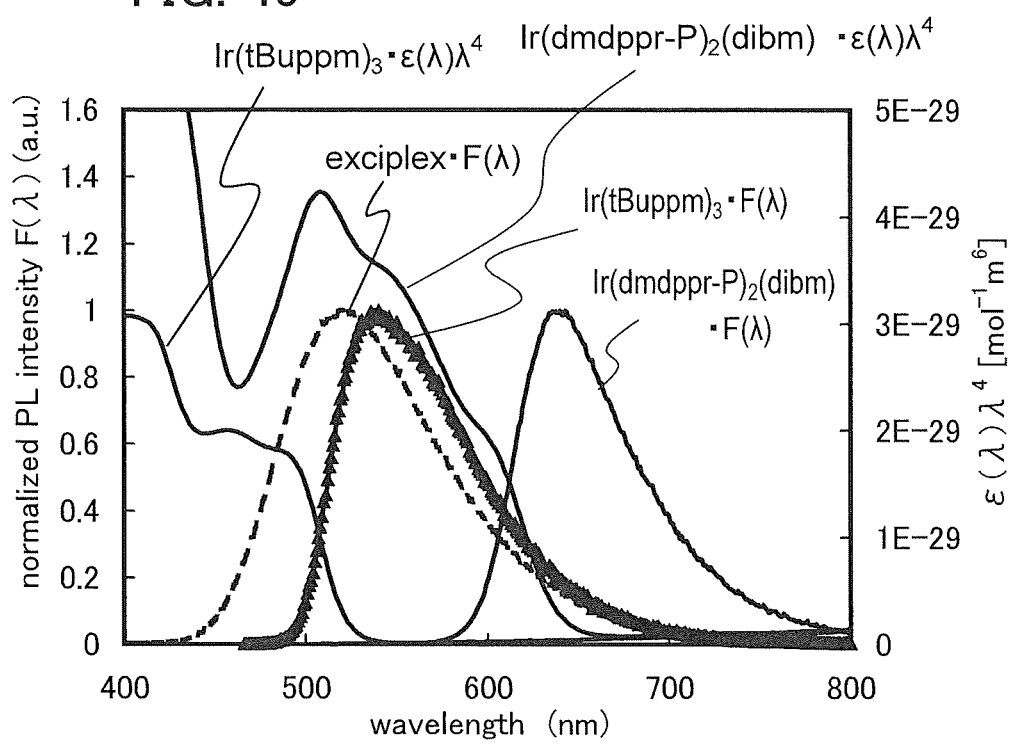
FIG. 49 explains Förster energy transfer in a light-emitting element 5.

FIG. 49 shows the PL spectrum F($\lambda$) of the exciplex, the PL spectrum F($\lambda$) of Ir(tBuppm)$_3$, a PL spectrum F($\lambda$) of [Ir(dmdppr-P)$_2$(dibm)], $\varepsilon(\lambda)\lambda^4$ of Ir(tBuppm)$_3$, and $\varepsilon(\lambda)\lambda^4$ of [Ir(dmdppr-P)$_2$(dibm)]. It can be found that energy can be transferred stepwise first from the exciplex to Ir(tBuppm)$_3$ by utilizing the overlap between the PL spectrum of the exciplex and $\varepsilon(\lambda)\lambda^4$ of Ir(tBuppm)$_3$ (around the peak A), and then from Ir(tBuppm)$_3$ to [Ir(dmdppr-P)$_2$(dibm)] by utilizing the overlap between the PL spectrum of Ir(tBuppm)$_3$ and $\varepsilon(\lambda)\lambda^4$ of [Ir(dmdppr-P)$_2$(dibm)] (around a range from the peak C to 650 nm). Note that direct energy transfer from the exciplex to [Ir(dmdppr-P)$_2$(dibm)] which is the second phosphorescent compound is also possible. The reason for this is that, as can be seen from FIG. 49, $\varepsilon(\lambda)\lambda^4$ of [Ir(dmdppr-P)$_2$(dibm)] also overlaps with the PL spectrum F($\lambda$) of the exciplex in the triplet MLCT absorption band (around the peak C) of [Ir(dmdppr-P)$_2$(dibm)].

Element characteristics of these light-emitting elements were measured. Note that the measurement was carried out at room temperature (in an atmosphere kept at 25° C.).

Figure 35:
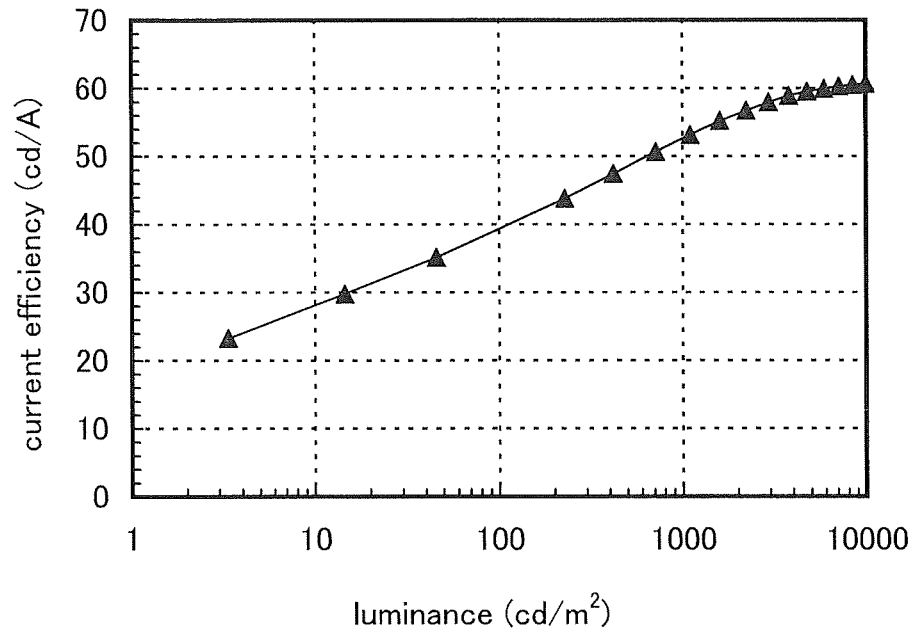
FIG. 35 shows luminance-current efficiency characteristics of a light-emitting element 4.
Figure 36:
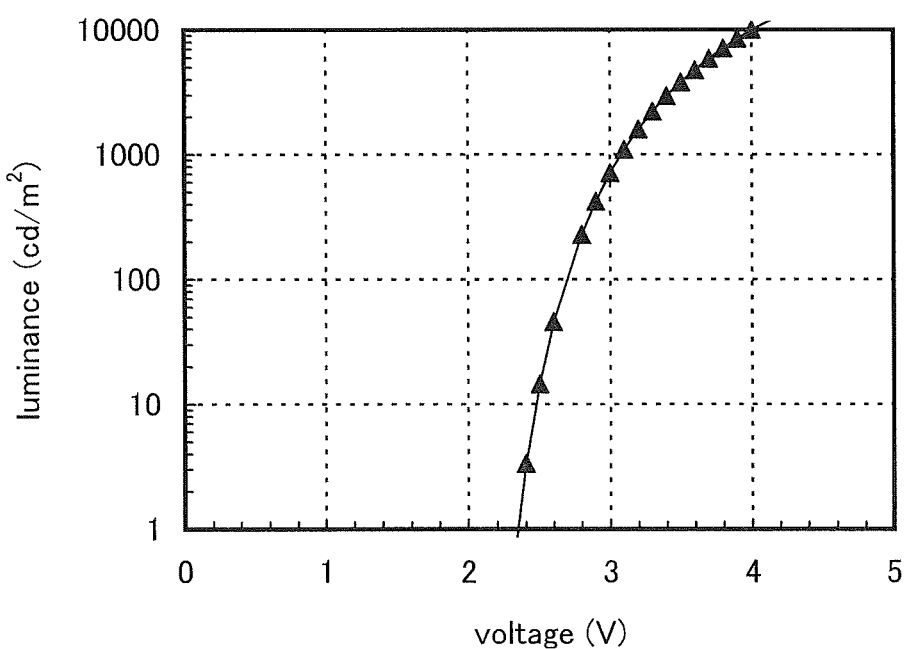
FIG. 36 shows voltage-luminance characteristics of a light-emitting element 4.
Figure 37:
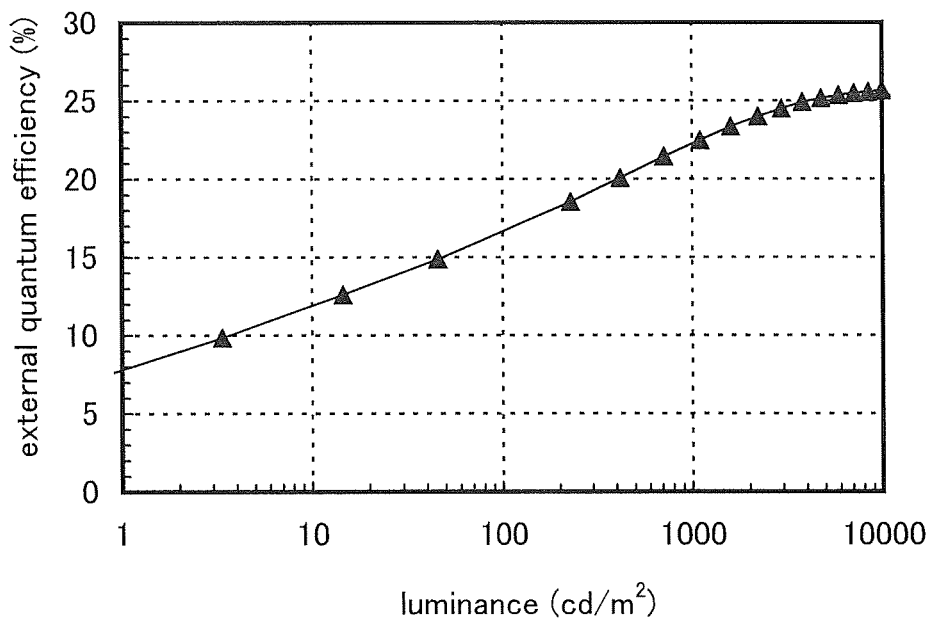
FIG. 37 shows luminance-external quantum efficiency characteristics of a light-emitting element 4.
Figure 38:
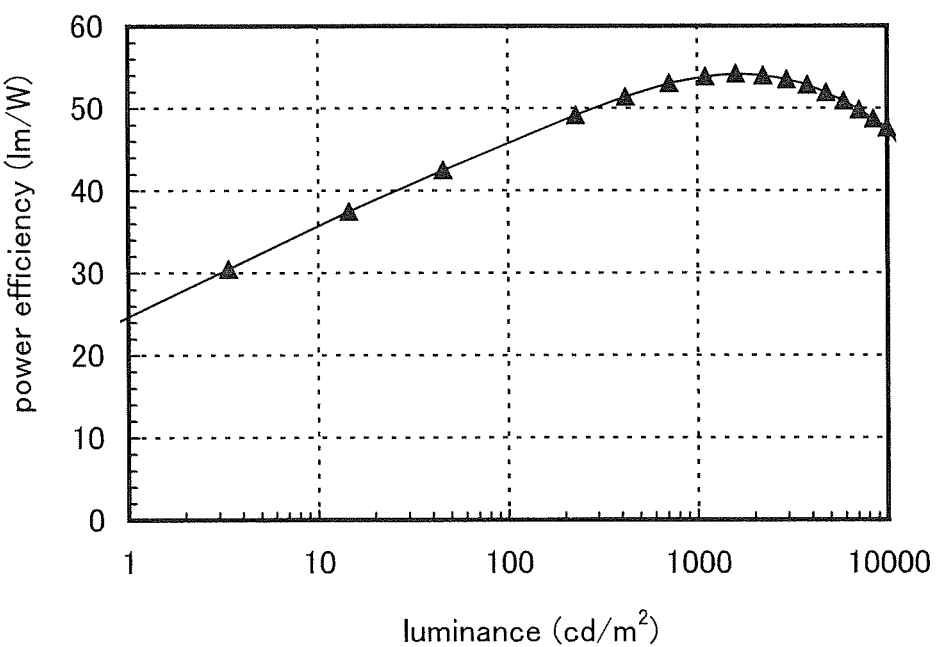
FIG. 38 shows luminance-power efficiency characteristics of a light-emitting element 4.

FIG. 35 shows luminance-current efficiency characteristics of the light-emitting element 4. FIG. 36 shows voltage-luminance characteristics thereof. FIG. 37 shows luminance-external quantum efficiency characteristics thereof. FIG. 38 shows luminance-power efficiency characteristics thereof.

From the above, the light-emitting element 4 turned out to have excellent element characteristics. In particular, as can be seen from FIG. 35, FIG. 37, and FIG. 38, the light-emitting element has extremely high emission efficiency and had a high external quantum efficiency not less than 20% at around a practical luminance (1000 cd/m$^2$). In addition, the current efficiency was around 50 cd/A and the power efficiency was around 50 lm/W, which are excellent values.

Figure 39:
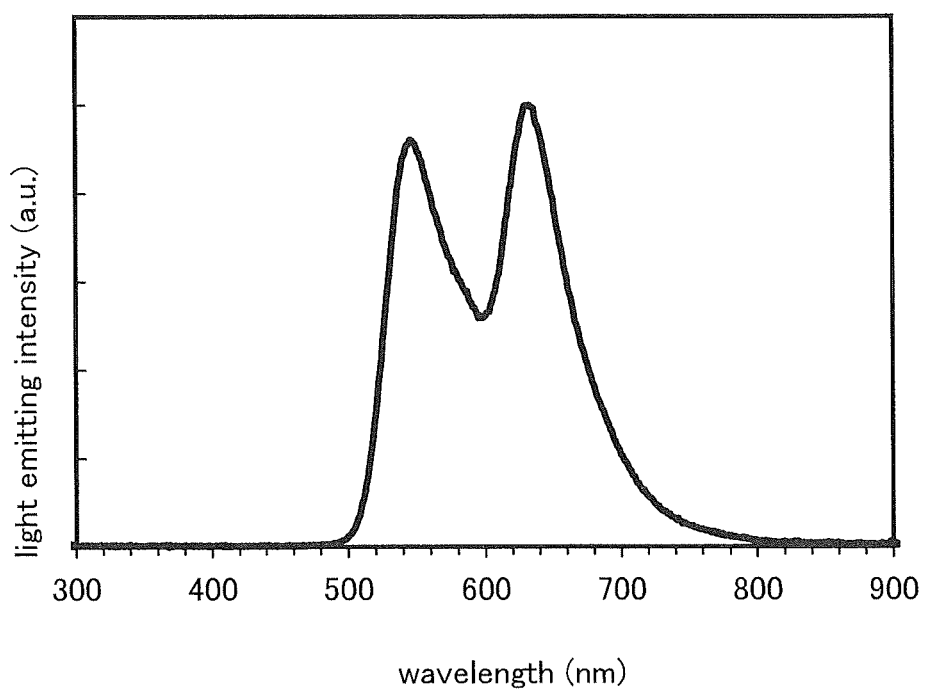
FIG. 39 shows an emission spectrum of a light-emitting element 4.

FIG. 39 shows an emission spectrum of the light-emitting element 4 which was obtained when a current of 0.1 mA was made to flow in the light-emitting element 4. In FIG. 39, the horizontal axis indicates a wavelength (nm) and the vertical axis indicates light emission intensity (arbitrary unit). FIG. 39 indicates that the light-emitting element 4 shows an emission spectrum including light with a wavelength in a green wavelength range which originates from [Ir(tBuppm)$_2$(acac)] and light with a wavelength in a red wavelength range which originates from [Ir(dmdppr-P)$_2$(dibm)] in a good balance.

Figure 40:
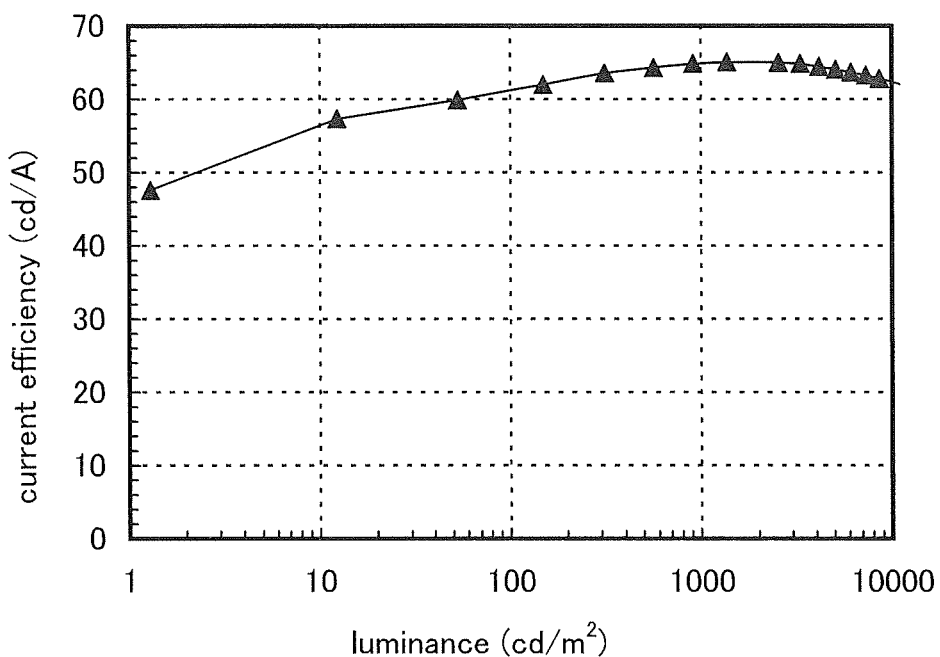
FIG. 40 shows luminance-current efficiency characteristics of a light-emitting element 5.
Figure 41:
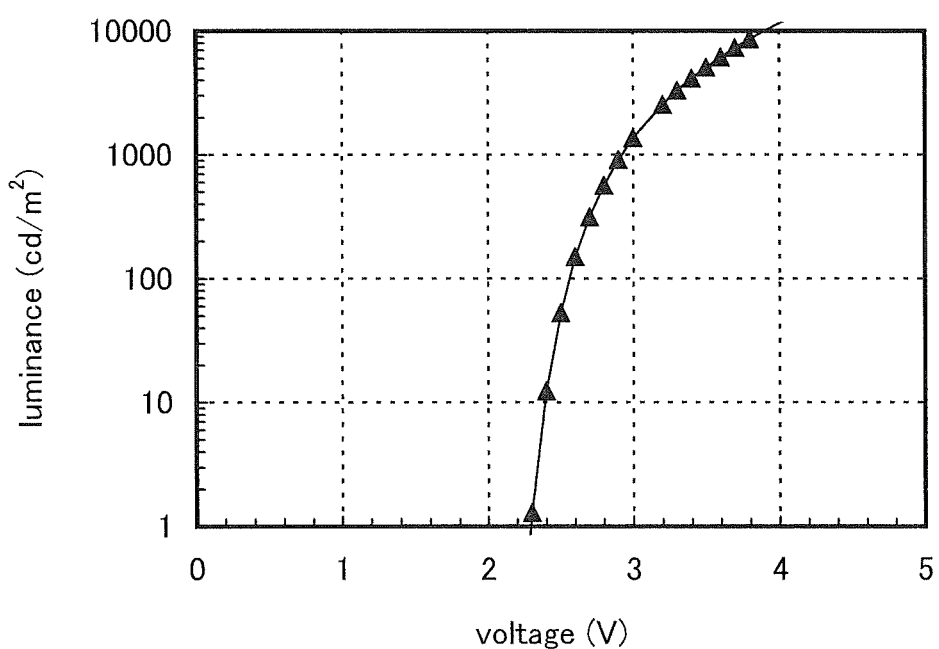
FIG. 41 shows voltage-luminance characteristics of a light-emitting element 5.
Figure 42:
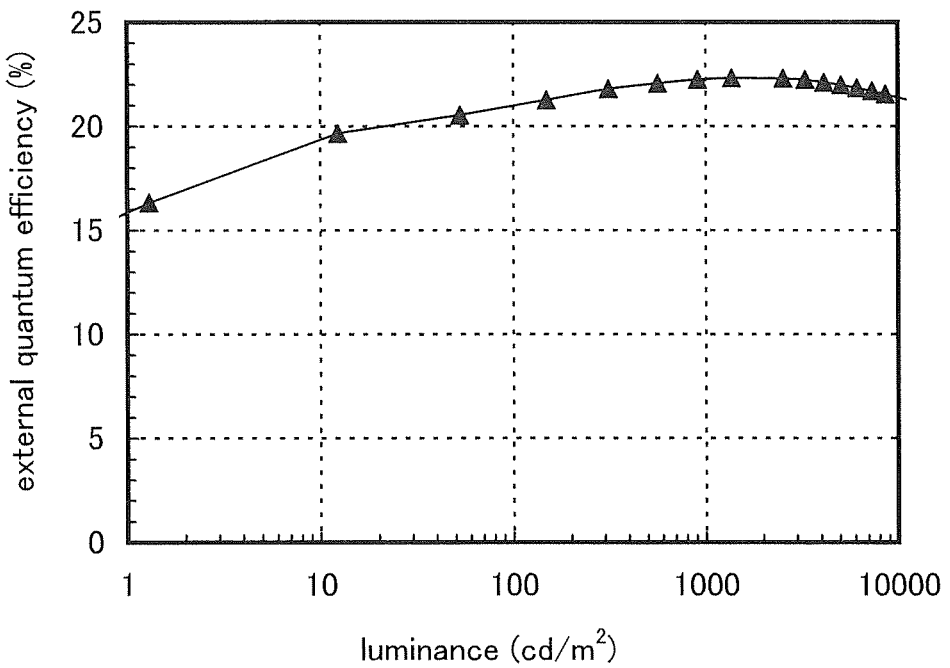
FIG. 42 shows luminance-external quantum efficiency characteristics of a light-emitting element 5.
Figure 43:
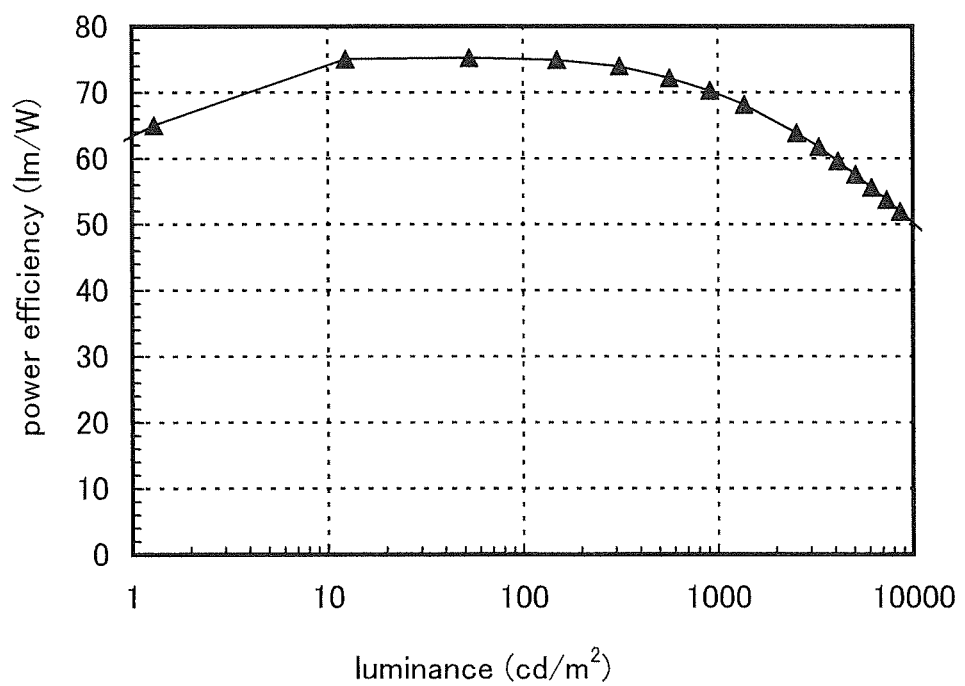
FIG. 43 shows luminance-power efficiency characteristics of a light-emitting element 5.

FIG. 40 shows luminance-current efficiency characteristics of the light-emitting element 5. FIG. 41 shows voltage-luminance characteristics thereof. FIG. 42 shows luminance-external quantum efficiency characteristics thereof. FIG. 43 shows luminance-power efficiency characteristics thereof.

From the above, the light-emitting element 5 turned out to have excellent element characteristics. In particular, as can be seen from FIG. 40, FIG. 42, and FIG. 43, the light-emitting element has extremely high emission efficiency and had a high external quantum efficiency of about 25% at around a practical luminance (1000 cd/m$^2$). In addition, the current efficiency was around 65 cd/A and the power efficiency was around 70 lm/W, which are excellent values.

Figure 44:
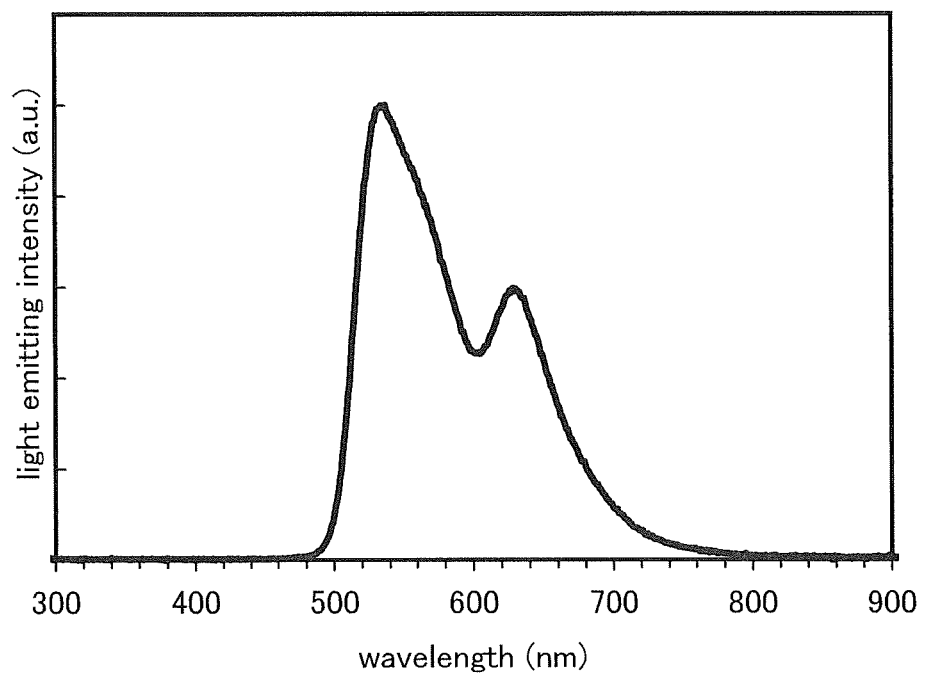
FIG. 44 shows an emission spectrum of a light-emitting element 5.

FIG. 44 shows an emission spectrum of the light-emitting element 5 which was obtained when a current of 0.1 mA was made to flow in the light-emitting element 5. In FIG. 44, the horizontal axis indicates a wavelength (nm) and the vertical axis indicates light emission intensity (arbitrary unit). FIG. 44 indicates that the light-emitting element 5 shows an emission spectrum including light with a wavelength in a green wavelength range which originates from [Ir(tBuppm)$_2$(acac)] and light with a wavelength in a red wavelength range which originates from [Ir(dmdppr-P)$_2$(dibm)] in a good balance.

From the above, it was shown that the light-emitting elements 4 and 5 each corresponding to one embodiment of the present invention have high emission efficiency and provide lights from two kinds of emission center substances in a good balance.

Reference Example 1

A synthesis example of the organometallic complex bis [2-(6-tert-butyl-4-pyrimidinyl-κN3)phenyl-κC](2,4-pentanedionato-κ$^2$O,O')iridium(I II) (abbreviation: [Ir(tBuppm)$_2$(acac)]), which is used in the above embodiment, is described. The structure of [Ir(tBuppm)$_2$(acac)] is shown below.

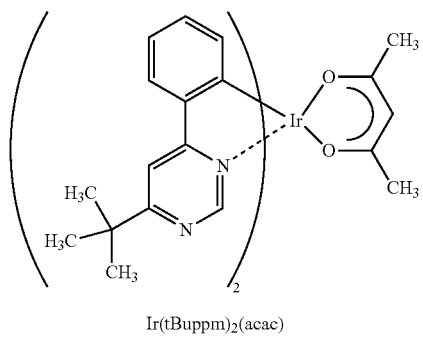

Ir(tBuppm)₂(acac)

Step 1: Synthesis of
4-tert-Butyl-6-phenylpyrimidine (Abbreviation: HtBuppm)

First, 22.5 g of 4,4-dimethyl-1-phenylpentane-1,3-dione and 50 g of formamide were put into a recovery flask equipped with a reflux pipe, and the air in the flask was replaced with nitrogen. This reaction container was heated, so that the reacted solution was refluxed for 5 hours. After that, this solution was poured into an aqueous solution of sodium hydroxide, and an organic layer was extracted with dichloromethane. The obtained organic layer was washed with water and a saturated aqueous solution of sodium chloride, and dried with magnesium sulfate. The solution after drying was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained. A synthesis scheme of Step 1 is shown below.

[Chemical formula 7]

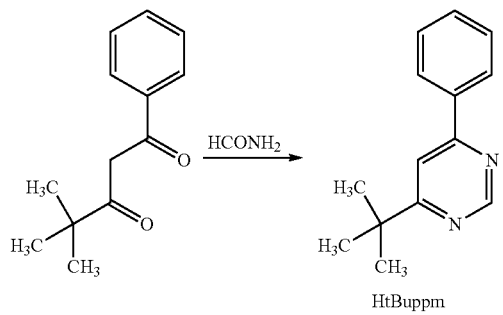

HtBuppm

Step 2: Synthesis of Di-µ-chloro-bis[bis(6-tert-butyl-4-phenylpyrimidinato)iridium(III)] (Abbreviation: [Ir(tBuppm)₂Cl]₂)

Next, 15 mL of 2-ethoxyethanol, 5 mL of water, 1.49 g of HtBuppm obtained in Step 1, and 1.04 g of iridium chloride hydrate (IrCl₃.H₂O) were put into a recovery flask equipped with a reflux pipe, and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol, so that a dinuclear complex [Ir(tBuppm)₂Cl]₂ (yellow green powder, yield of 73%) was obtained. A synthesis scheme of Step 2 is shown below.

[Chemical formula 8]

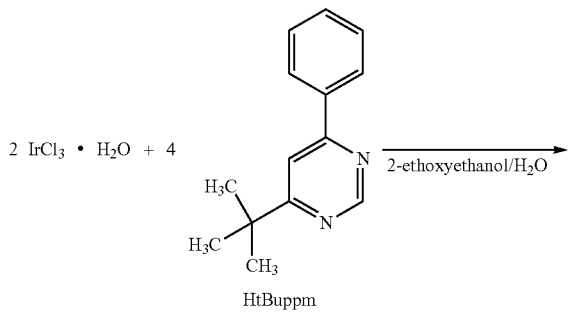

[Ir(tBuppm)₂Cl]₂

Step 3: Synthesis of (Acetylacetonato)bis(6-tert-butyl-4-phenylpyrimidinato)iridium(III) (Abbreviation: [Ir(tBuppm)₂(acac)])

Further, 40 mL of 2-ethoxyethanol, 1.61 g of the dinuclear complex [Ir(tBuppm)₂Cl]₂ obtained in Step 2, 0.36 g of acetylacetone, and 1.27 g of sodium carbonate were put into a recovery flask equipped with a reflux pipe, and the air in the flask was replaced with argon. After that, irradiation with microwaves (2.45 GHz, 120 W) was performed for 60 minutes to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized with a mixed solvent of dichloromethane and hexane, so that the objective substance was obtained as yellow powder (yield of 68%). A synthesis scheme of Step 3 is shown below.

[Chemical formula 9]

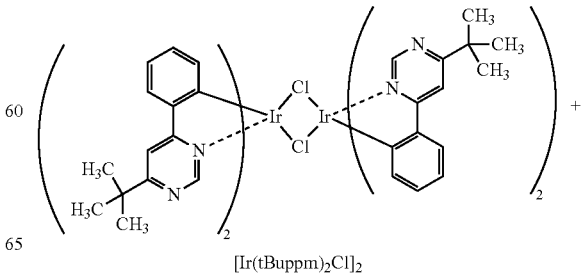

[Ir(tBuppm)₂Cl]₂

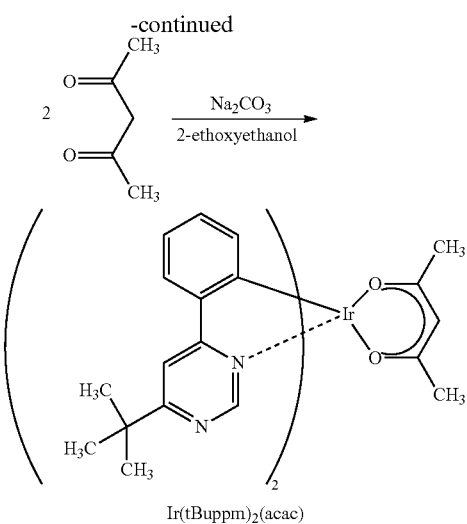

Ir(tBuppm)₂(acac)

An analysis result by nuclear magnetic resonance (¹H NMR) spectroscopy of the yellow powder obtained in Step 3 is described below. The result revealed that the organometallic complex Ir(tBuppm)₂(acac) was obtained.

¹H NMR. δ (CDCl₃): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

Reference Example 2

In this reference example, a synthesis method of bis{4,6-dimethyl-2-[3-(3,5-dimethylphenyl)-5-phenyl-2-pyrazinyl-κN]phenyl-κC}(2,6-dimethyl-3,5-heptanedionato-κ²O,O')iridium(III) (abbreviation: [Ir(dmdppr-P)₂(dibm)]), the organometallic iridium complex used in the example, is described. The structure of [Ir(dmdppr-P)₂(dibm)] (abbreviation) is shown below.

[Chemical formula 10]

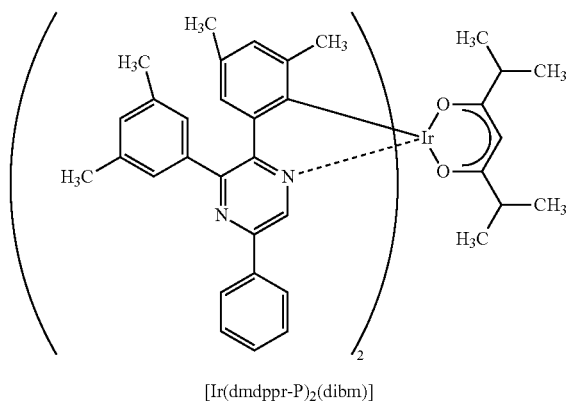

[Ir(dmdppr-P)₂(dibm)]

Step 1: Synthesis of 2,3-Bis(3,5-dimethylphenyl)pyrazine (Abbreviation: Hdmdppr)

First, 5.00 g of 2,3-dichloropyrazine, 10.23 g of 3,5-dimethylphenylboronic acid, 7.19 g of sodium carbonate, 0.29 g of bis(triphenylphosphine)palladium(II) dichloride (abbreviation: Pd(PPh₃)₂Cl₂), 20 mL of water, and 20 mL of acetonitrile were put into a recovery flask equipped with a reflux pipe, and the air in the flask was replaced with argon. This reaction container was subjected to irradiation with microwaves (2.45 GHz, 100 W) for 60 minutes to be heated. Here, into the flask were further put 2.55 g of 3,5-dimethylphenylboronic acid, 1.80 g of sodium carbonate, 0.070 g of Pd(PPh₃)₂Cl₂, 5 mL of water, and 5 mL of acetonitrile, and irradiation with microwaves (2.45 GHz, 100 W) was performed again for 60 minutes so that heating was performed.

Then, water was added to this solution and the organic layer was extracted with dichloromethane. The obtained organic layer was washed with a saturated aqueous solution of sodium hydrogen carbonate, water, and a saturated aqueous solution of sodium chloride, and was dried with magnesium sulfate. After the drying, the solution was filtered. The solvent of this solution was distilled off, and the obtained residue was purified by flash column chromatography using hexane and ethyl acetate as a developing solvent in a volume ratio of 5:1. The solvent was distilled off, and the obtained solid was purified by flash column chromatography using dichloromethane and ethyl acetate as a developing solvent in a volume ratio of 10:1, so that Hdmdppr (abbreviation), which was the pyrazine derivative to be produced, was obtained as a white powder in a yield of 44%. Note that the irradiation with microwaves was performed using a microwave synthesis system (Discover, manufactured by CEM Corporation). A synthesis scheme of Step 1 is shown in (a-1).

[Chemical formula 11]

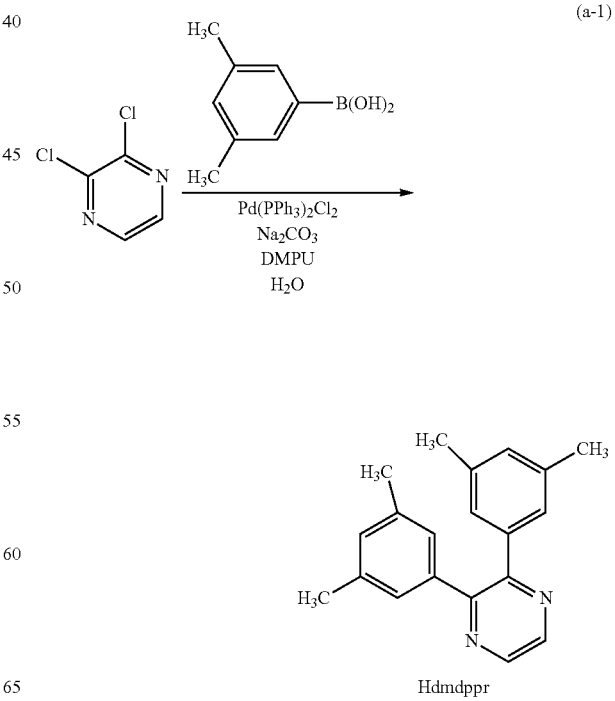

Hdmdppr

Step 2: Synthesis of 2,3-Bis(3,5-dimethylphenyl)-5-phenylpyrazine (Abbreviation: Hdmdppr-P)

First, 4.28 g of Hdmdppr (abbreviation) obtained in Step 1 and 80 mL of dry THF were put into a three-neck flask and the air in the flask was replaced with nitrogen. After the flask was cooled with ice, 9.5 mL of phenyl lithium (1.9M solution of phenyl lithium in butyl ether) was added dropwise, and the mixture was stirred at room temperature for 23.5 hours. The reacted solution was poured into water and the solution was subjected to extraction with chloroform. The obtained organic layer was washed with water and a saturated aqueous solution of sodium chloride, and dried with magnesium sulfate. Manganese oxide was added to the obtained mixture and the mixture was stirred for 30 minutes. Then, the solution was filtered and the solvent was distilled off. The obtained residue was purified by silica gel column chromatography using dichloromethane as a developing solvent, so that Hdmdppr-P (abbreviation), which was the pyrazine derivative to be produced, was obtained as an orange oil in a yield of 26%. A synthesis scheme of Step 2 is shown in (a-2).

[Chemical formula 12]

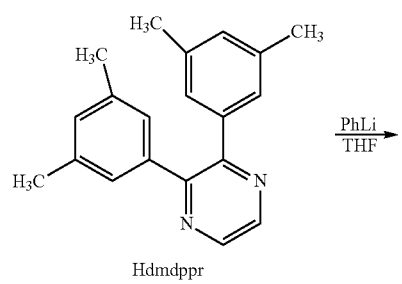

(a-2)

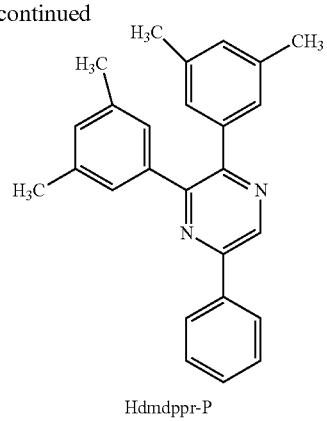

Hdmdppr-P

Step 3: Synthesis of Di-µ-chloro-tetrakis{4,6-dimethyl-2-[3-(3,5-dimethylphenyl)-5-phenyl-2-pyrazinyl-κN]phenyl-κC}diiridium(III) (abbreviation: [Ir(dmdppr-P)$_2$Cl]$_2$)

Next, into a recovery flask equipped with a reflux pipe were put 15 mL of 2-ethoxyethanol, 5 mL of water, 1.40 g of Hdmdppr-P (abbreviation) obtained in Step 2, and 0.51 g of iridium chloride hydrate (IrCl$_3$.H$_2$O) (produced by Sigma-Aldrich Corporation), and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol to give [Ir(dmdppr-P)$_2$Cl]$_2$ (abbreviation) that is a dinuclear complex as a reddish brown powder in a yield of 58%. A synthesis scheme of Step 3 is shown in (a-3).

[Chemical formula 13]

(a-3)

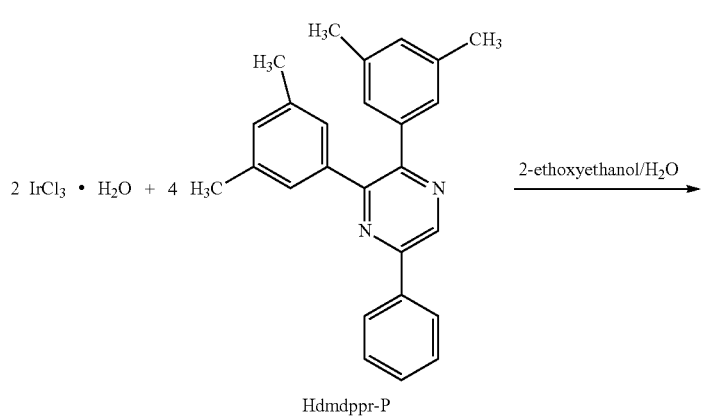

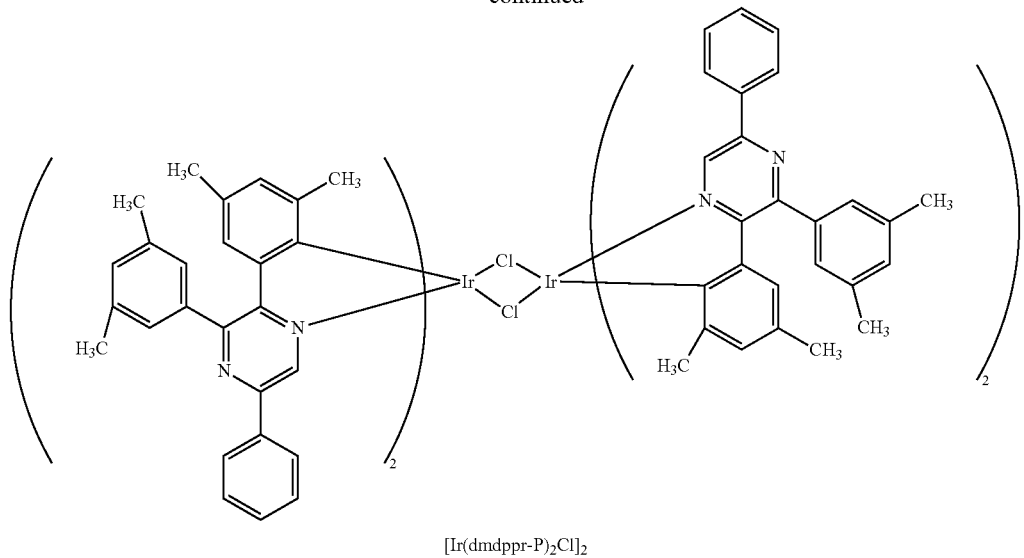

[Ir(dmdppr-P)₂Cl]₂

Step 4: Synthesis of Bis{4,6-dimethyl-2-[3-(3,5-dimethylphenyl)-5-phenyl-2-pyrazinyl-κN]phenyl-κC}(2,6-dimethyl-3,5-heptanedionato-κ²O,O') iridium(III) (Abbreviation: [Ir(dmdppr-P)₂(dibm)])

Further, into a recovery flask equipped with a reflux pipe were put 30 mL of 2-ethoxyethanol, 0.94 g of [Ir(dmdppr-P)₂Cl]₂ that is the dinuclear complex obtained in Step 3, 0.23 g of diisobutyrylmethane (abbreviation: Hdibm), and 0.52 g of sodium carbonate, and the air in the flask was replaced with argon. After that, the mixture was heated by irradiation with microwaves (2.45 GHz, 120 W) for 60 minutes. The solvent was distilled off, and the obtained residue was suction-filtered with ethanol. The obtained solid was washed with water and ethanol and recrystallization was carried out with a mixed solvent of dichloromethane and ethanol, so that [Ir(dmdppr-P)₂(dibm)](abbreviation), the organometallic complex in one embodiment of the present invention, was obtained as a dark red powder in a yield of 75%. A synthesis scheme of Step 4 is shown in (a-4).

[Chemical formula 14]

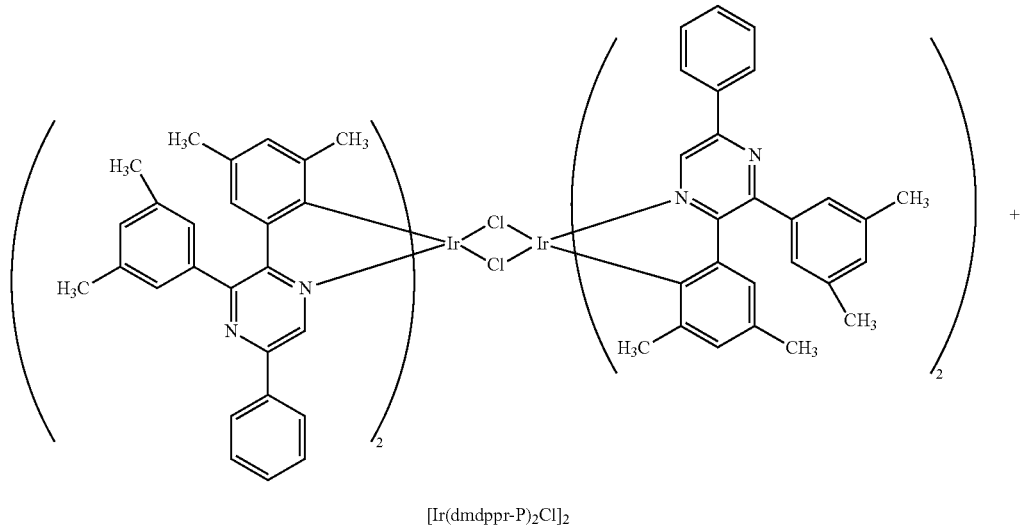

[Ir(dmdppr-P)₂Cl]₂

-continued

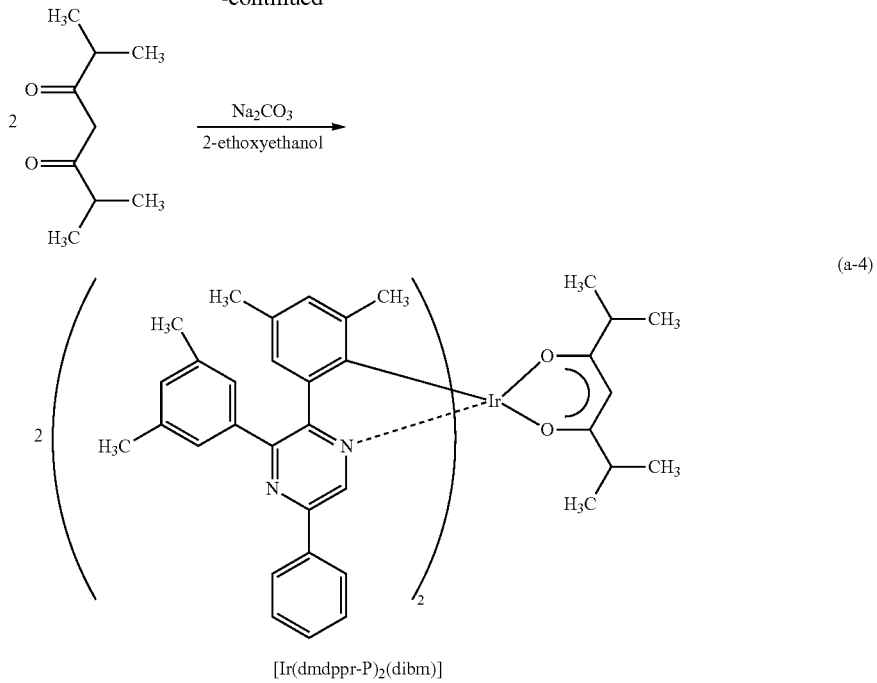

[Ir(dmdppr-P)₂(dibm)]

An analysis result by nuclear magnetic resonance ($^1$H-NMR) spectroscopy of the dark red powder obtained by the above-described synthesis method is described below. These results revealed that the organometallic complex [Ir(dmdppr-P)₂(dibm)](abbreviation) was obtained in this synthesis example.

$^1$H-NMR. δ (CDCl₃): 0.79 (d, 6H), 0.96 (d, 6H), 1.41 (s, 6H), 1.96 (s, 6H), 2.24-2.28 (m, 2H), 2.41 (s, 12H), 5.08 (s, 1H), 6.46 (s, 2H), 6.82 (s, 2H), 7.18 (s, 2H), 7.39-7.50 (m, 10H), 8.03 (d, 4H), 8.76 (s, 2H).

REFERENCE NUMERALS

10: electrode, 11: electrode, 101: first electrode, 102: second electrode, 103: EL layer, 111: hole-injection layer, 112: hole-transport layer, 113: light-emitting layer, 113a: first light-emitting layer, 113Da: first phosphorescent compound, 113Ha: first host material, 113b: second light-emitting layer, 113Db: second phosphorescent compound, 113Hb: second host material, 113A: first organic compound, 113Ec: exciplex, 114: electron-transport layer, 115: electron-injection layer, 400: substrate, 401: first electrode, 402: auxiliary electrode, 403: EL layer, 404: second electrode, 405: sealing material, 406: sealing material, 407: sealing substrate, 412: pad, 420: IC chip, 601: driver circuit portion (source line driver circuit), 602: pixel portion, 603: driver circuit portion (gate line driver circuit), 604: sealing substrate, 605: sealing material, 607: space, 608: wiring, 609: FPC (flexible printed circuit), 610: element substrate, 611: switching TFT, 612: current controlling TFT, 613: first electrode, 614: insulator, 616: EL layer, 617: second electrode, 618: light-emitting element, 623: n-channel TFT, 624: p-channel TFT, 625: drying agent, 901: housing, 902: liquid crystal layer, 903: backlight unit, 904: housing, 905: driver IC, 906: terminal, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: first electrode of a light-emitting element, 1024R: first electrode of a light-emitting element, 1024G: first electrode of a light-emitting element, 1024B: first electrode of a light-emitting element, 1025: partition wall, 1028: EL layer, 1029: second electrode of a light-emitting element, 1031: sealing substrate, 1032: sealant, 1033: transparent base material, 1034R: red coloring layer, 1034G: green coloring layer, 1034B: blue coloring layer, 1035: black layer (black matrix), 1036: overcoat layer, 1037: third interlayer insulating film, 1040: pixel portion, 1041: driver circuit portion, 1042: peripheral portion, 1044W: white light-emitting region, 1044R: red light-emitting region, 1044B: blue light-emitting region, 1044G: green light-emitting region, 2001: housing, 2002: light source, 3001: lighting device, 3002: display device, 5000: display, 5001: display, 5002: display, 5003: display, 5004: display, 5005: display, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7400: mobile phone, 7401: housing, 7402: display portion, 7403: operation button, 7404: external connection port, 7405: speaker, 7406: microphone, 9033: clasp, 9034: switch, 9035: power switch, 9036: switch, 9038: operation switch, 9630: housing, 9631: display portion, 9631a: display portion, 9631b: display portion, 9632a: touchscreen region, 9632b: touchscreen region, 9633: solar cell, 9634: charge and discharge control circuit, 9635: battery, 9636: DC-to-DC converter, 9637: operation key, 9638: converter, and 9639: button.

This application is based on Japanese Patent Application serial no. 2012-096808 filed with Japan Patent Office on Apr. 20, 2012, and Japanese Patent Application serial no. 2013-052791 filed with Japan Patent Office on Mar. 15, 2013, the entire contents of which are hereby incorporated by reference.

What is claimed is:

1. A light-emitting element comprising:
a first electrode;
an EL layer over the first electrode, the EL layer comprising:
a first light-emitting layer comprising:
a first phosphorescent compound;
a first host material; and
a first organic compound; and
a second light-emitting layer comprising:
a second phosphorescent compound; and
a second host material; and
a second electrode over the EL layer,
wherein the first host material and the first organic compound are capable of forming an exciplex therebetween,
wherein light emitted from the first phosphorescent compound has a longer wavelength than light emitted from the exciplex,
wherein a longest-wavelength-side peak of a function $\varepsilon(\lambda)\lambda^4$ of the second phosphorescent compound overlaps with a photoluminescence spectrum $F(\lambda)$ of the first phosphorescent compound,
wherein $\lambda$ denotes a wavelength, and
wherein $\varepsilon(\lambda)$ denotes a molar absorption coefficient at the wavelength $\lambda$.

2. The light-emitting element according to claim 1, wherein the photoluminescence spectrum is a phosphorescence spectrum.

3. The light-emitting element according to claim 1,
wherein the first phosphorescent compound has a photoluminescence peak in a range of 500 nm to 600 nm, and
wherein the second phosphorescent compound has a photoluminescence peak in a range of 600 nm to 700 nm.

4. The light-emitting element according to claim 1,
wherein the first electrode is an anode,
wherein the second electrode is a cathode, and
wherein the first host material has an electron-transport property.

5. The light-emitting element according to claim 1, wherein an emission spectrum of the exciplex overlaps with the longest-wavelength-side peak of the function $\varepsilon(\lambda)\lambda^4$ of the first phosphorescent compound.

6. The light-emitting element according to claim 1, wherein the first light-emitting layer and the second light-emitting layer are in contact with each other.

7. A lighting device comprising the light-emitting element according to claim 1.

8. A light-emitting device comprising the light-emitting element according: to claim 1.

9. An electronic device comprising the light-emitting element according to claim 1.

10. A light-emitting element comprising:
a substrate;
an anode over the substrate;
an EL layer over the anode, the EL layer comprising:
a first light-emitting layer comprising:
a first phosphorescent compound;
a first host material; and
a first organic compound; and
a second light-emitting layer comprising:
a second phosphorescent compound; and
a second host material; and
a cathode over the EL layer,
wherein the first host material and the first organic compound are capable of forming an excipiex therebetween,
wherein light emitted from the first phosphorescent compound has a longer wavelength than light emitted from the exciplex,
Wherein a longest-wavelength-side peak of a function $\varepsilon(\lambda)\lambda^4$ of the second phosphorescent compound overlaps with a photoluminescence spectrum $F(\lambda)$ of the first phosphorescent compound,
wherein $\lambda$ denotes a wavelength, and
wherein $\varepsilon(\lambda)$ denotes a molar absorption coefficient at the wavelength $\lambda$.

11. The light-emitting element according to claim 10, wherein the photoluminescence spectrum is a phosphorescence spectrum.

12. The light-emitting element according to claim 10,
Wherein the first phosphorescent compound has a photoluminescence peak in a range of 500 nm to 600 nm, and
wherein the second phosphorescent compound has a photoluminescence peak in a range of 600 nm to 700 nm.

13. The light-emitting element according to claim 10, wherein an emission spectrum of the exciplex overlaps with the longest-wavelength-side, peak of the function $\varepsilon(\lambda)\lambda^4$ of the first phosphorescent compound.

14. The light-emitting element according to claim 10, wherein the first light-emitting layer and the second light-emitting layer are in contact with each other.

15. A lighting device comprising the light-emitting element according to claim 10.

16. A light-emitting device comprising the light-emitting element according to claim 10.

17. An electronic device comprising the light-emitting element according to claim 10.

18. A light-emitting element comprising:
a first electrode;
a first light-emitting layer;
a second light-emitting layer; and
a second electrode,
wherein the first light-emitting layer is between the first electrode and the second light-emitting layer,
wherein the second light-emitting layer is between the first light-emitting layer and the second electrode,
wherein the first light-emitting layer comprises:
a first phosphorescent compound;
a first host material; and
a first organic compound,
wherein the second light-emitting layer comprises:
a second phosphorescent compound; and
a second host material,
wherein the first host material and the first organic compound are capable of forming an exciplex therebetween,
wherein light emitted from the second phosphorescent compound has a longer wavelength than light emitted from the first phosphorescent compound, wherein a band having a longest-wavelength-side peak of a function $\varepsilon(\lambda)\lambda^4$ of the second phosphorescent compound overlaps with a hand having a peak of a phosphorescence spectrum $F(\lambda)$ of the first phosphorescent compound, wherein $\lambda$ denotes a wavelength, and wherein $\varepsilon(\lambda)$ denotes a molar absorption coefficient at the wavelength $\lambda$.

19. The light-emitting element according to claim 18, wherein the first electrode is a cathode, and
wherein the second electrode is an anode.

20. The light-emitting element according to claim 18, wherein the first light-emitting layer and the second light-emitting layer are in contact with each other.

21. The light-emitting element according to claim 18, wherein the first phosphorescent compound has a photoluminescence peak in a range of 500 nm to 600 nm, and wherein the second phosphorescent compound has a photoluminescence peak in a range of 600 nm to 700 nm.

22. The light-emitting element according to claim 18, wherein an emission spectrum of the exciplex overlaps with the longest-wavelength-side peak of the function $\varepsilon(\lambda)\lambda^4$ of the first phosphorescent compound.

23. A lighting device comprising the light-emitting element according to claim 18.

24. A light-emitting device comprising the light-emitting element according to claim 18, and a control unit for controlling the light-emitting element.

25. A display device comprising the light-emitting element according to claim 18 in a display portion, and a control unit for controlling the light-emitting element.

26. An electronic device comprising the light-emitting element according to claim 18.

* * * * *